(12) United States Patent
Jinta

(10) Patent No.: US 12,439,796 B2
(45) Date of Patent: Oct. 7, 2025

(54) IMAGE DISPLAY DEVICE AND ELECTRONIC APPARATUS

(71) Applicant: Sony Semiconductor Solutions Corporation, Kanagawa (JP)

(72) Inventor: Seiichiro Jinta, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 510 days.

(21) Appl. No.: 17/922,261

(22) PCT Filed: Jun. 7, 2021

(86) PCT No.: PCT/JP2021/021599
§ 371 (c)(1),
(2) Date: Oct. 28, 2022

(87) PCT Pub. No.: WO2021/256316
PCT Pub. Date: Dec. 23, 2021

(65) Prior Publication Data
US 2023/0180578 A1    Jun. 8, 2023

(30) Foreign Application Priority Data

Jun. 15, 2020    (JP) .................................. 2020-103153

(51) Int. Cl.
*G09G 3/32*      (2016.01)
*G09G 3/3233*   (2016.01)
(Continued)

(52) U.S. Cl.
CPC ......... *H10K 59/353* (2023.02); *G09G 3/3233* (2013.01); *H10K 59/123* (2023.02);
(Continued)

(58) Field of Classification Search
CPC .... H10K 59/353; H10K 59/123; H10K 59/65; H10K 59/80518; H10K 2102/351;
(Continued)

(56) References Cited

U.S. PATENT DOCUMENTS 11,063,091 B2 * 7/2021 Kuo ...................... G09G 3/2003
2019/0025655 A1 * 1/2019 Kim .................. G02F 1/133512
(Continued)

FOREIGN PATENT DOCUMENTS

| JP | 2010230797 A | 10/2010 |
|---|---|---|
| JP | 2011175962 A | 9/2011 |

(Continued)

OTHER PUBLICATIONS

International Search Report (PCT/ISA/210), International Application No. PCT/JP2021/021599, dated Aug. 24, 2021.

*Primary Examiner* — Pegeman Karimi
(74) *Attorney, Agent, or Firm* — Michael Best & Friedrich LLP

(57) ABSTRACT

Image devices with attenuation and modulation prevention for light received or projected through a display surface are disclosed. In one example, an image display device includes pixels arranged two-dimensionally, in which a pixel in a first pixel region includes a first light emitting region, a non-light emitting region having a higher visible light transmittance than the first light emitting region, and a first self-light emitting element that emits light from the first light emitting region. A pixel in a second pixel region other than the first pixel region includes a second light emitting region having a lower visible light transmittance than the non-light emitting region, and a second self-light emitting element that emits light from the second light emitting region.

20 Claims, 51 Drawing Sheets

(51) Int. Cl.
*H10K 59/123* (2023.01)
*H10K 59/35* (2023.01)
*H10K 59/65* (2023.01)
*H10K 59/80* (2023.01)

(52) U.S. Cl.
CPC ..... *H10K 59/65* (2023.02); *G09G 2300/0819* (2013.01); *G09G 2300/0842* (2013.01); *G09G 2320/0233* (2013.01); *G09G 2320/0257* (2013.01); *G09G 2320/045* (2013.01); *H10K 59/80518* (2023.02)

(58) Field of Classification Search
CPC ............. H10K 59/121; H10K 59/1213; H10K 59/352; H10K 59/88; G09G 3/3233; G09G 2300/0819; G09G 2300/0842; G09G 2320/0233; G09G 2320/0257; G09G 2320/045
See application file for complete search history.

(56) References Cited

U.S. PATENT DOCUMENTS

| | | | |
|---|---|---|---|
| 2020/0052045 A1 | 2/2020 | Kuo | |
| 2020/0127061 A1 | 4/2020 | Zou | |
| 2022/0310723 A1* | 9/2022 | Wang | H10K 59/131 |

FOREIGN PATENT DOCUMENTS

| | | | |
|---|---|---|---|
| JP | 2011186427 A | 9/2011 | |
| JP | 2013258144 A | 12/2013 | |
| JP | 2020085974 A | 6/2020 | |
| JP | 2020204762 A | 12/2020 | |

\* cited by examiner

SWITCH TRANSISTOR Q3 IS TURNED ON

SWITCH TRANSISTOR Q3 IS TURNED OFF

A—A' CROSS SECTION

B-B' CROSS SECTION

C-C' CROSS SECTION

D-D' CROSS SECTION

B-B' CROSS SECTION

B—B' CROSS SECTION

IMAGE DISPLAY DEVICE AND ELECTRONIC APPARATUS

TECHNICAL FIELD

The present disclosure relates to an image display device and an electronic apparatus.

BACKGROUND ART

In recent electronic apparatuses such as smartphones, mobile phones, and personal computers (PCs), various sensors such as cameras are mounted in a frame (bezel) of a display panel. The number of sensors to be mounted also tends to increase, and there are a sensor for face authentication, an infrared sensor, a moving object detection sensor, and the like in addition to the camera. On the other hand, from the viewpoint of design and the tendency of lighter, thinner, shorter, and smaller, it is required to make the external size of the electronic apparatus as compact as possible without affecting the screen size, and the bezel width tends to be narrowed. In view of such a background, a technique has been proposed in which a camera module is arranged immediately below a display panel, and subject light passing through the display panel is captured by the camera module. In order to arrange the camera module directly below the display panel, it is necessary to make the display panel transparent (see Patent Document 1).

CITATION LIST

Patent Document

Patent Document 1: Japanese Patent Application Laid-Open No. 2011-175962

SUMMARY OF THE INVENTION

Problems to be Solved by the Invention

However, the display panel includes a plurality of layers, and some of the layers have low visible light transmittance. Therefore, when the subject light passing through the display panel is imaged by the camera module, the captured image becomes dark or becomes a blurred image as a whole. In addition, when the subject light passes through the display panel, there is a possibility that the image quality of the captured image is deteriorated due to the influence of flare and diffraction. The same applies to a case where a sensor other than the camera module is arranged immediately below the display panel, and since light is attenuated or modulated while passing through the display panel, there is a possibility that reliability of light received by the sensor or light projected from the sensor is deteriorated.

Therefore, the present disclosure provides an image display device and an electronic apparatus capable of preventing attenuation and modulation of light received or projected through a display surface.

Solutions to Problems

In order to solve the above problem, according to the present disclosure,
there is provided an image display device including a plurality of pixels arranged two-dimensionally,
in which a pixel in a first pixel region including some pixels among the plurality of pixels includes:
a first light emitting region;
a non-light emitting region having a higher visible light transmittance than the first light emitting region; and
a first self-light emitting element that emits light from the first light emitting region, and
a pixel in a second pixel region other than the first pixel region among the plurality of pixels includes:
a second light emitting region having a lower visible light transmittance than the non-light emitting region; and
a second self-light emitting element that emits light from the second light emitting region.

The non-light emitting region may include a region that transmits incident visible light, and
the first light emitting region and the second light emitting region may include a region that reflects incident visible light without transmitting the visible light.

A pixel closer to the first pixel region among the pixels in the second pixel region may decrease light-emitting luminance of the second light emitting region.

A pixel luminance in the first pixel region and a pixel luminance in the second pixel region at a boundary portion between the first pixel region and the second pixel region may be substantially equal.

At least a part of the first pixel region may be arranged so as to overlap a light receiving device that receives light incident through the image display device in plan view from a display surface side of the image display device.

A pixel circuit connected to the first self-light emitting element in the first pixel region may be arranged in the first light emitting region.

Each of the first self-light emitting element and the second self-light emitting element may include:
a lower electrode layer;
a display layer arranged on the lower electrode layer;
an upper electrode layer arranged on the display layer; and
a wiring layer arranged under the lower electrode layer and electrically connected to the lower electrode layer via a contact extending from the lower electrode layer in a lamination direction, and
the contact may be arranged in the first light emitting region and the second light emitting region.

At least a corner near an upper end of the contact may have a laminated structure in which a transparent conductive layer is arranged on a metal layer.

An inclination angle of a side surface of the contact with respect to the lamination direction may change stepwise or continuously, and an inclination angle of the vicinity of an upper end of the contact with respect to the lamination direction may be larger than an inclination angle of the vicinity of a lower end of the contact with respect to the lamination direction.

The lower electrode layer may have a laminated structure in which a first transparent conductive layer, a metal layer, and a second transparent conductive layer are sequentially laminated.

Each pixel in the first pixel region and the second pixel region may include a plurality of color pixels,
each of the plurality of color pixels in the first pixel region may have the first light emitting region and the non-light emitting region, and
each of the plurality of color pixels in the second pixel region may have the second light emitting region.

Each pixel in the first pixel region and the second pixel region may include a plurality of color pixels, and
some color pixels among the plurality of color pixels in the first pixel region may have the first light emitting region and the non-light emitting region, and color pixels other than the some color pixels may have the first light emitting region without having the non-light emitting region.

Some pixels in the first pixel region may have the non-light emitting region without having the first light emitting region, and pixels other than the some pixels may have the first light emitting region without having the non-light emitting region.

The first pixel region may be provided at at least one of four corners of a display unit including the plurality of pixels.

According to another aspect of the present disclosure, there is provided an electronic apparatus including:
an image display device including a plurality of pixels arranged two-dimensionally; and
a light receiving device that receives light incident through the image display device,
in which a pixel in a first pixel region among the plurality of pixels includes:
a first light emitting region;
a non-light emitting region having a higher visible light transmittance than the first light emitting region; and
a first self-light emitting element that emits light from the first light emitting region,
a pixel in a second pixel region other than the first pixel region among the plurality of pixels includes:
a second light emitting region having a lower visible light transmittance than the non-light emitting region; and
a second self-light emitting element that emits light from the second light emitting region, and
at least a part of the first pixel region is arranged so as to overlap the light receiving device in plan view from a display surface side of the image display device.

The light receiving device may receive light through the non-light emitting region.

The first pixel region may be a pixel region through which light incident on the light receiving device passes.

The second pixel region may decrease a light-emitting luminance of the second light emitting region as approaching the first pixel region.

A pixel luminance in the first pixel region and a pixel luminance in the second pixel region at a boundary portion between the first pixel region and the second pixel region may be substantially equal.

The light receiving device may include at least one of an imaging sensor that photoelectrically converts light incident through the non-light emitting region, a distance measuring sensor that receives the light incident through the non-light emitting region and measures a distance, or a temperature sensor that measures a temperature on the basis of the light incident through the non-light emitting region.

MODE FOR CARRYING OUT THE INVENTION

Hereinafter, embodiments of an image display device and an electronic apparatus will be described with reference to the drawings. Although main components of the image display device and the electronic apparatus will be mainly described below, the image display device and the electronic apparatus may have components and functions that are not illustrated or described. The following description does not exclude components and functions that are not illustrated or described.

Figure 1A:
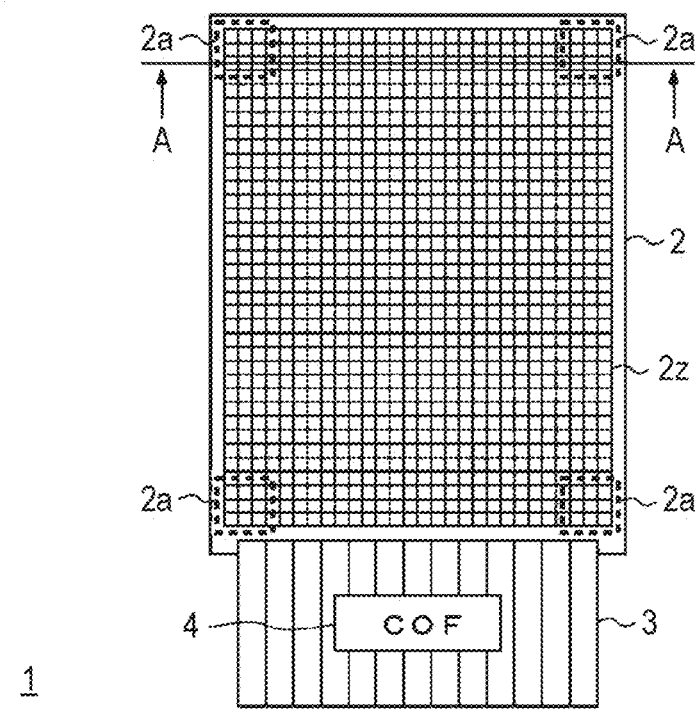
FIG. 1A is a schematic plan view of an image display device according to an embodiment of the present disclosure.

FIG. 1A is a schematic plan view of an image display device 1 according to an embodiment of the present disclosure. As illustrated in FIG. 1A, the image display device 1 according to the present embodiment includes a display panel 2. For example, a flexible printed circuit (FPC) 3 is connected to the display panel 2. The display panel 2 is formed by laminating a plurality of layers on, for example, a glass substrate or a transparent film, and a plurality of pixels is arranged vertically and horizontally on a display surface 2z. A chip on film (COF) 4 incorporating at least a part of a drive circuit of the display panel 2 is mounted on the FPC 3. Note that the drive circuit may be stacked on the display panel 2 as a chip on glass (COG).

In the image display device 1 according to the present embodiment, various sensors that receive light through the display panel 2 can be arranged immediately below the display panel 2. In the present specification, a configuration including the image display device 1 and the sensor is referred to as an electronic apparatus. The type of the sensor provided in the electronic apparatus is not particularly limited, and examples thereof include an imaging sensor that photoelectrically converts light incident through the display panel 2, a distance measuring sensor that projects light through the display panel 2 and receives light reflected by an object through the display panel 2 to measure a distance to the object, and a temperature sensor that measures a temperature on the basis of the light incident through the display panel 2. As described above, the sensor arranged immediately below the display panel 2 has at least the function of the light receiving device that receives the light. Note that the sensor may have a function of a light emitting device that projects light through the display panel 2.

FIG. 1A illustrates an example of a specific place of a sensor arranged immediately below the display panel 2 by a broken line. As illustrated in FIG. 1A, the sensor is arranged at at least one of four corners 2a of the display panel 2. Note that the sensor may be arranged at a place other than the four corners 2a. As described later, since the sensor projects or receives light through the display panel 2, the sensor on the display panel 2 needs to have high visible light transmittance. For this reason, when an image is displayed on the display panel 2, a pixel region immediately above the sensor on the display panel 2 may change in hue and luminance as compared with other pixel regions. As illustrated in FIG. 1A, when the pixel region immediately above the sensor is the four corners 2a of the display panel 2, even if the color and luminance are slightly different from those of other pixel regions, the pixel region is not so conspicuous in appearance.

Figure 1B:
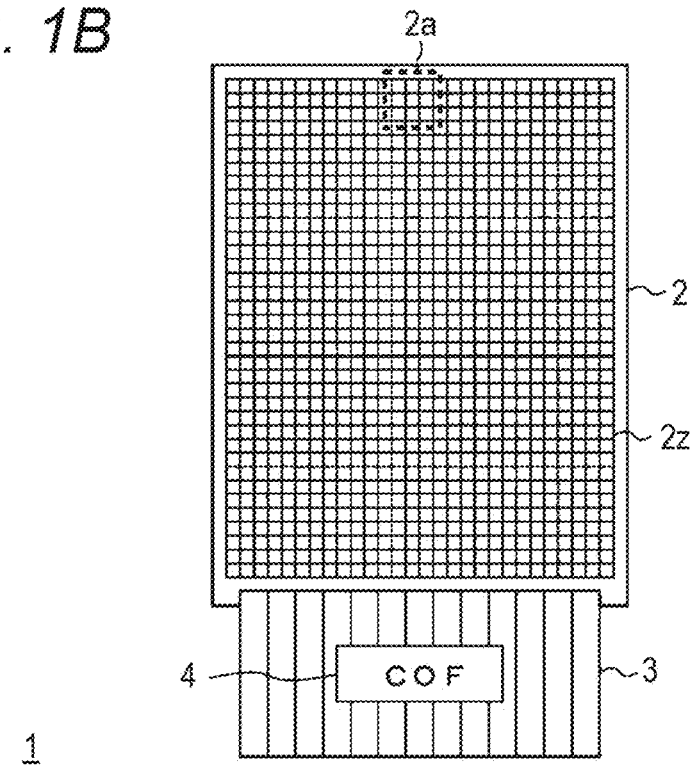
FIG. 1B is a plan view of the image display device in which a sensor is disposed at a location different from that in FIG. 1A.

In a commercially available smartphone, tablet, PC, or the like, a camera module is often arranged in a central portion of an upper end side bezel of the display panel 2. Therefore, also in the present embodiment, as illustrated in broken-line frame 2a in FIG. 1B, the sensor may be arranged near the central portion on the upper end side of the display panel 2. In the present specification, in the display panel 2, a pixel region in which the sensor is not arranged immediately below is referred to as a pixel region (second pixel region) 2A, and a pixel region in which the sensor is arranged immediately below is referred to as a pixel region (first pixel region) 2B.

Figure 1C:
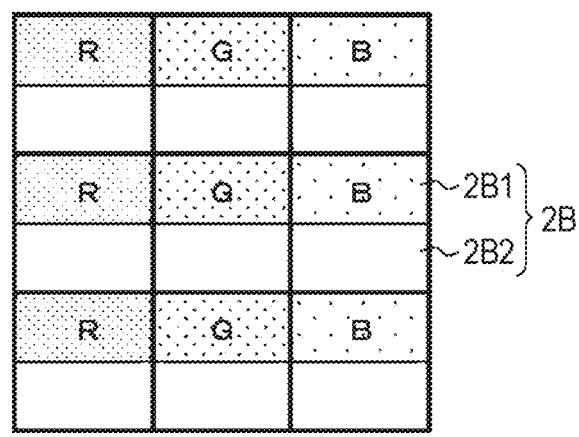
FIG. 1C is an enlarged view of a partial pixel region 2B of a display panel.
Figure 1D:
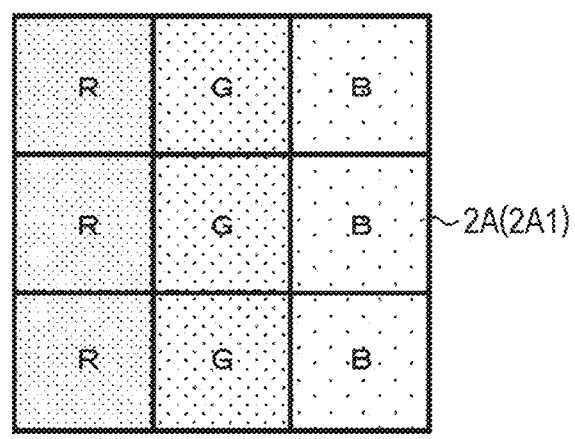
FIG. 1D is an enlarged view of a partial pixel region 2A of the display panel.

FIGS. 1C and 1D are enlarged views of partial pixel regions 2B and 2A of the display panel 2. FIG. 1C illustrates a pixel region (first pixel region) 2B in which the sensor is arranged immediately below, and FIG. 1D illustrates a pixel region (second pixel region) 2A in which the sensor is not arranged immediately below. In the image display device 1 according to the present embodiment, each pixel has a self-light emitting element, and does not require a backlight. A representative example of the self-light emitting element is an organic electroluminescence (EL) element (hereinafter, also referred to as an organic light emitting diode (OLED)). Since the backlight can be omitted, at least a part of the self-light emitting element can be made transparent. Hereinafter, an example in which an OLED is used as the self-light emitting element will be mainly described.

At least a part of the pixel region 2B in FIG. 1C is arranged so as to overlap a light receiving device (not illustrated) that receives light incident through the display panel 2 in plan view from the display surface side of the display panel 2. The pixel region 2B in FIG. 1C has a light emitting region 2B1 and a non-light emitting region 2B2 for each pixel. The light emitting region 2B1 is a region that emits light of the OLED. Most of the light emitting region 2B1 is a region that cannot transmit light in a visible light band (wavelength range of about 360 to 830 nm), and as a more specific example, it refers to a region having a visible light transmittance of less than 50%. The non-light emitting region 2B2 is a region that does not emit light of the OLED. Most of the non-light emitting region 2B2 is a region capable of transmitting light in the above-described visible light band, and as a more specific example, it refers to a region having a visible light transmittance of 50% or more. As described above, the light emitting region 2B1 in each pixel illustrated in FIG. 1C is a region where the light emitted by the OLED is emitted, whereas the non-light emitting region 2B2 is a region where the light emitted by the OLED cannot be emitted. In addition, the non-light emitting region 2B2 is a region having higher visible light transmittance than the light emitting region 2B1. As described above, the non-light emitting region 2B2 includes a region that transmits the incident visible light, and the light emitting region 2B1 includes a region that reflects the incident visible light without transmitting the incident visible light.

Each pixel in FIG. 1C includes, for example, three color pixels of a red (R) pixel, a green (G) pixel, and a blue (B) pixel. Although there may be a case where each pixel includes a color pixel other than red, green, and blue, an example in which each pixel includes three color pixels of red, green, and blue will be mainly described in the present embodiment.

Each color pixel in the pixel region 2B has the light emitting region 2B1 and the non-light emitting region 2B2 described above. The area ratio between the light emitting region 2B1 and the non-light emitting region 2B2 is arbitrary. In a case where only the light emitting region 2B1 emits light emitted by the OLED, the luminance can be increased as the area of the light emitting region 2B1 is larger. As illustrated in FIG. 1C, the light emitting region 2B1 and the non-light emitting region 2B2 of each pixel are arranged adjacent to each other.

On the other hand, in the pixel region 2A in FIG. 1D, a non-light emitting region is not provided in each pixel, and only the light emitting region 2A1 is provided. Each light emitting region 2A1 is a region that emits light of the OLED. The light emitting region 2A1 is a region having a lower visible light transmittance than the non-light emitting region 2B2. The light emitting region 2A1 includes a region that does not transmit but reflects incident visible light. That is, most of the pixels in the pixel region 2A emit light. On the other hand, in the pixel region 2B in FIG. 1C, only a part of each pixel emits light. In this manner, each pixel in FIG. 1C has a smaller light-emitting area than each pixel in FIG. 1D. Since the luminance of each pixel is proportional to the light-emitting area, the pixel in FIG. 1D having a larger light-emitting area than that in FIG. 1C is likely to increase the luminance. In order to make the luminance of the pixel region 2B in FIG. 1C and the luminance of the pixel region 2A in FIG. 1D the same, it is necessary to make the light-emitting luminance of the OLED in the pixel region 2B in FIG. 1C having a small light-emitting area higher than the light-emitting luminance of the OLED in the pixel region 2A in FIG. 1D.

As described above, the image display device 1 according to the present embodiment includes the pixel region 2A and the pixel region 2B. The pixel in the pixel region 2A includes a light emitting region (second light emitting region) 2A1 and an OLED (second self-light emitting element). The OLED (second self-light emitting element) emits light from the light emitting region 2A1. The pixel in the pixel region 2B includes a light emitting region (first light emitting region) 2B1, a non-light emitting region 2B2, and an OLED (first self-light emitting element). The OLED (first self-light emitting element) emits light from the light emitting region 2B1. Furthermore, as will be described later, there may be a case where the pixel in the pixel region 2B has a separate OLED. The OLED emits light from the light emitting region 2B2.

Figure 2:
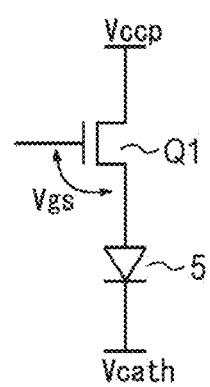
FIG. 2 is a circuit diagram showing a connection relationship between an OLED and a drive transistor.

FIG. 2 is a circuit diagram illustrating a connection relationship between an OLED 5 and a drive transistor Q1. In FIG. 2, when the gate-source voltage of the drive transistor Q1 is Vgs, the threshold voltage of the drive transistor Q1 is Vth, the drain-source current of the drive transistor Q1 is Ids, the gate width of the drive transistor Q1 is W, the gate length is L, the mobility is μ, and the gate oxide film capacitance is Cox, the drain-source current Ids of the drive transistor Q1 is expressed by the following Formula (1).

$$I_{ds} = \frac{1}{2}\frac{W}{L}C_{ox}\mu(V_{gs} - V_{th})^2 \quad (1)$$

As can be seen from Formula (1), the current Ids flowing through the OLED 5 increases as the gate-source voltage Vgs of the drive transistor Q1 increases. As the current Ids flowing through the OLED 5 increases, the light-emitting luminance of the OLED 5 increases.

Figure 3:
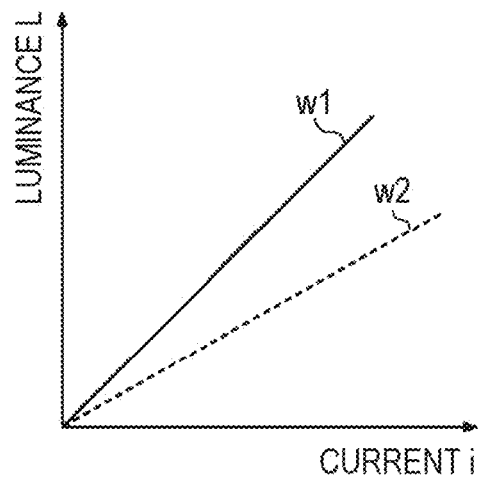
FIG. 3 is a characteristic diagram illustrating a correlation between a current flowing through the OLED and a light-emitting luminance.

FIG. 3 is a characteristic diagram illustrating a correlation between a current flowing through the OLED 5 and light-emitting luminance. A solid line w1 in FIG. 3 indicates the characteristic of the OLED 5 in the initial state, and a broken line w2 indicates the characteristic of the OLED 5 after deterioration. As illustrated in the drawing, the light-emitting luminance of the OLED 5 tends to increase as the amount of current flowing increases, but as the deterioration progresses, the light-emitting luminance does not increase even when current flows. In addition, the larger the amount of current per unit area of the OLED 5, the larger the reduction amount of the light-emitting luminance at the time of deterioration of the OLED 5. Therefore, in order to prolong the life of the OLED 5, it is desirable to further increase the light-emitting area of the OLED 5 to suppress the amount of current per unit area.

Figure 4:
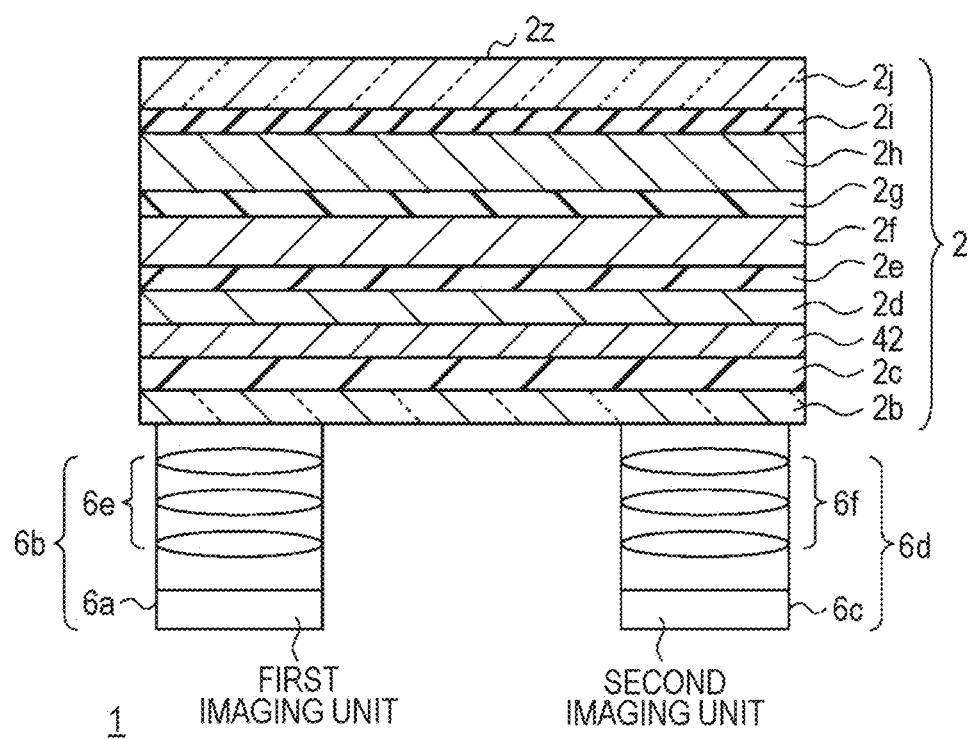
FIG. 4 is a schematic cross-sectional view taken along line A-A in FIG. 1A.

FIG. 4 is a schematic cross-sectional view in an A-A line direction in FIG. 1A. FIG. 4 illustrates an example in which an imaging sensor 6b having a first imaging unit 6a and an imaging sensor 6d having a second imaging unit 6c are arranged immediately below both corners on the upper end side of the display panel 2. A typical example of the electronic apparatus including the image display device 1 and the imaging sensors 6b and 6d is a smartphone or the like. Each of the imaging sensors 6b and 6d may include, for example, single focal lenses 6e and 6f having different focal lengths. Note that, although sensors other than the imaging sensors 6b and 6d may be arranged immediately below the display panel 2, an example in which the imaging sensors 6b and 6d are arranged will be described below.

As illustrated in FIG. 4, the display panel 2 is a laminate in which a transparent film 2b, a glass substrate 2c, a TFT layer 42, a display layer 2d, a barrier layer 2e, a touch sensor layer 2f, an adhesive layer 2g, a circularly polarizing plate 2h, an optical clear adhesive (OCA) 2i, and a cover glass 2j are arranged in order from the side where the first imaging unit 6a and the second imaging unit 6c are arranged.

Figure 5:
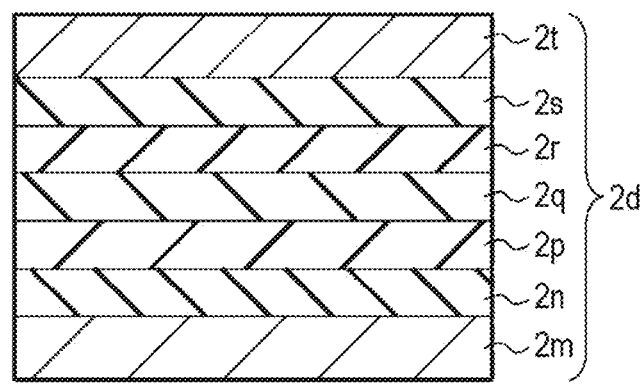
FIG. 5 is a cross-sectional view illustrating a laminated structure of a display layer.

The transparent film 2b may be omitted. The display layer 2d is a layer constituting the OLED 5, and has, for example, a laminated structure as illustrated in FIG. 5. The barrier layer 2e is a layer that prevents oxygen and moisture from entering the display layer 2d. A touch sensor is incorporated in the touch sensor layer 2f. There are various types of touch sensors such as a capacitive type and a resistive film type, but any type may be adopted. In addition, the touch sensor layer 2f and the display layer 2d may be integrated into an in-cell structure. The adhesive layer 2g is provided for bonding the circularly polarizing plate 2h and the touch sensor layer 2f. A material having high visible light transmittance is used for the adhesive layer 2g. The circularly polarizing plate 2h is provided to reduce glare and enhance visibility of the display surface 2z even in a bright environment. The optical adhesive sheet 2i is provided to enhance adhesion between the circularly polarizing plate 2h and the cover glass 2j. A material having high visible light transmittance is used for the optical adhesive sheet 2i. The cover glass 2j is provided to protect the display layer 2d and the like.

As described later, the TFT layer 42 is a layer in which the drive transistor Q1 and the like constituting the pixel circuit are formed, and may actually include a plurality of layers. As illustrated in FIG. 5, the display layer 2d has a laminated structure in which an anode 2m, a hole injection layer 2n, a hole transport layer 2p, a light emitting layer 2q, an electron transport layer 2r, an electron injection layer 2s, and a cathode 2t are arranged in this order from the glass substrate 2c side. The anode 2m is also called an anode electrode. The hole injection layer 2n is a layer into which holes from the anode electrode 2m are injected. The hole transport layer 2p is a layer that efficiently transports holes to the light emitting layer 2q. The light emitting layer 2q recombines holes and electrons to generate excitons, and emits light when the excitons return to the ground state. The cathode 2t is also referred to as a cathode electrode. The electron injection layer 2s is a layer into which electrons from the cathode electrode 2t are injected. The electron transport layer 2r is a layer that efficiently transports electrons to the light emitting layer 2q. The light emitting layer 2q contains an organic substance.

Figure 6A:
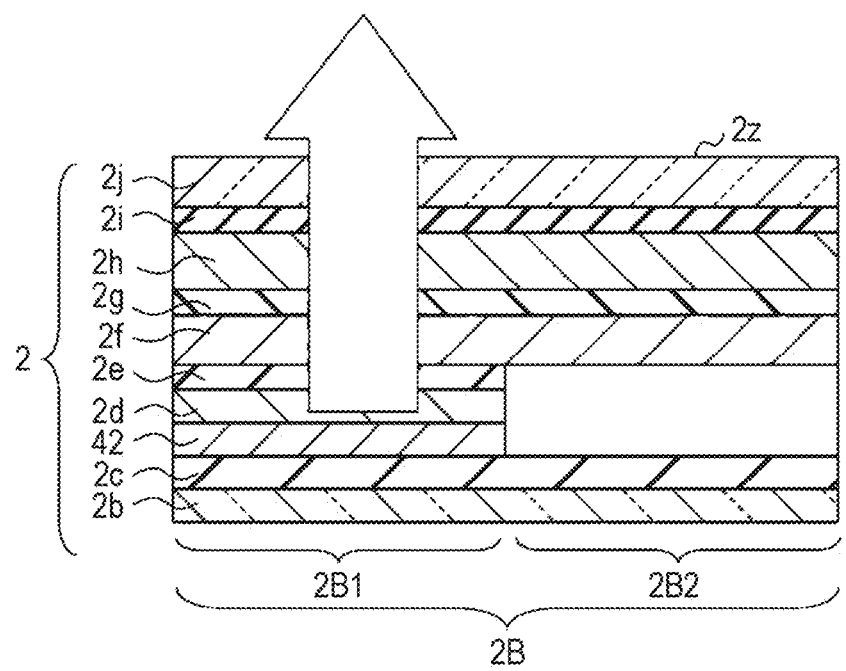
FIG. 6A is a schematic cross-sectional view of the pixel region 2B in which a sensor is arranged immediately below.
Figure 6B:
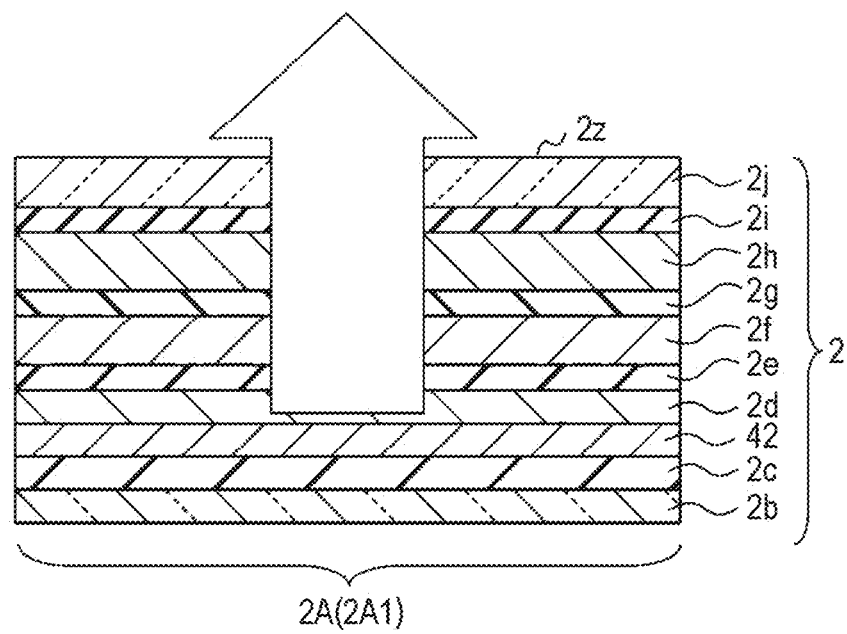
FIG. 6B is a schematic cross-sectional view of the pixel region 2A in which a sensor is not arranged immediately below.

FIG. 6A is a schematic cross-sectional view of a pixel region 2B in which the sensor is arranged immediately below, and FIG. 6B is a schematic cross-sectional view of a pixel region 2A in which the sensor is not arranged immediately below. In FIGS. 6A and 6B, a place and a direction in which light from the OLED 5 is emitted are indicated by arrows. In the pixel region 2B, as illustrated in FIG. 6A, light is emitted only in a part (light emitting region) 2B1 of each pixel. On the other hand, in the pixel region 2A, as illustrated in FIG. 6B, light is emitted in the entire region of each pixel. As can be seen from a comparison between FIGS. 6A and 6B, the light-emitting area of each pixel is larger in the pixel region 2A than in the pixel region 2B.

Figure 7A:
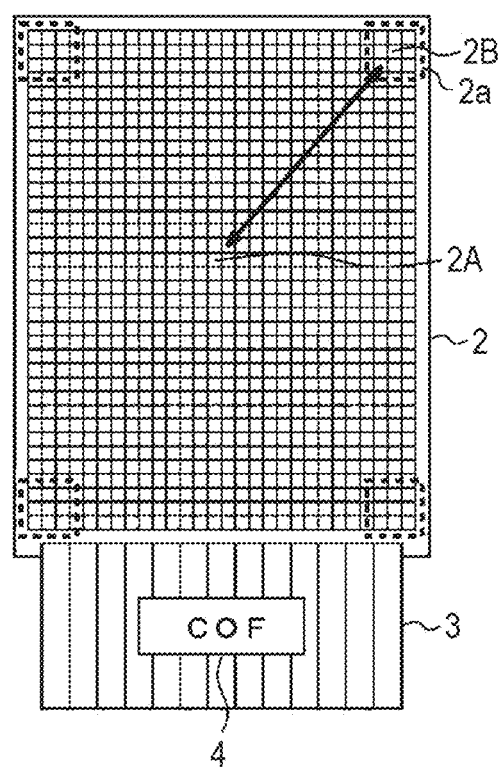
FIG. 7A is a plan view illustrating a positional relationship between the pixel regions 2A and 2B on the display panel.
Figure 7B:
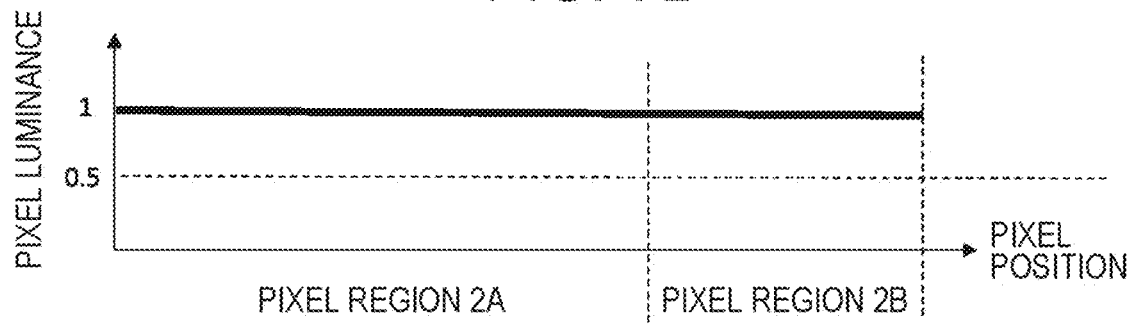
FIG. 7B is a diagram illustrating a pixel luminance of a pixel region.
Figure 7C:
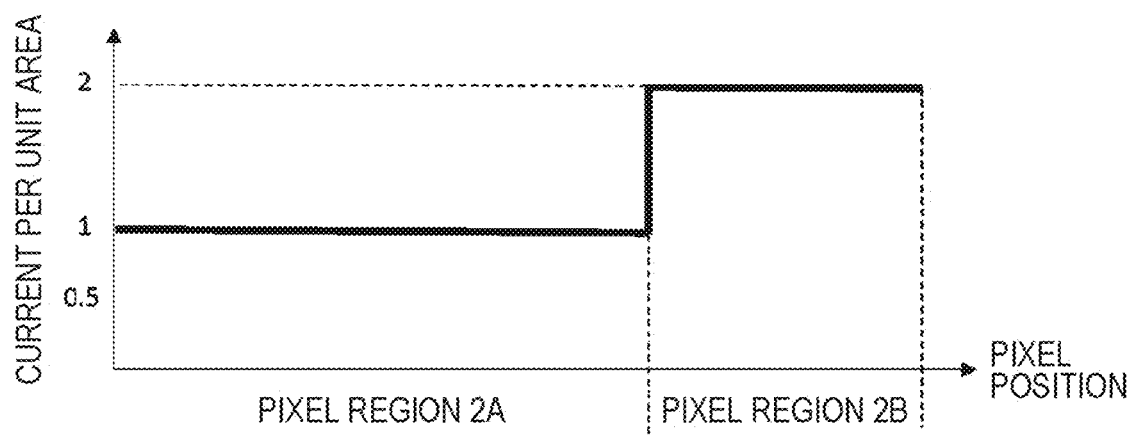
FIG. 7C is a diagram illustrating a current per unit area flowing through the OLED of each pixel in the pixel region.

FIGS. 7A, 7B, and 7C are diagrams illustrating an example in which the pixel luminance is made the same between the pixel region 2A in which the sensor is not arranged immediately below on the display panel 2 and pixel region 2B in which the sensor is arranged immediately below on the display panel 2. FIG. 7A illustrates a positional relationship between the pixel regions 2A and 2B on the display panel 2. FIG. 7B is a diagram illustrating a pixel luminance of the pixel regions 2A and 2B. FIG. 7C is a diagram illustrating a current per unit area flowing through the OLED 5 of each pixel in the pixel regions 2A and 2B.

In order to equalize the pixel luminance between the pixel regions 2A and 2B as illustrated in FIG. 7B, it is necessary to make the current flowing through the OLED 5 of each pixel in the pixel region 2B larger than the current flowing through the OLED 5 of each pixel in the pixel region 2A as illustrated in FIG. 7C. This is because the area of the light emitting region 2B1 that emits light of the OLED 5 in each pixel in the pixel region 2B is smaller than the area of the light emitting region 2A1 in each pixel in the pixel region 2A. FIG. 7C illustrates an example in which the area of the light emitting region 2B1 of the pixel region 2B is ½ of the area of the light emitting region 2A1 of the pixel region 2A. In this case, if the current flowing through the OLED 5 of each pixel in the pixel region 2B is made twice the current flowing through the OLED 5 of each pixel in the pixel region 2A, the pixel luminances of the pixel regions 2A and 2B can be made substantially the same. Since the deterioration of the OLED 5 is promoted as the current flowing through the OLED 5 increases, the OLED 5 of each pixel in the pixel region 2B deteriorates faster than the OLED 5 of each pixel in the pixel region 2A, and defects such as image burn-in in which an afterimage is visually recognized easily occur.

Figure 8A:
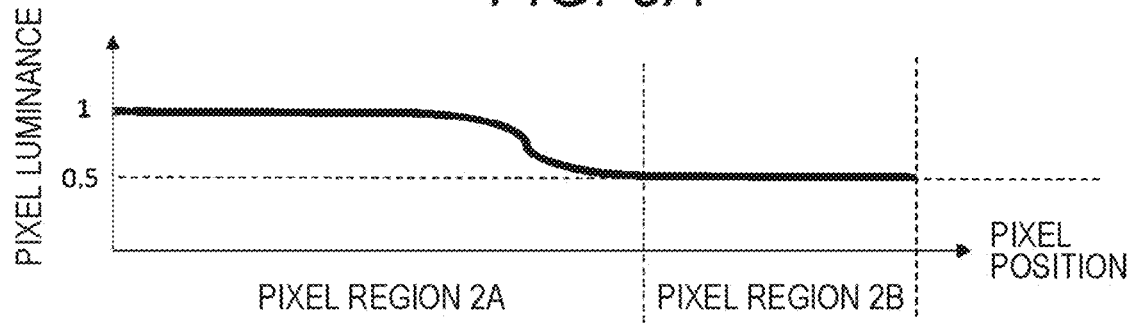
FIG. 8A is a diagram illustrating a pixel luminance of a pixel region.
Figure 8B:
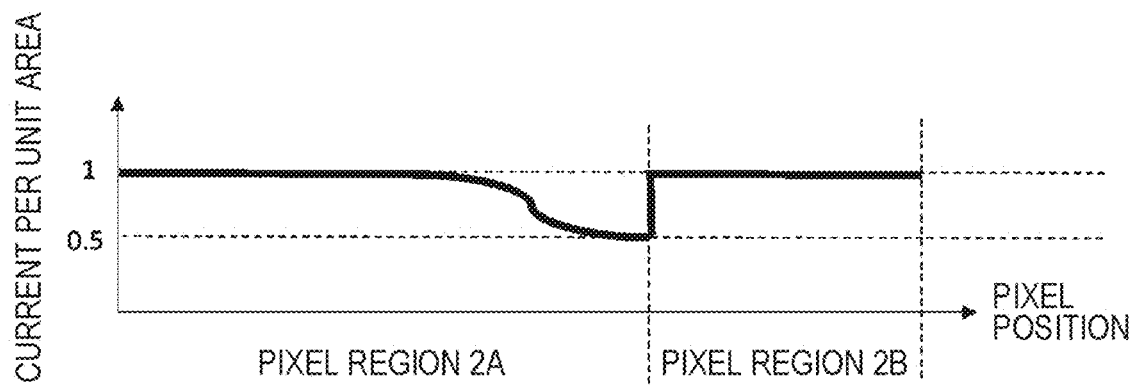
FIG. 8B is a diagram illustrating a current per unit area flowing through the OLED of each pixel in the pixel region.

FIGS. 8A and 8B are diagrams illustrating a first example of a solution to FIG. 7C. FIG. 8A is a diagram illustrating a pixel luminance of the pixel regions 2A and 2B. FIG. 8B is a diagram illustrating a current per unit area flowing through the OLED 5 of each pixel in the pixel regions 2A and 2B. In FIG. 8B, the current flowing through the OLED 5 of each pixel in the pixel region 2B is gradually decreased as the pixel is closer to the pixel region 2B in the pixel region 2A without increasing the current flowing through the OLED 5. As a result, as illustrated in FIG. 8A, the pixel luminance in the pixel region 2A gradually decreases as approaching the pixel region 2B, and the pixel luminance in the pixel region 2A adjacent to the pixel region 2B becomes substantially the same as the pixel luminance in the pixel region 2B.

FIG. 8B illustrates an example in which the area of the light emitting region 2B1 of the pixel region 2B is ½ of the area of the light emitting region 2A1 of the pixel region 2A. In this case, in the pixel regions 2A and 2B, the current flowing through the OLED 5 of each pixel is made substantially equal, and the current flowing through the OLED 5 is made smaller for the pixel closer to the pixel region 2B exceptionally for only a part of the pixel region on the side closer to the pixel region 2B in the pixel region 2A. The adjustment of the current flowing through the OLED 5 can be relatively easily performed by adjusting the gate voltage of the drive transistor Q1. Alternatively, the drain voltage of the drive transistor Q1 may be adjusted. As a result, the pixel luminance gradually decreases from the pixel region 2A to the pixel region 2B, and the change in the pixel luminance does not occur at the boundary position between the pixel regions 2A and 2B. Therefore, there is no possibility that the observer feels uncomfortable about the pixel luminance.

In the case of FIG. 8B, since the maximum currents flowing through the OLEDs 5 are equal in the pixel regions 2A and 2B, there is no difference in the degree of deterioration of the OLEDs 5. Therefore, as illustrated in FIG. 7C, there is no problem that deterioration of the OLED 5 of each pixel in the pixel region 2B is further promoted.

Figure 9:
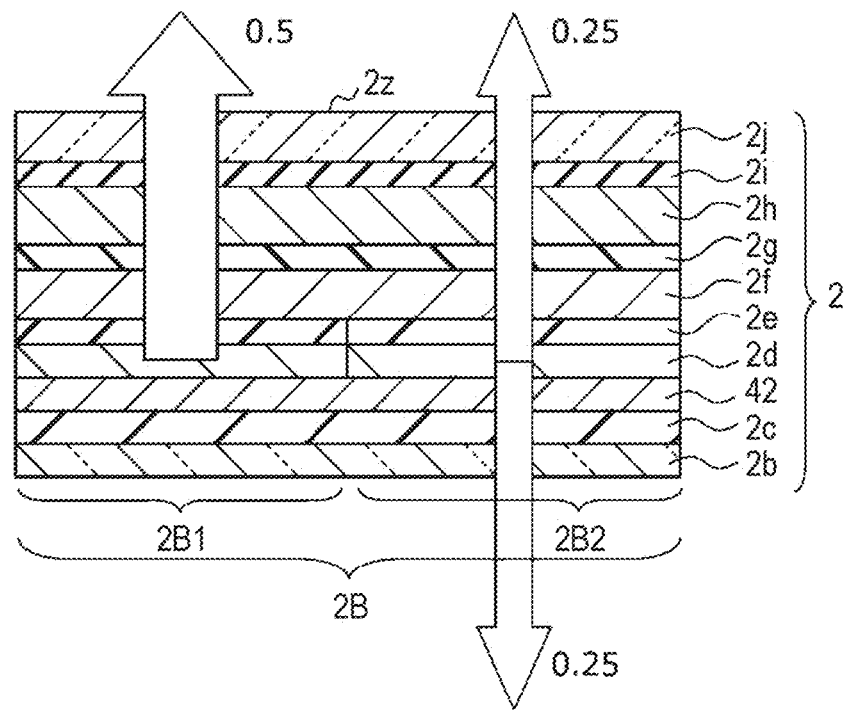
FIG. 9 is a diagram illustrating a second example of the solution to FIG. 7C.

FIG. 9 is a diagram illustrating a second example of the solution to FIG. 7C. The left side cross-sectional view of FIG. 9 illustrates an example in which light of the OLED 5 is emitted from the light emitting region 2B1 provided in a part of each pixel in the pixel region 2B where the camera is arranged immediately below. On the other hand, the right side cross-sectional view of FIG. 9 illustrates an example in which light of the OLED 5 is emitted also in the light emitting region 2B2 in the pixel region 2B. The right side cross-sectional view of FIG. 9 illustrates an example in which an OLED 5*a* for causing the light emitting region 2B2 to emit light is provided separately from the OLED 5 for causing the light emitting region 2B1 to emit light. Since the light emitting region 2B2 transmits visible light, light from the corresponding OLED 5*a* is emitted not only from the display surface 22 side but also from the opposite side. Therefore, the amount of light emitted to the side of the display surface 2*z* is approximately ½ of the amount of light emitted by the OLED 5*a*. In the light emitting region 2B1, as described later, since the anode electrode layer of the OLED 5 is extended and used as a reflection layer, almost all the light emitted from the OLED 5 can be emitted from the display surface 2*z* side.

The right side cross-sectional view of FIG. 9 illustrates an example in which the areas of the light emitting region 2B1 and the light emitting region 2B2 of each pixel are equal. In this case, assuming that the amount of light emitted from the light emitting region 2B1 is 0.5, the amount of light emitted from the light emitting region 2B2 to the display surface 2*z* side is 0.25. Therefore, in the example of the right side cross-sectional view of FIG. 9, when the pixel luminance in the pixel region 2A is 1, the pixel luminance in the pixel region 2B is 0.5+0.25=0.75, and the luminance variation can be suppressed without increasing the current flowing through the OLED 5 of each pixel in the pixel region 2B.

Figure 10A:
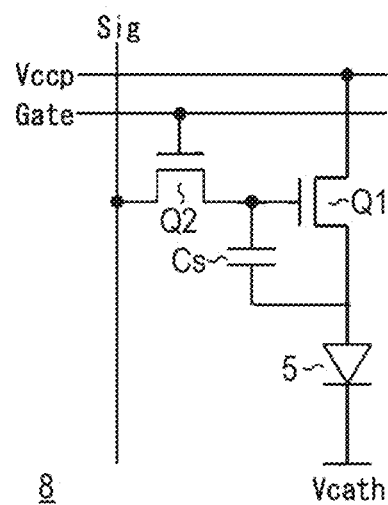
FIG. 10A is a circuit diagram showing a basic configuration of a pixel circuit including an OLED.

FIG. 10A is a circuit diagram showing a basic configuration of the pixel circuit 8 including the OLED 5. The pixel circuit 8 in FIG. 10A is provided in each pixel in the above-described pixel region 2A, for example. The pixel circuit 8 in FIG. 10A includes a drive transistor Q1, a sampling transistor Q2, and a pixel capacitance Cs in addition to the OLED 5. The sampling transistor Q2 is connected between a signal line Sig and the gate of the drive transistor Q1. A scanning line Gate is connected to a gate of the sampling transistor Q2. The pixel capacitance Cs is connected between the gate of the drive transistor Q1 and the anode electrode of the OLED 5.

When the scanning line Gate becomes a high potential, the sampling transistor Q2 supplies a voltage corresponding to the signal line voltage to the drive transistor Q1. The drive transistor Q1 controls a current flowing through the OLED 5 by a voltage corresponding to the signal line voltage. The OLED 5 emits light with a light-emitting luminance corresponding to the current. When the OLED 5 emits light, the light is emitted through the light emitting region 2B1.

Figure 10B:
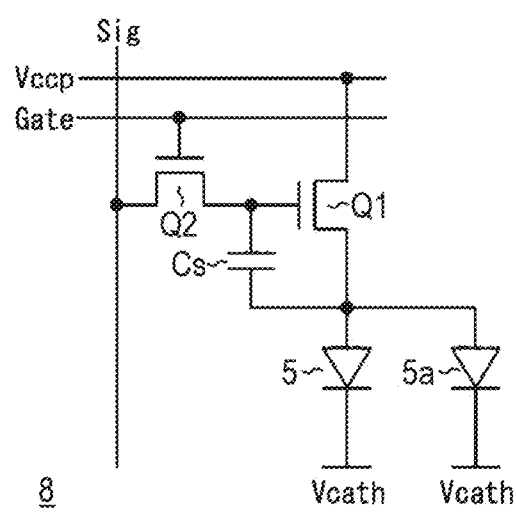
FIG. 10B is a circuit diagram of a pixel circuit 8 according to a modification of FIG. 10A.

FIG. 10B is a circuit diagram of the pixel circuit 8 according to a modification of FIG. 10A. The pixel circuit 8 in FIG. 10B is provided in each pixel in the pixel region 2B where the camera is arranged immediately below, and the pixel circuit 8 of each pixel in the pixel region 2A remains as in FIG. 10A. The pixel circuit 8 of FIG. 10B conforms to the right side cross-sectional view of FIG. 9. In the pixel circuit 8 of FIG. 10B, a new OLED 5*a* is added to the pixel circuit 8 of FIG. 10A. The OLED 5*a* is for emitting light in the light emitting region 2B2, is connected in parallel to the OLED 5 for emitting light in the light emitting region 2B1, and is provided in the display layer 2*d* in the light emitting region 2B2 of each pixel in the pixel region 2B. The light emitted from the OLED 5*a* is emitted from the light emitting region 2B2 in each pixel. Note that most of the pixel circuit 8 that controls light emission of the OLED 5*a* is arranged inside the light emitting region 2B1. With this arrangement, it is possible to suppress a decrease in visible light transmittance of the light emitting region 2B2.

With provision of the pixel circuit 8 of FIG. 10B, as illustrated in the right side cross-sectional view of FIG. 9, light can be emitted from both the light emitting region 2B1 and the light emitting region 2B2 to the display surface 2*z* side, and a difference in pixel luminance between the pixel regions 2A and 2B can be reduced.

Figure 11A:
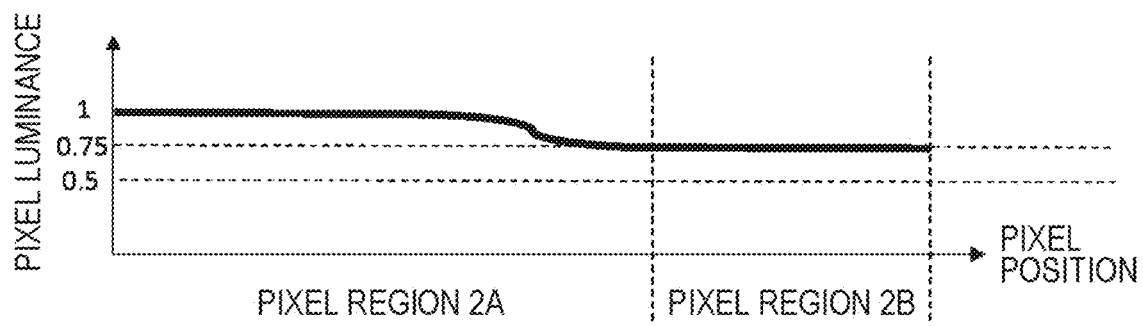
FIG. 11A is a diagram illustrating a pixel luminance of a display panel including the pixel circuits of FIGS. 10A and 10B.

FIG. 11A is a diagram illustrating a pixel luminance of the display panel 2 in a case where each pixel in the pixel region 2A includes the pixel circuit 8 in FIG. 10A, and each pixel in the pixel region 2B includes the pixel circuit 8 in FIG. 10B. Furthermore, FIG. 11B is a diagram illustrating a current per unit area flowing through each pixel in the pixel region 2A and in the pixel region 2B in FIG. 11A.

Figure 11B:
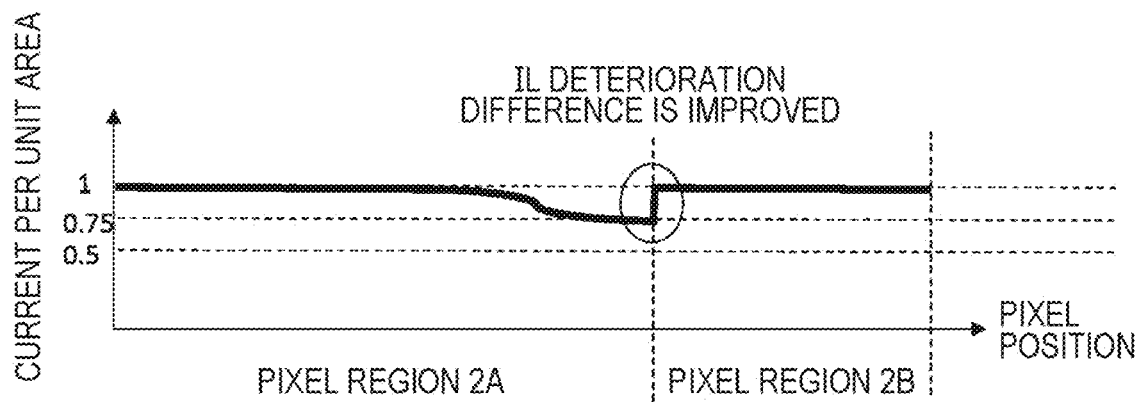
FIG. 11B is a diagram illustrating a current per unit area flowing through each pixel in the pixel region 2A and in the pixel region 2B in FIG. 11A.

In the example illustrated in FIGS. 11A and 11B, the light-emitting luminance of the OLED 5 of each pixel in the pixel regions 2A and 2B is basically made equal, and exceptionally, the light-emitting luminance of the OLED 5 is made lower for a pixel closer to the pixel region 2B in the pixel region close to the pixel region 2B in the pixel region 2A. As a result, the difference in a pixel luminance between the pixel regions 2A and 2B can be reduced without increasing the current flowing through the OLED 5 of each pixel in the pixel region 2B, and the luminance variation of the display panel 2 becomes inconspicuous.

Meanwhile, it is desirable to stop light emission from the pixel region 2B during the operation period of the sensor arranged immediately below the pixel region 2B. This is because, when imaging or the like is performed by a sensor immediately below the pixel region 2B in a state where the pixel region 2B emits light, a light emission component by the OLED 5*a* is included in a detection signal of the sensor, and reliability of the detection signal of the sensor is lowered. Therefore, a pixel circuit 8 as illustrated in FIG. 12A is conceivable.

Figure 12A:
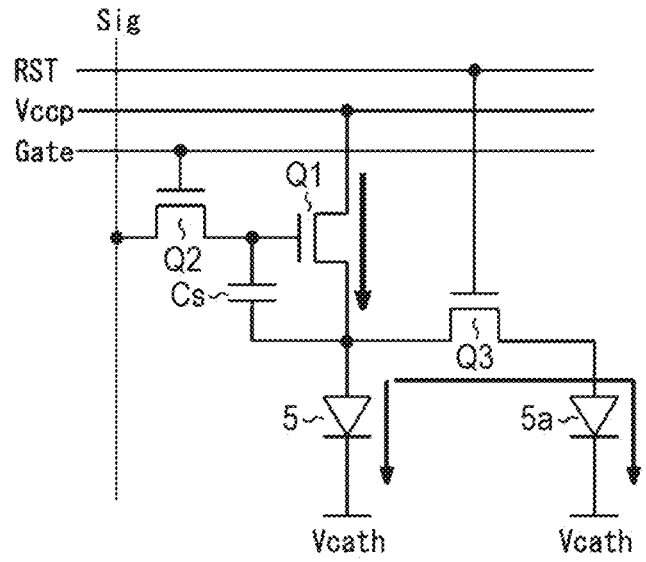
FIG. 12A is a diagram illustrating a flow of a current in a case where a switch transistor is turned on by an arrow.
Figure 12B:
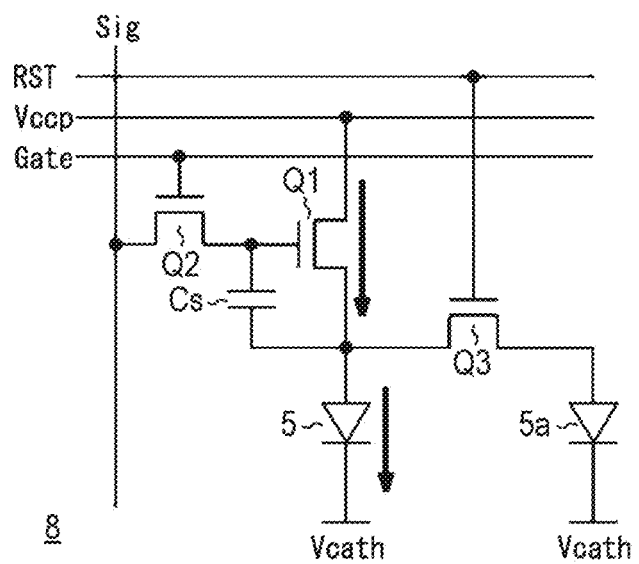
FIG. 12B is a diagram illustrating a flow of a current in a case where the switch transistor is turned off by an arrow.

FIGS. 12A and 12B are circuit diagrams in which a switch transistor Q3 is added to FIG. 10B. FIG. 12A illustrates the flow of the current in a case where the switch transistor Q3 is turned on by an arrow. In addition, FIG. 12B illustrates the flow of the current in a case where the switch transistor Q3 is turned off by an arrow. Furthermore, FIG. 13A is a cross-sectional view illustrating a flow of a current in a case where the switch transistor Q3 is turned on by an arrow, and FIG. 13B is a cross-sectional view illustrating a flow of a current in a case where the switch transistor Q3 is turned off by an arrow.

The switch transistor Q3 switches whether or not the anode electrodes of the two OLEDs 5 and 5*a* are electrically connected to each other. A reset signal RST is connected to a gate of the switch transistor Q3. When the reset signal RST becomes a high potential, the anode electrodes of the two OLEDs 5 and 5*a* are electrically connected to each other.

The reset signal RST has a low potential in accordance with the timing of operating the sensor arranged immediately below the pixel region 2B. As a result, during operation of the sensor, the switch transistor Q3 is turned off to stop light emission of the OLED 5*a* for the light emitting region 2B2, so that light can be prevented from being emitted from the light emitting region 2B2.

Figure 13A:
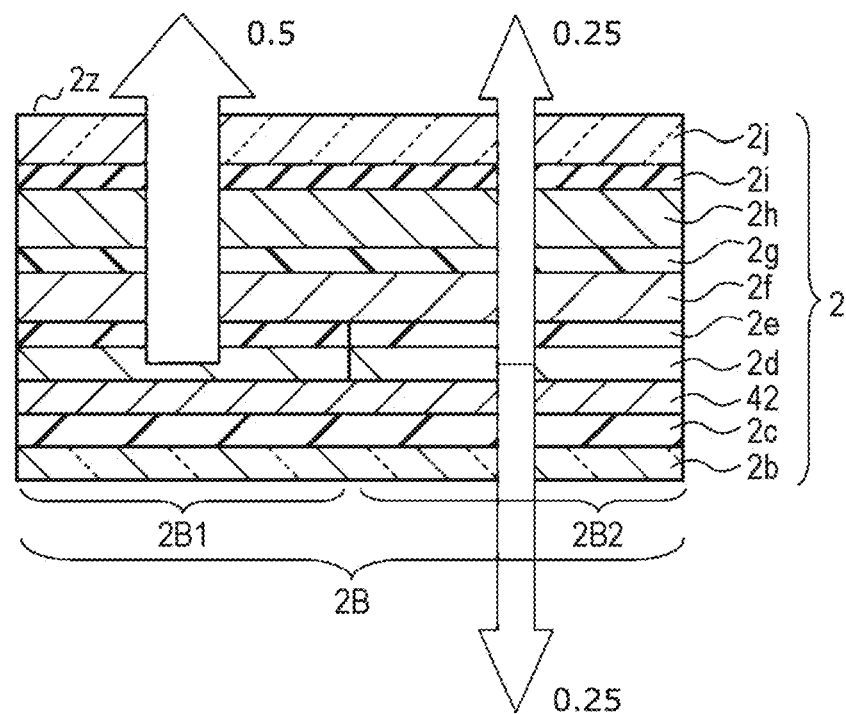
FIG. 13A is a cross-sectional view illustrating a flow of a current in a case where a switch transistor is turned on by an arrow.
Figure 13B:
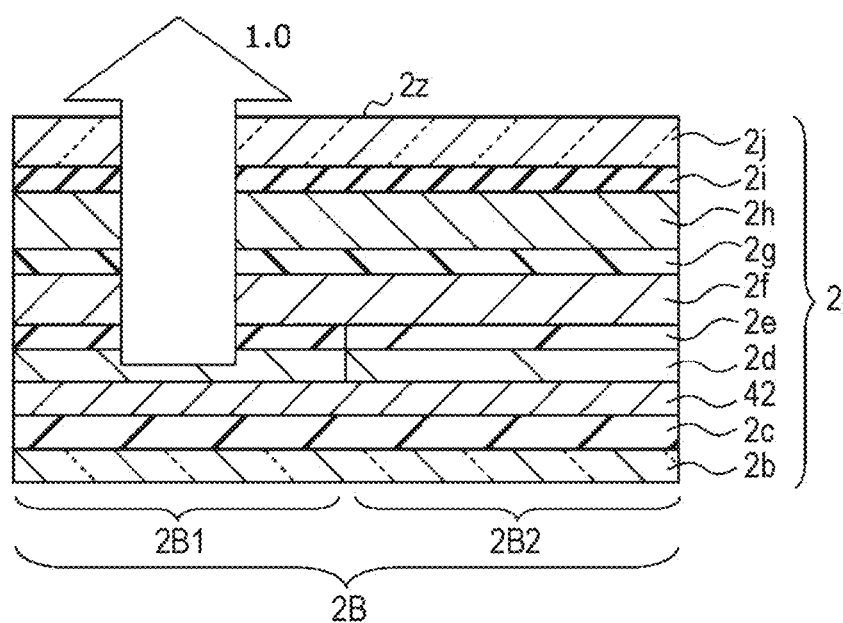
FIG. 13B is a cross-sectional view illustrating a flow of a current in a case where the switch transistor is turned off by an arrow.

In a case where the switch transistor Q3 is on, as illustrated in the circuit diagram of FIG. 12A and the cross-sectional view of FIG. 13A, both the light emitting region 2B1 and the light emitting region 2B2 in the pixel region 2B emit the light emitted by the OLEDs 5 and 5*a*. In a case where the areas of a visible light non-transmitting portion 2B1 and the light emitting region 2B2 are equal to each other, assuming that the pixel luminance of the light emitting region 2B1 is 0.5, the pixel luminance of the light emitting region 2B2 on the display surface 2*z* side is 0.25.

In a case where the switch transistor Q3 is off, all the drain-source current of the drive transistor Q1 flows to the OLED 5, so that the amount of current flowing to the OLED 5 is substantially twice that in a case where the switch transistor Q3 is on. Therefore, as illustrated in the circuit diagram of FIG. 12B and the cross-sectional view of FIG. 13B, light is not emitted from the light emitting region 2B2 in the pixel region 2B, but light having twice the luminance of FIG. 12A is emitted from the light emitting region 2B1. In FIG. 13A, the combined pixel luminance of the light emitting region 2B1 and the light emitting region 2B2 of each pixel is 0.5+0.25=0.75, whereas in FIG. 13B, the pixel luminance of each pixel is 0.5× 2=1.0.

As described above, depending on whether the switch transistor Q3 is on or off, the pixel luminance of the light emitting region 2B1 in the pixel region 2B slightly changes. However, how much the average luminance of each pixel in the display panel 2 is set can be adjusted by the signal line voltage in FIG. 12A or the like. Furthermore, the average luminance of the display panel 2 can also be adjusted by adjusting the display period of each pixel in one frame period or the operation period of the sensor in one frame period. Note that the operation period of the sensor is desirably set to a partial period within one frame period from the viewpoint of suppressing flicker, but the sensor may be operated within a period extending over a plurality of frames in some cases.

It is conceivable that the pixel circuit 8 in which the OLED 5*a* for causing the light emitting region 2B2 to emit light is provided in each pixel in the pixel region 2B has a circuit configuration other than the pixel circuit 8 in FIG. 10B or FIG. 12A.

Figure 14A:
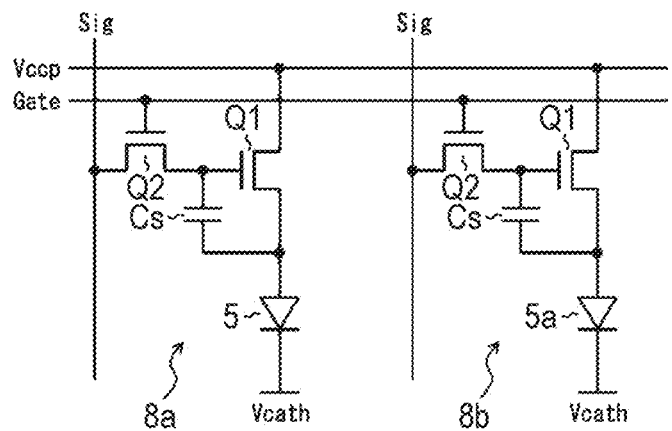
FIG. 14A is a circuit diagram of a first modification of the pixel circuit in the pixel region.

FIG. 14A is a circuit diagram of a first modification of the pixel circuit 8 in the pixel region 2B. The pixel circuit 8 in FIG. 14A includes a first pixel circuit 8*a* for causing the light emitting region 2B1 to emit light and a second pixel circuit 8*b* for causing the light emitting region 2B2 to emit light. The first pixel circuit 8*a* and the second pixel circuit 8*b* have the same circuit configuration, and include a sampling transistor Q2, a drive transistor Q1, and a pixel capacitance Cs. The first pixel circuit 8*a* and the second pixel circuit 8*b* are also provided with signal lines separately.

The first pixel circuit 8*a* causes the OLED 5 to emit light with a 100% duty during still image display. The second pixel circuit 8*b* suppresses deterioration of the OLED 5*a* by causing the OLED 5*a* to emit light only during the operation period of the sensor.

Since the pixel circuit 8 in FIG. 14A requires a circuit area approximately twice that of the normal pixel circuit 8, the area of the light emitting region 2B2 has to be reduced, and the visible light transmittance is lowered. On the other hand, the light emitting region 2B2 can be caused to emit light at an arbitrary timing, and the current flowing through the OLED 5 in the first pixel circuit 8*a* in the light emitting region 2B1 is not affected by light emission or light turn-off of the light emitting region 2B2.

Figure 14B:
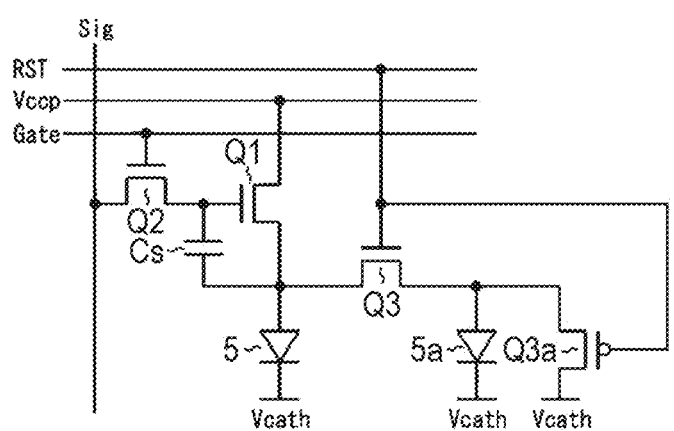
FIG. 14B is a circuit diagram of a second modification of the pixel circuit in the pixel region.

FIG. 14B is a circuit diagram of a second modification of the pixel circuit 8 in the pixel region 2B. When the switch transistor Q3 in FIG. 12A is turned off, the drain-source current of the drive transistor Q1 does not flow to the OLED 5*a* for the light emitting region 2B2, and all the current flows to the OLED 5 for the light emitting region 2B1. However, when a leakage current flows between the drain and the source of the switch transistor Q3, a current also flows in the OLED 5*a* for the light emitting region 2B2 in accordance with the amount of the leakage current, and in some cases, there is a possibility that the OLED 5*a* for the light emitting region 2B2 emits light, and light leaks from the light emitting region 2B2.

Therefore, in the pixel circuit 8 in FIG. 14B, a switch transistor Q3*a* having an opposite conductivity type is additionally arranged between the gate of the switch transistor Q3 and the ground node (the same potential as the cathode electrode), and the reset signal RST is input to the gate of the switch transistor Q3a. As a result, only one of the two switch transistors Q3 and Q3a is turned on. Therefore, when the switch transistor Q3 is turned off, the anode electrode of the OLED 5a for the light emitting region 2B2 is short-circuited with the cathode electrode, and the OLED 5a can be reliably turned off.

Figure 14C:
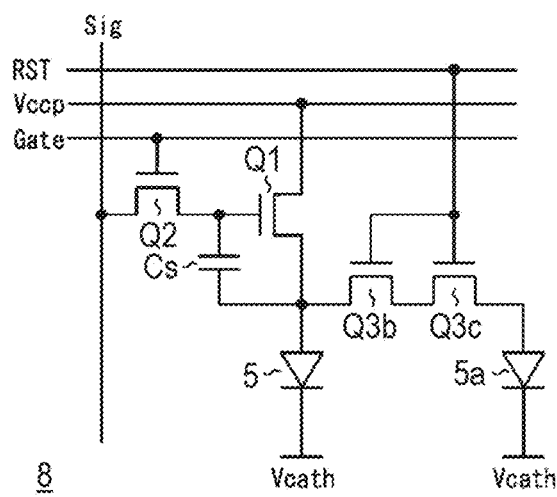
FIG. 14C is a circuit diagram of a third modification of the pixel circuit in the pixel region.

FIG. 14C is a circuit diagram of a third modification of the pixel circuit 8 in the pixel region 2B. The pixel circuit 8 in FIG. 14C is different from the pixel circuit 8 in FIG. 12A in that the switch transistor Q3 in FIG. 12A includes two cascode-connected switch transistors Q3b and Q3c. The reset signal RST is input to the gates of the two switch transistors Q3b and Q3c.

By forming the switch transistor Q3 into the double gate structure as illustrated in FIG. 14C, when the switch transistors Q3b and Q3c are turned off, there is no possibility that a leakage current flows through the switch transistors Q3b and Q3c, and there is no problem that the OLED 5 for the light emitting region 2B1 emits light due to the leakage current.

In a case where the sensor is an imaging sensor, when a defective pixel in which a leak current occurs is detected by the switch transistor Q3 in FIG. 12A or the switch transistors Q3b and Q3c in FIG. 14C, and occurrence of a leak current is detected, a captured image of the imaging sensor can be corrected.

Figure 15:
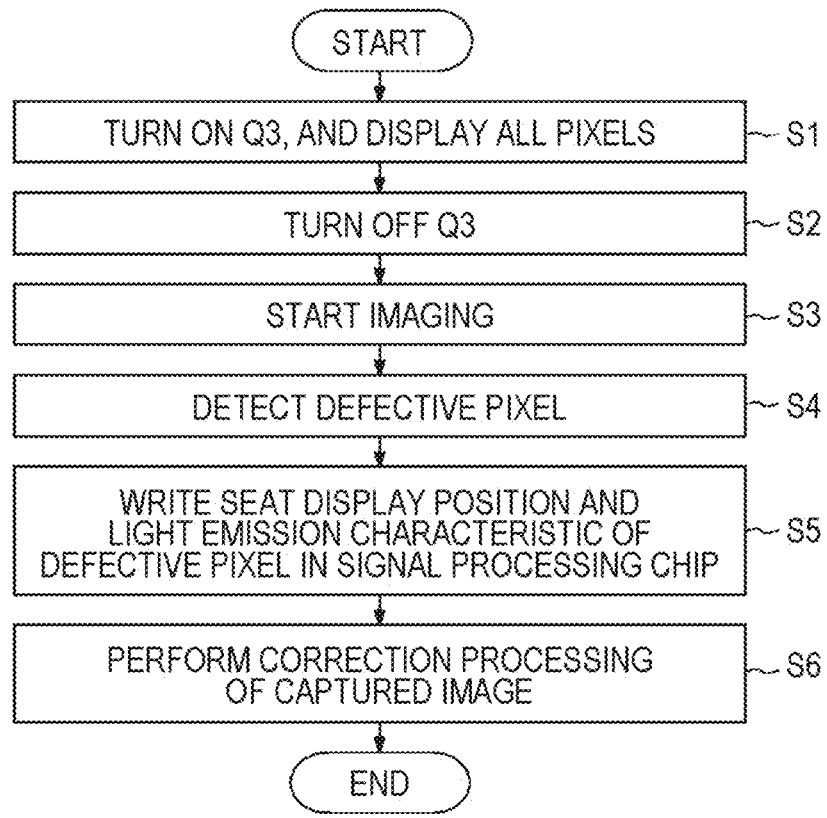
FIG. 15 is a flowchart illustrating a processing procedure for detecting a defective pixel and correcting an image.

FIG. 15 is a flowchart illustrating a processing procedure for detecting a defective pixel and correcting an image. The flowchart of FIG. 15 is performed, for example, in an inspection process after manufacturing the image display device 1 according to the present embodiment. Alternatively, the flowchart of FIG. 15 may be performed on the user side after shipping the image display device 1 according to the present embodiment.

First, all the pixels of the display panel 2 are displayed in a state where the switch transistor Q3 of each of the pixels in the pixel region 2B is turned on (step S1). Next, the switch transistor Q3 is turned off (step S2), and imaging is performed by the imaging sensor in a state where light emission in the light emitting region 2B2 in the pixel region 2B is stopped (step S3). Next, on the basis of the captured image, a defective pixel having the switch transistor Q3 in which a leakage current has occurred is detected (step S4), and a coordinate position and a light emission characteristic of the defective pixel are written in a signal processing chip in the image display device 1 (step S5). Thereafter, when imaging is performed by the imaging sensor, the information written in the signal processing chip is read and correction processing of the captured image is performed (step S6). For example, for a pixel having the switch transistor Q3 through which a leakage current flows, since the luminance of the captured image becomes too high, correction processing for reducing the luminance may be performed.

Figure 16:
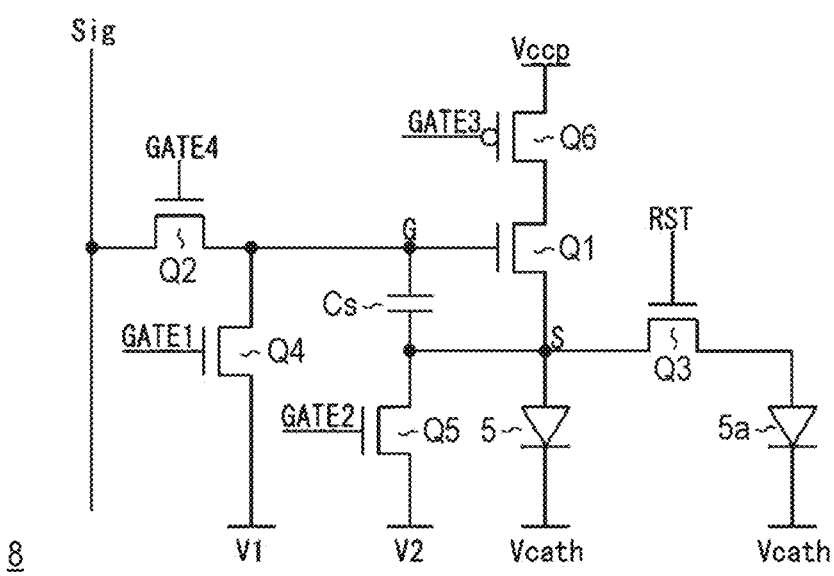
FIG. 16 is a circuit diagram showing a specific configuration of a pixel circuit of each pixel in the pixel circuit.

FIG. 16 is a circuit diagram showing a specific configuration of the pixel circuit 8 of each pixel in the pixel circuit 8B. The pixel circuit 8 of FIG. 16 includes three transistors Q4 to 06 in addition to the drive transistor Q1, the sampling transistor Q2, and the switch transistor Q3 illustrated in FIG. 12A. The drain of the transistor Q4 is connected to the gate of the drive transistor Q1, the source of the transistor Q4 is set to the voltage V1, and a gate signal Gate1 is input to the gate of the transistor Q4. The drain of the transistor Q5 is connected to the anode electrode of the OLED 5, the source of the transistor Q5 is set to the voltage V2, and a gate signal Gate2 is input to the gate of the transistor Q5.

The transistors Q1 to Q5 are N-type transistors, whereas the transistor Q6 is a P-type transistor. The source of the transistor Q6 is set to the power supply voltage Vccp, the drain of the transistor Q6 is connected to the drain of the drive transistor Q1, and a gate signal Gate3 is input to the gate of the transistor Q6.

Figure 17:
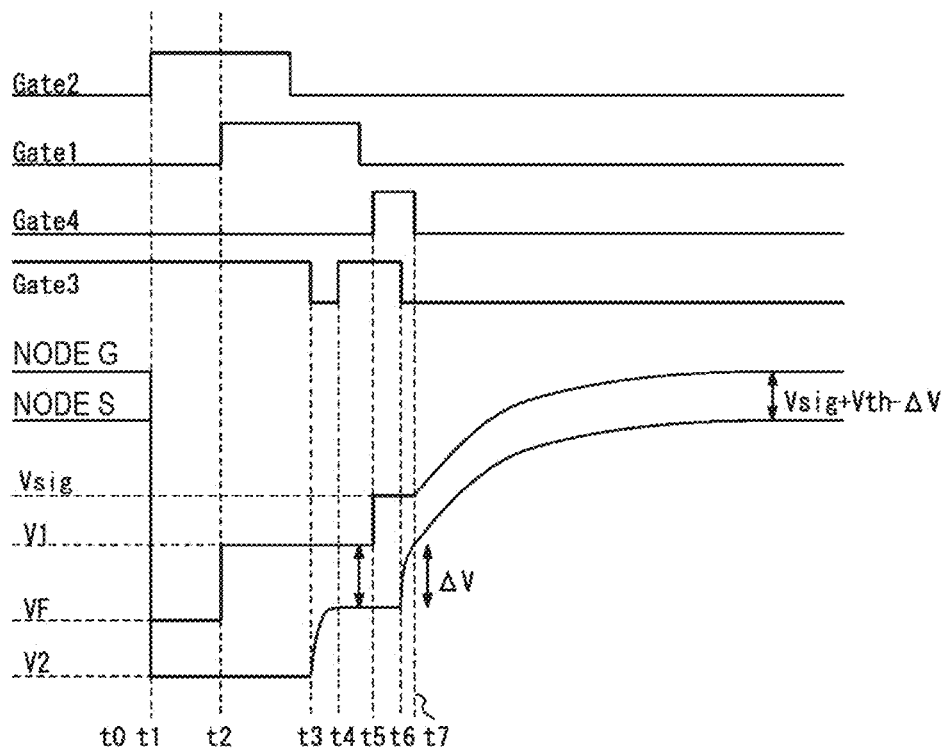
FIG. 17 is a voltage waveform diagram of each portion in the pixel circuit of FIG. 16.

FIG. 17 is a voltage waveform diagram of each portion in the pixel circuit 8 of FIG. 16. Hereinafter, the operation of the pixel circuit 8 of FIG. 16 will be described with reference to the voltage waveform diagram of FIG. 17.

In the initial state (time to), the transistors Q2 and Q4 to Q5 are in an off state, and the gate voltage of the drive transistor Q1 is undefined.

Thereafter, the gate signal Gate2 becomes a high potential at time t1. As a result, the transistor Q5 is turned on, and a node S connected to the source of the drive transistor Q1 rapidly decreases to the voltage V2. As a result, the gate voltage G of the drive transistor Q1 also rapidly decreases to the voltage VF via the pixel capacitance Cs.

Thereafter, at time t2, the gate signal Gate1 becomes a high potential. As a result, the transistor Q4 is turned on, and the gate voltage G of the drive transistor rises to the voltage V1. At this time point, the node S is the voltage V2, and the gate-source voltage Vgs of the drive transistor Q1 is Vgs=V1−v2>Vth. However, since the voltage V2 at the node S is smaller than a threshold voltage VthEL of the OLED 5, the OLED 5 is in a reverse bias state and does not emit light.

Thereafter, at time t3, the gate signal Gate2 becomes a low potential, and the gate signal Gate3 also becomes a low potential. As a result, the transistor Q5 is turned off, and the transistor Q6 is turned on. Therefore, the source-drain current of the transistor Q6 flows to the pixel capacitance Cs via between the drain and source of the drive transistor Q1, and charges are accumulated in the pixel capacitance Cs. As a result, the operation of correcting Vth of the drive transistor Q1 is started. At this time point, the gate voltage of the drive transistor Q1 is V1, and as the charge accumulation amount increases, the voltage of the node S rises and the Vgs of the drive transistor Q1 decreases. Therefore, the drive transistor Q1 is cut off in due course, and the voltage of the node S becomes V1−Vth.

When the drive transistor Q1 is cut off, a drain-source current does not flow through the drive transistor Q1. Thereafter, at time t4, the gate signal Gate3 becomes a high potential, and the transistor Q6 is turned off. In addition, the gate signal Gate1 also becomes a low potential, and the transistor Q4 is turned off. As a result, a charge corresponding to Vth is held in the pixel capacitance Cs. As described above, the period from time t3 to time t4 is a period in which the threshold voltage Vth of the drive transistor Q1 is detected and corrected.

Thereafter, when the gate signal Gate4 connected to the scanning line is set to a high potential at time t5, the sampling transistor Q2 is turned on, and a charge corresponding to the signal line voltage Vsig is accumulated in the pixel capacitance Cs. As a result, the gate-source voltage Vgs of the drive transistor Q1 becomes Vsig−V1+Vth. For simplification of description, when V1=0, Vgs=Vsig+Vth.

At time t6 before time t7 when the sampling period ends, the gate signal Gate3 becomes a low potential, and the transistor Q6 is turned on. As a result, the drain voltage of the drive transistor Q1 becomes the power supply voltage Vcc, and the pixel circuit 8 transitions from the non-light emission period to the light emission period. The mobility correction of the drive transistor Q1 is performed while the sampling transistor Q2 is still on (from time t6 to time t7). Within a period from time t6 to time t7, a drain-source current of the drive transistor Q1 flows while the gate of the drive transistor Q1 is held at the signal line voltage Vsig. Here, by setting V1−Vth<VthEL, the OLED 5 is in a reverse bias state and exhibits simple capacitance characteristics instead of rectification characteristics. Therefore, the drain-source current Ids of the drive transistor Q1 flows to the equivalent capacitance of the pixel capacitance Cs and the OLED 5, and the source voltage of the drive transistor Q1 rises. In FIG. 17, the amount of rise in the source voltage is ΔV. Since the amount of rise ΔV is subtracted from Vgs of the drive transistor Q1 held in the pixel capacitance Cs, negative feedback is applied.

As described above, the drain-source current Ids of the drive transistor Q1 is negatively fed back to the Vgs of the drive transistor Q1, whereby the mobility u of the drive transistor Q1 can be corrected. Note that the negative feedback amount ΔV can be optimized by adjusting the time width from time t6 to time t7.

When the gate signal Gate4 becomes the low potential at time t7, the sampling transistor Q2 is turned off. As a result, the gate of the drive transistor Q1 is disconnected from the signal line, and the gate of the drive transistor Q1 holds the voltage (Vsig−ΔV+Vth).

The source voltage of the drive transistor gradually rises, the reverse bias state of the OLED 5 is eliminated, and light emission is started. At this time, the current flowing through the OLED 5 is expressed by the above-described Formula (1).

Figure 18:
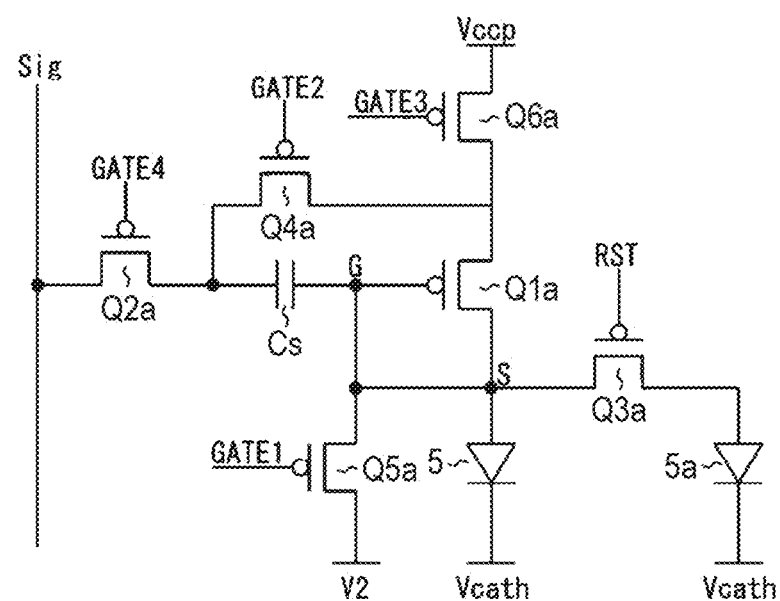
FIG. 18 is a circuit diagram in which all transistors in the pixel circuit are P-type.

The pixel circuit 8 of FIG. 16 shows the example in which the transistors Q1 to Q5 are the N-type transistors and the transistor Q6 is the P-type transistor. However, as illustrated in FIG. 18, all the transistors Q1a to Q6a may be configured by P-type transistors. The operation principle of the pixel circuit 8 of FIG. 18 is similar to that of the pixel circuit 8 of FIG. 15, and detailed description of the operation is omitted.

Figure 19:
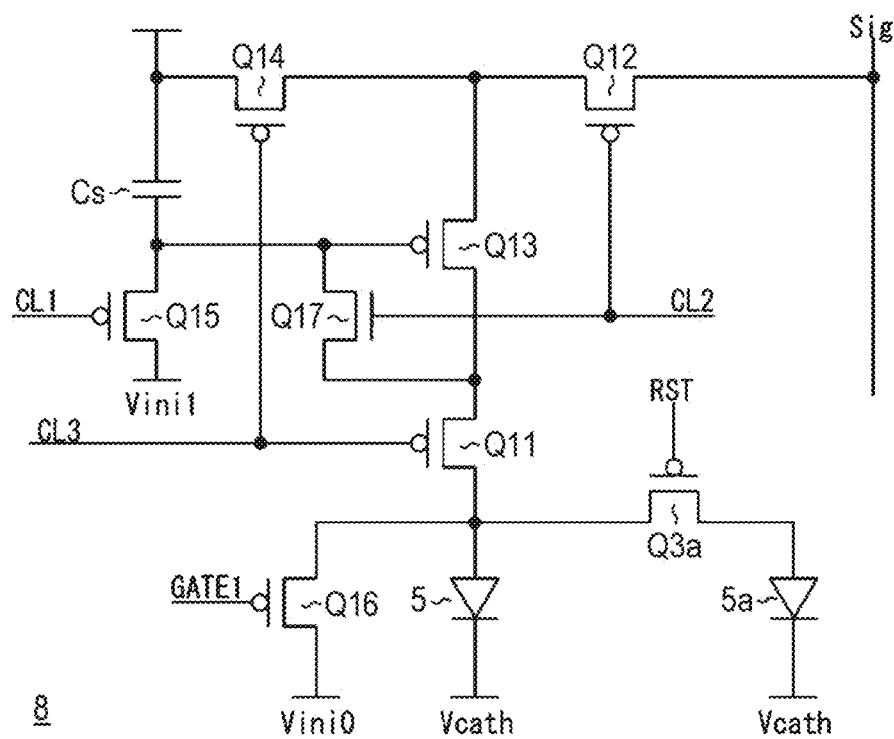
FIG. 19 is a circuit diagram of a pixel circuit having a configuration different from those in FIGS. 16 and 18.

FIG. 19 is a circuit diagram of the pixel circuit 8 having a configuration different from those in FIGS. 16 and 18. The pixel circuit 8 in FIG. 19 includes P-type transistors Q11 to Q16, an N-type transistor Q17, and a pixel capacitance CsCs. The transistor Q13 is a drive transistor, and the transistor Q12 is a sampling transistor.

First, the transistor Q15 is turned on, and the initialization voltage Vint is supplied to the gate of the drive transistor Q13. The initialization voltage Vint is lower than the signal line voltage, and the drive transistor Q13 is set to the on-bias state.

Next, the transistors Q12 and Q17 are turned on. When the transistor Q17 is turned on, the gate and the drain of the drive transistor Q13 are short-circuited to function as a diode. Thereafter, when the transistors Q11 and Q14 are turned on, charges corresponding to the signal line voltage are accumulated in the pixel capacitance Cs, the potential of the connection node S between the transistors Q12 and Q14 gradually rises, and when the source voltage of the transistor Q11 exceeds the threshold voltage of the OLED 5, the OLED 5 starts light emission. The conductivity type of each transistor in FIG. 19 may be reversed.

As illustrated in FIGS. 16, 18, and 19, various modifications are conceivable for the circuit configuration of the pixel circuit 8, and in the present embodiment, the pixel circuit 8 having an arbitrary circuit configuration can be applied.

Figure 20:
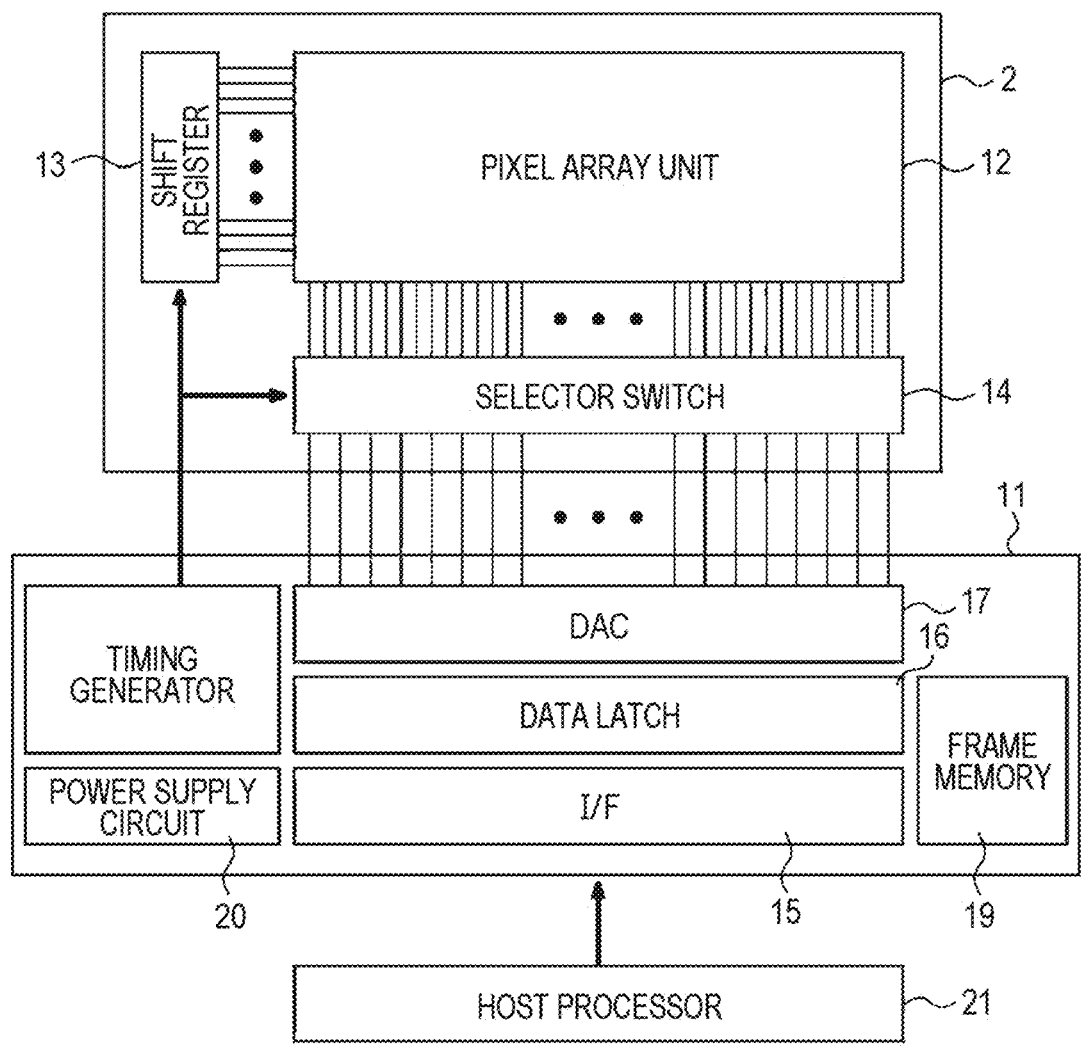
FIG. 20 is a block diagram illustrating a schematic configuration of an image display device according to the present embodiment.

FIG. 20 is a block diagram illustrating a schematic configuration of the image display device 1 according to the present embodiment. As illustrated, the image display device 1 includes a display panel 2, and a driver IC 11 is connected to the display panel 2 via an FPC 3 or the like. For example, as illustrated in FIG. 1A, the driver IC 11 may be a COF 4 mounted on the FPC 3. In this case, transmission and reception of signals between the display panel 2 and the driver IC 11 are performed via wiring in the FPC 3. Alternatively, at least some circuits incorporated in the driver IC 11 may be stacked on the display panel 2 to form a COG configuration. Further, the driver IC 11 may be mounted on a frame portion (bezel) of the display panel 2.

Although one driver IC 11 is illustrated in FIG. 20 for simplification, a plurality of driver ICs 11 may transmit and receive signals to and from the display panel 2.

The display panel 2 includes a pixel array unit 12, a shift register (gate driver) 13, and a selector switch 14. As described above, the pixel array unit 12 includes a plurality of pixels arranged vertically and horizontally, and a sensor is arranged immediately below a part of the pixel region (pixel region 2B). Each pixel in the pixel region 2B includes the pixel circuit 8 illustrated in FIG. 12A and the like, and each pixel in the pixel region 2A includes the pixel circuit 8 illustrated in FIG. 10A and the like. Since the pixel circuit 8 includes a member having low visible light transmittance such as an anode electrode, most of the pixel circuit 8 of each pixel in the pixel region 2B in which the sensor is arranged immediately below is arranged in the light emitting region 2B1.

A shift register 13 is connected to the plurality of scanning lines, and sequentially supplies a gate pulse signal to each scanning line. The shift register 13 is also called a scanning line drive circuit or a gate driver. FIG. 20 illustrates an example including 480 scanning lines, but the number of scanning lines is not limited.

The selector switch 14 is connected to a plurality of signal lines, and sequentially supplies a signal line voltage to each signal line. In a case where there are 640 pixels in the horizontal direction of the display panel 2, since each pixel has three color pixels, the number of signal lines is 640×3=1920. Although FIG. 20 illustrates an example in which 1920 signal lines are output from one selector switch 14, a plurality of selector switches 14 may be provided to reduce the number of signal lines connected to each selector switch 14.

The driver IC 11 includes an interface (I/F) circuit 15, a data latch circuit 16, a DAC 17, a timing generator 18, a frame memory 19, and a power supply circuit 20. The I/F circuit 15 receives video data, control data, a power supply voltage, and the like from a host processor 21 or the like provided outside the image display device 1. The data latch circuit 16 latches the video data at a predetermined timing. The DAC 17 converts the video data latched by the data latch circuit 16 into an analog pixel voltage. The timing generator 18 controls a latch timing of the data latch circuit 16 and a timing of D/A conversion by the DAC 17 on the basis of the control data received by the I/F circuit 15. The frame memory 19 has, for example, a memory capacity for storing video data for one frame displayed on the display panel 2. The display panel 2 updates the display about 60 times per second, but it is not desirable to receive and display the video data from the host processor 21 each time since the power consumption increases. Therefore, in a case where the same still image is displayed on display panel 2, it is possible to reduce power consumption by reading the still image from the frame memory 19 and displaying the still image.

Figure 21:
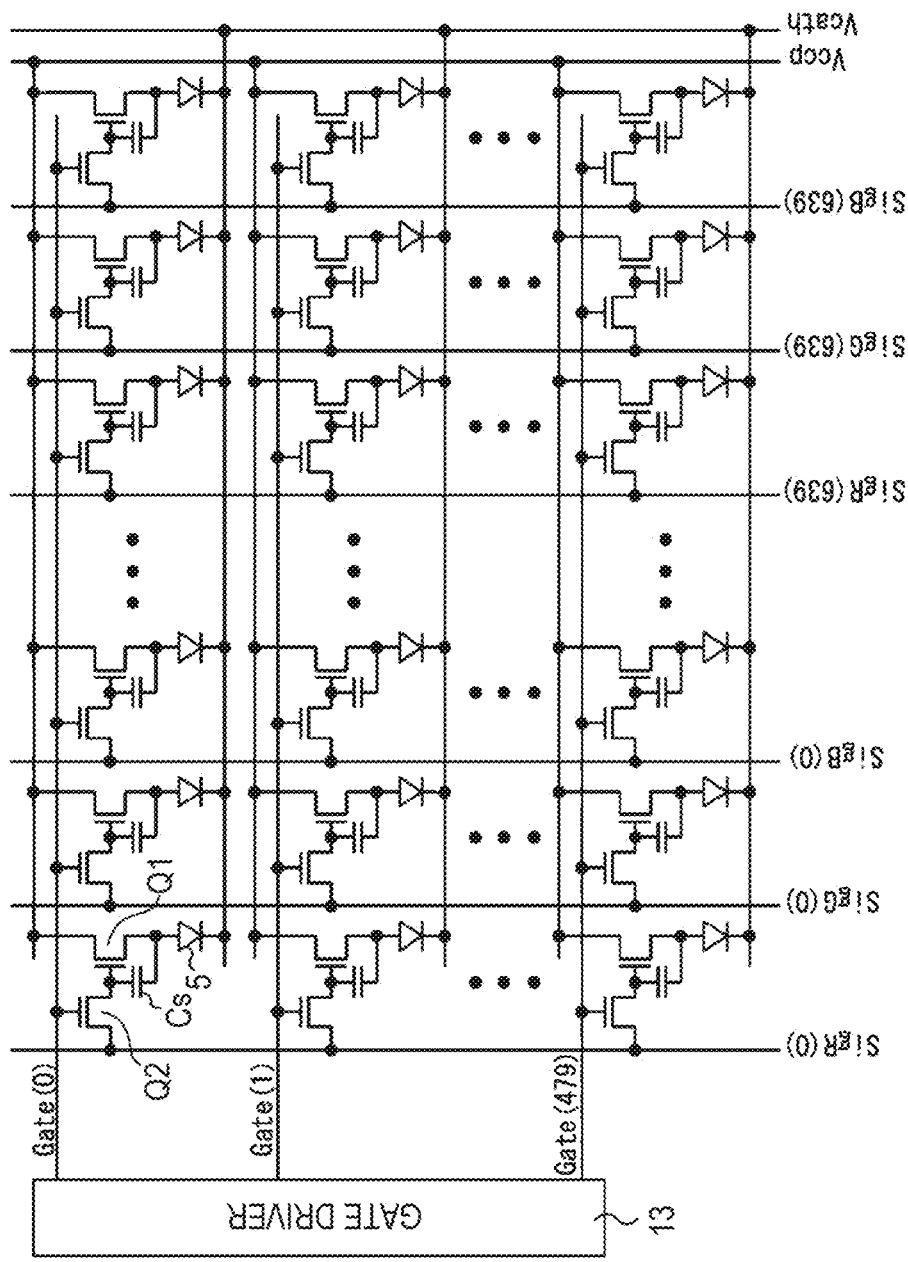
FIG. 21 is a circuit diagram showing a basic configuration of a pixel array unit in FIG. 20.

FIG. 21 is a circuit diagram showing a basic configuration of the pixel array unit 12 in FIG. 20. The pixel array unit 12 includes a plurality of scanning lines and a plurality of signal lines arranged vertically and horizontally, and the pixel circuit 8 is provided at each intersection of the scanning lines and the signal lines. For the sake of simplicity, FIG. 21 illustrates an example in which each pixel circuit 8 includes the sampling transistor Q2, the drive transistor Q1, the pixel capacitance Cs, and the OLED 5, but the pixel circuit 8 actually has the circuit configuration of FIG. 16 and the like. Gate pulse signals are line-sequentially output from a gate driver (shift register) 13 to the plurality of scanning lines.

Figure 22:
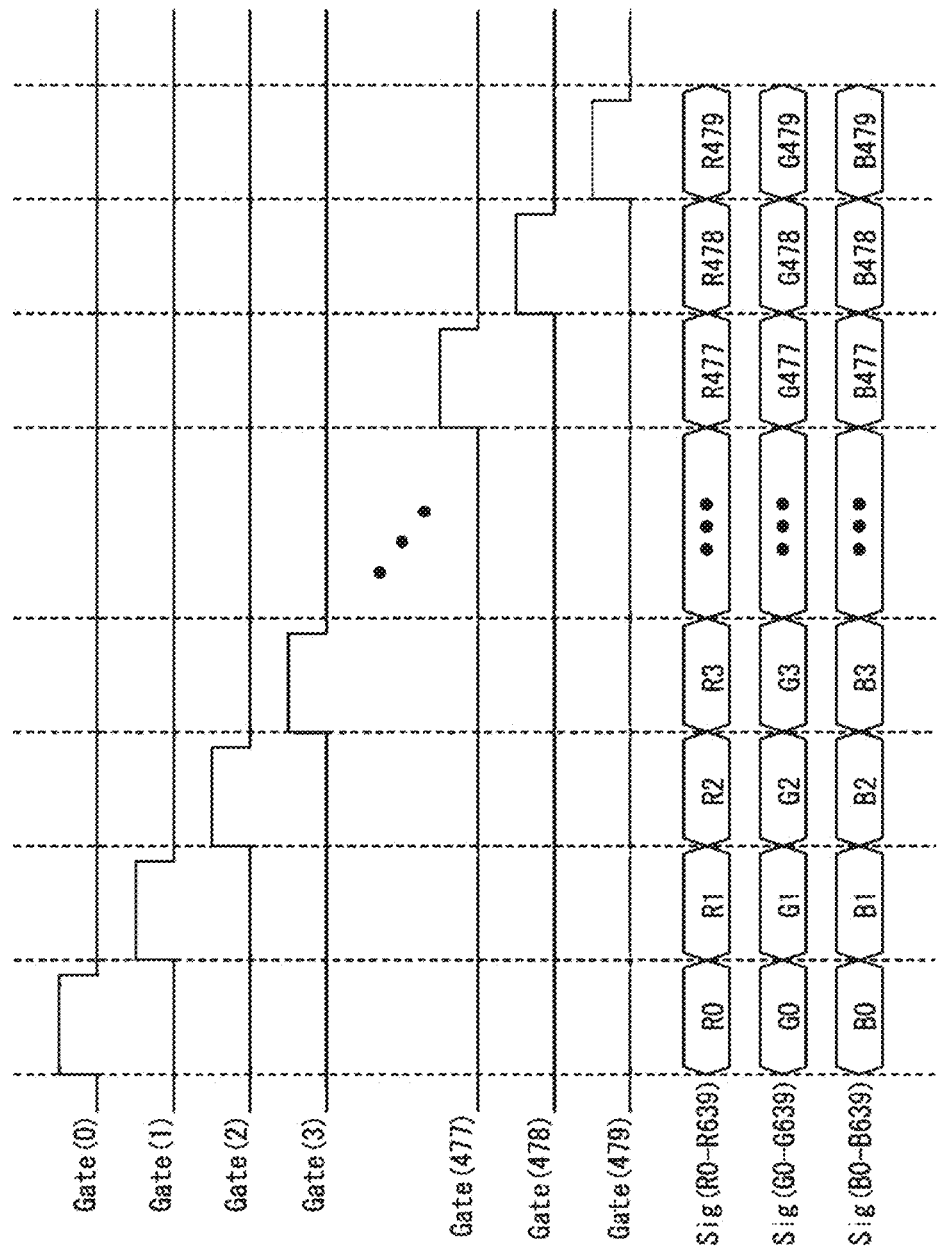
FIG. 22 is a timing diagram illustrating drive timing of each scanning line and each signal line in the pixel array unit.

FIG. 22 is a timing diagram illustrating drive timing of each scanning line and each signal line in the pixel array unit 12. As illustrated in FIG. 22, the scanning lines are line-sequentially driven, and gate pulse signals are sequentially output. In addition, a signal line voltage is supplied to each signal line in accordance with the timing at which the gate pulse signal is supplied to each scanning line. Each pixel includes three color pixels, and the signal line voltage of each color pixel is supplied to the corresponding signal line at the same timing.

Figure 23:
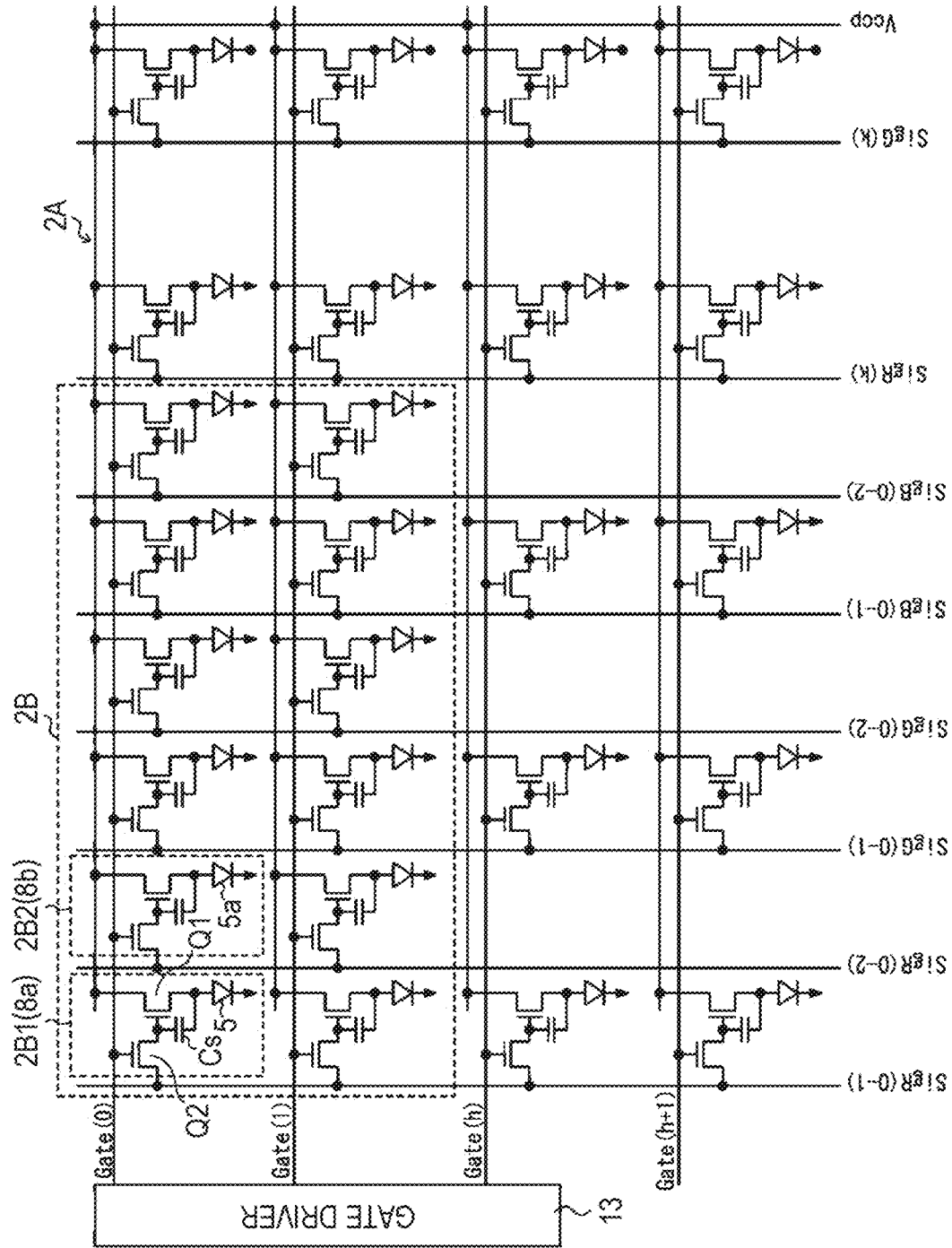
FIG. 23 is a circuit diagram showing a specific configuration of a pixel array unit according to the present embodiment.

FIG. 23 is a circuit diagram showing a specific configuration of the pixel array unit 12 according to the present embodiment. In the pixel array unit 12 of FIG. 23, a region surrounded by a broken line frame is the pixel region 2B in which the sensor is arranged immediately below, and the other region is the pixel region 2A. The pixel region 2B includes a first pixel circuit 8*a* for causing the light emitting region 2B1 to emit light and a second pixel circuit 8*b* for causing the light emitting region 2B2 to emit light. On the other hand, the pixel region 2A other than the pixel region 2B includes only the first pixel circuit 8*a* because the sensor is not arranged immediately below.

The first pixel circuit Sa and the second pixel circuit 8*b* in the pixel region 2B have the same circuit configuration as that illustrated in FIG. 14A. Actually, since each pixel in the pixel region 2B has three color pixels, the first pixel circuit 8*a* and the second pixel circuit 8*b* are provided for each color pixel. The drains of the drive transistors Q1 in the first pixel circuit 8*a* and the second pixel circuit 8*b* provided for each color pixel are both connected to a common power supply voltage Vccp. The first pixel circuit 8*a* and the second pixel circuit 8*b* in the same color pixel are arranged adjacent to each other in the lateral (horizontal) direction. Therefore, the number of signal lines for each pixel in the pixel region 2B is provided twice as many as the number of signal lines for each pixel in the pixel region 2A. Whether or not to cause the light emitting region 2B2 in the pixel region 2B to emit light can be switched depending on whether or not a signal line voltage is supplied to the corresponding signal line.

In the pixel region 2B, in a case where the sensor is not operated, both the light emitting region 2B1 and the light emitting region 2B2 arranged adjacent to each other in the lateral (horizontal) direction in each pixel (color pixel) emit light. On the other hand, during the operation period of the sensor, in the light emitting region 2B1 and the light emitting region 2B2 arranged adjacent to each other in the lateral (horizontal) direction in each pixel (color pixel), the light emitting region 2B1 emits light, but the light emitting region 2B2 does not emit light. Therefore, the sensor can receive the light incident through the light emitting region 2B2 or project the light through the light emitting region 2B2 without being affected by the light emission of the light emitting region 2B2.

Since the first pixel circuit 8*a* and the second pixel circuit 8*b* in the pixel region 2B mainly include a member that reflects light, the first pixel circuit 8*a* and the second pixel circuit 8*b* are arranged inside the light emitting region 2B1. With this arrangement, even if the second pixel circuit 8*b* is provided, the area of the light emitting region 2B2 can be secured, and a decrease in luminance of each pixel in the pixel region 2B can be suppressed.

Figure 24:
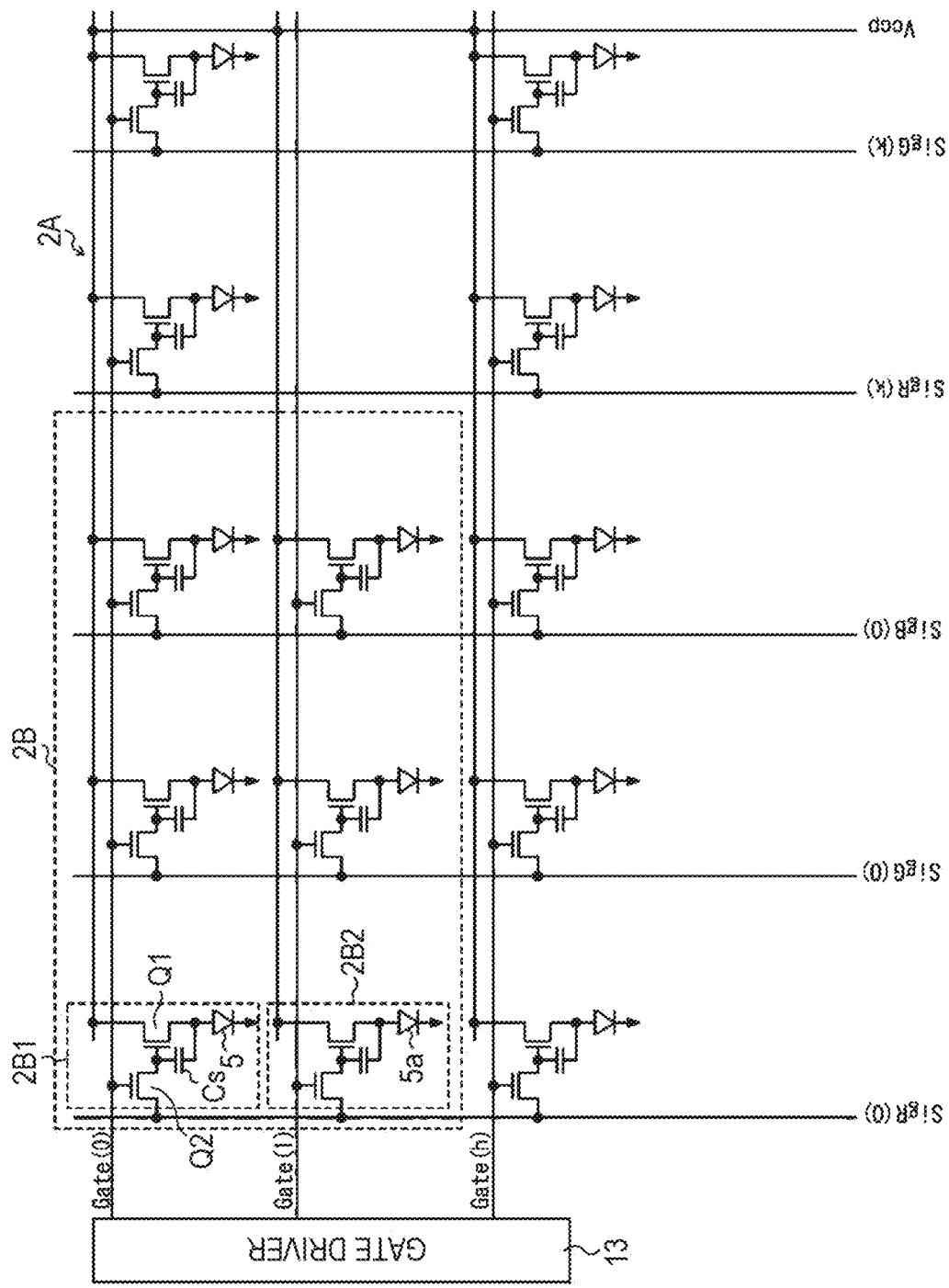
FIG. 24 is a circuit diagram illustrating a first modification of the pixel array unit according to the present embodiment.

FIG. 24 is a circuit diagram illustrating a first modification of the pixel array unit 12 according to the present embodiment. In the pixel array unit 12 of FIG. 24, a region surrounded by a broken line frame is the pixel region 2B in which the sensor is arranged immediately below, and the other region is the pixel region 2A. In the pixel region 2B in the pixel array unit 12 of FIG. 24, the light emitting region 2B1 and the non-light emitting region 2B2 are arranged adjacent to each other in the vertical (vertical) direction in the pixel (color pixel). Therefore, in the pixel region 2B, two scanning lines are provided for each pixel. On the other hand, in the pixel region 2A, two scanning lines are provided for each pixel, but the pixel circuit 8 is connected to only one of the scanning lines. Whether or not to cause the non-light emitting region 2B2 in the pixel region 2B to emit light can be switched depending on whether or not a gate pulse signal is supplied to the corresponding scanning line.

In the pixel region 2B, in a case where the sensor is not operated, both the light emitting region 2B1 and the non-light emitting region 2B2 arranged adjacent to each other in the vertical (vertical) direction in each pixel (color pixel) emit light. On the other hand, during the operation period of the sensor, in the light emitting region 2B1 and the non-light emitting region 2B2 arranged adjacent to each other in the vertical (vertical) direction in each pixel (color pixel), the light emitting region 2B1 emits light, but the non-light emitting region 2B2 does not emit light. Therefore, the sensor can receive the light incident through the non-light emitting region 2B2 or project the light through the non-light emitting region 2B2 without being affected by the light emission of the non-light emitting region 2B2.

Figure 25:
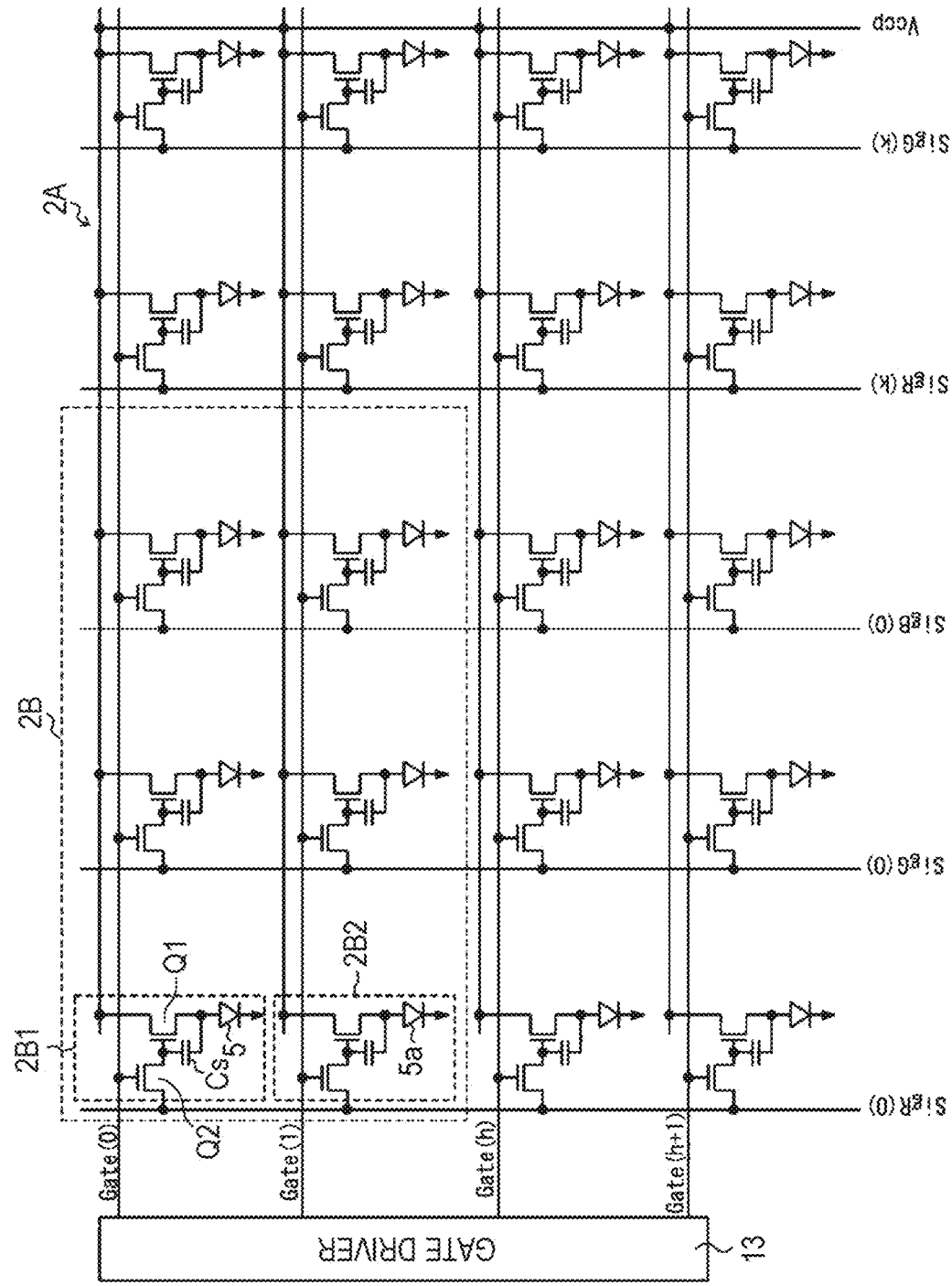
FIG. 25 is a circuit diagram illustrating a second modification of the pixel array unit according to the present embodiment.

FIG. 25 is a circuit diagram illustrating a second modification of the pixel array unit 12 according to the present embodiment. In the pixel array unit 12 of FIG. 25, a region surrounded by a broken line frame is the pixel region 2B in which the sensor is arranged immediately below, and the other region is the pixel region 2A. The pixel array unit 12 in FIG. 25 uses one pixel as the light emitting region 2B1 and uses the other pixel as the non-light emitting region 2B2 among two pixels adjacent in the vertical (vertical) direction. In a case where the sensor is not operated, all the pixels in the pixel region are caused to emit light. During the operation period of the sensor, for example, pixels in odd-numbered rows in the pixel region 2B are caused to emit light, and pixels in even-numbered rows are caused not to emit light. For the pixels in the even-numbered rows, the signal line voltage is set to zero at the drive timing of the scanning line of each pixel. As a result, the pixels in the even-numbered rows in the pixel region 2B do not emit light, and the pixels in the even-numbered rows can be used as the non-light emitting region 2B2 to receive light by the sensor.

Figure 26:
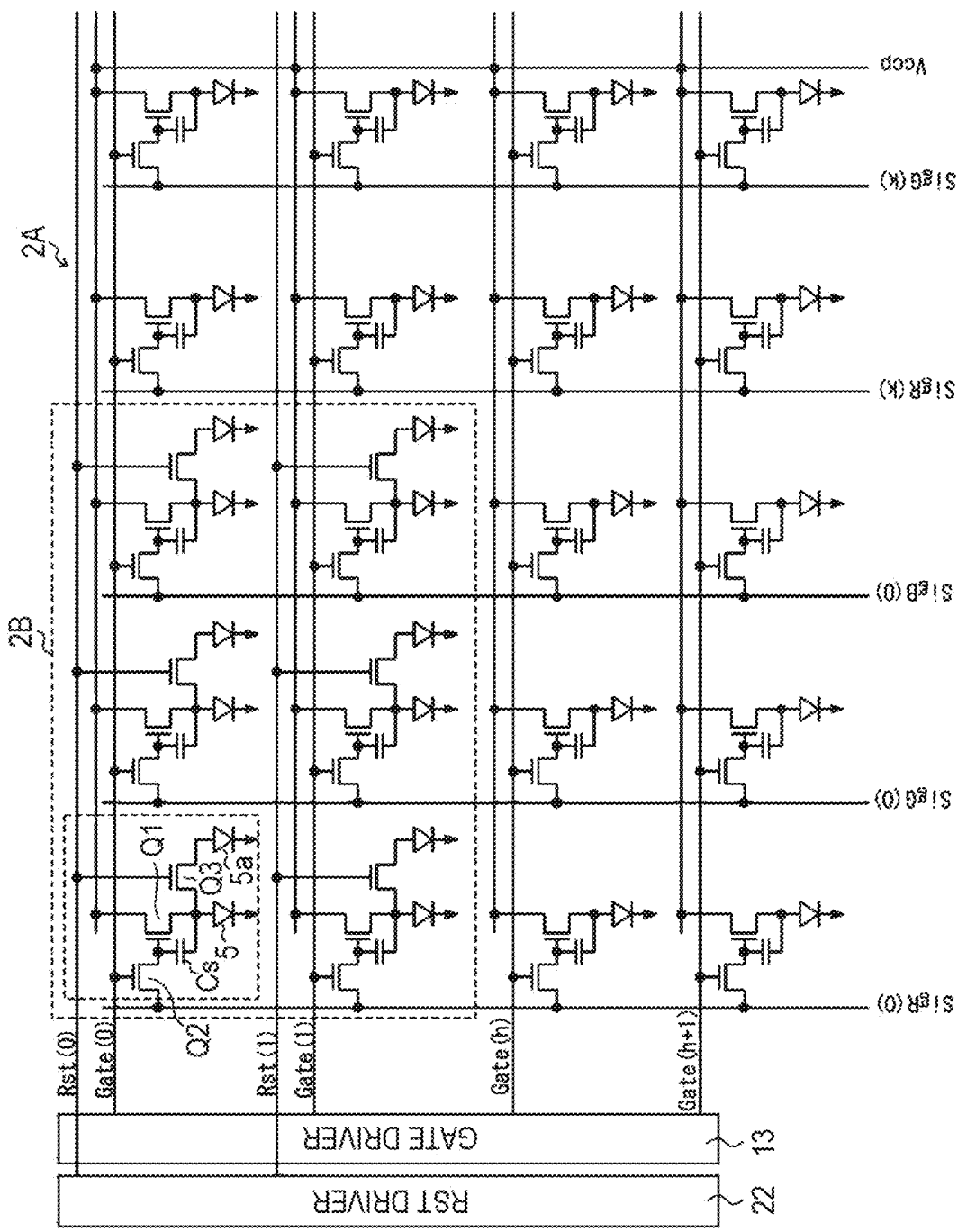
FIG. 26 is a circuit diagram illustrating a third modification of the pixel array unit according to the present embodiment.

FIG. 26 is a circuit diagram illustrating a third modification of the pixel array unit 12 according to the present embodiment. In the pixel array unit 12 of FIG. 26, a region surrounded by a broken line frame is the pixel region 2B in which the sensor is arranged immediately below, and the other region is the pixel region 2A. In each pixel (color pixel) in the pixel region 2B, a pixel circuit 8 having a circuit configuration similar to that in FIG. 14B is provided. Each pixel circuit 8 includes a switch transistor Q3 that switches whether or not to short-circuit the anode electrodes of the two OLEDs 5 and 5*a*. A common reset signal RST is provided for each pixel group in each row arranged in the lateral (horizontal) direction in the pixel region 2B, and all the switch transistors Q3 included in the pixel group in each row are turned on or off at the same timing. The pixel circuit 8 is provided with a reset driver (RST driver) 22 that individually controls the timing at which the reset signal RST in each row is set to high for each row.

In the pixel array unit 12 of FIG. 26, whether or not to cause the light emitting region 2B2 of each pixel to emit light can be switched at an arbitrary timing for each row in the pixel region 2B.

Figure 27:
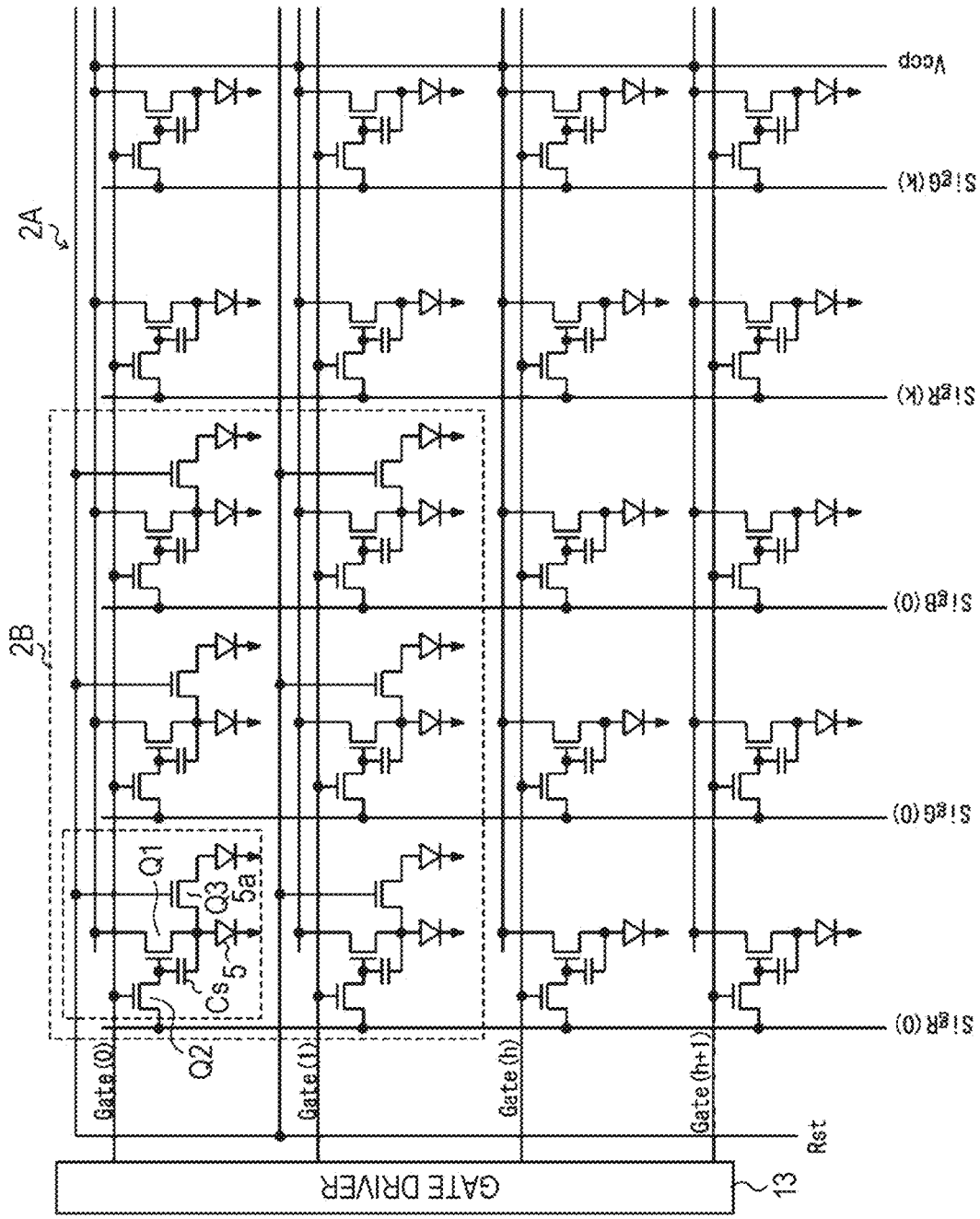
FIG. 27 is a circuit diagram illustrating a fourth modification of the pixel array unit according to the present embodiment.

FIG. 27 is a circuit diagram illustrating a fourth modification of the pixel array unit 12 according to the present embodiment. In the pixel array unit 12 of FIG. 27, a region surrounded by a broken line frame is the pixel region 2B in which the sensor is arranged immediately below, and the other region is the pixel region 2A. The pixel array unit 12 in FIG. 27 is common to that in FIG. 26 in that the pixel circuit 8 having a circuit configuration similar to that in FIG. 14B is provided in the pixel region 2B, but is different from that in FIG. 26 in that all the reset signals RST input to the gates of the switch transistors Q3 in the respective pixel circuits 8 are connected in common.

The pixel circuit 8 in FIG. 27 cannot switch whether or not to cause the light emitting region 2B2 to emit light for each row in the pixel region 2B, but can switch whether or not to cause the light emitting region 2B2 of all the pixels in the pixel region 2B to emit light at an arbitrary timing. In the pixel array unit 12 of FIG. 27, the reset driver 22 of FIG. 26 is unnecessary, and the circuit configuration can be simplified as compared with FIG. 26.

Figure 28:
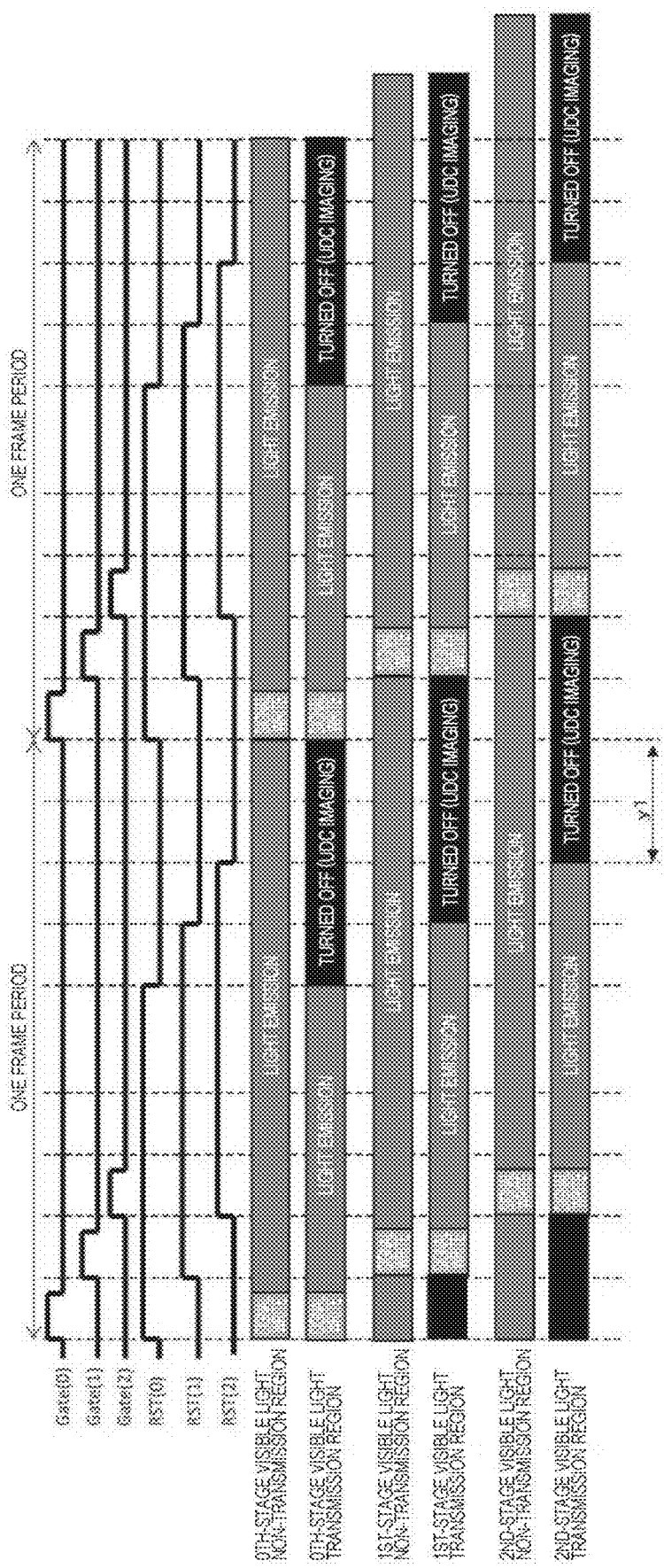
FIG. 28 is a drive timing diagram of a pixel region having a pixel circuit of FIG. 26.

FIG. 28 is a drive timing diagram of the pixel region 2B including the pixel circuit 8 of FIG. 26. FIG. 28 illustrates an example in which pixel groups of three rows connected to the three scanning lines Gates 0 to 2 exist in the pixel region 2B. Furthermore, FIG. 28 illustrates an example in which the three reset signals RSTs 0 to 2 provided for each row sequentially change from a high potential to a low potential with time being shifted. The light emitting region 2B1 of each pixel in each row always emits light except for a period in which the signal line voltage is written. On the other hand, the light emitting region 2B2 of each pixel in each row emits light only during a period in which the reset signal RST is at a high potential, and is turned off during a period at a low potential. Therefore, a period during which the pixel group in the pixel region 2B is turned off is shifted for each row. The sensor located immediately below the pixel region 2B can be driven only during a period in which all the pixel groups in each row are turned off. In FIG. 28, a period during which all the pixels of three rows are turned off is indicated by an arrow line y1. The arrow line y1 is an operation period of the sensor. As can be seen from the length of the arrow line y1, in a case where the timing at which the light emitting region 2B2 is turned off is shifted for each row in the pixel region 2B, the operation period of the sensor is shortened.

Figure 29:
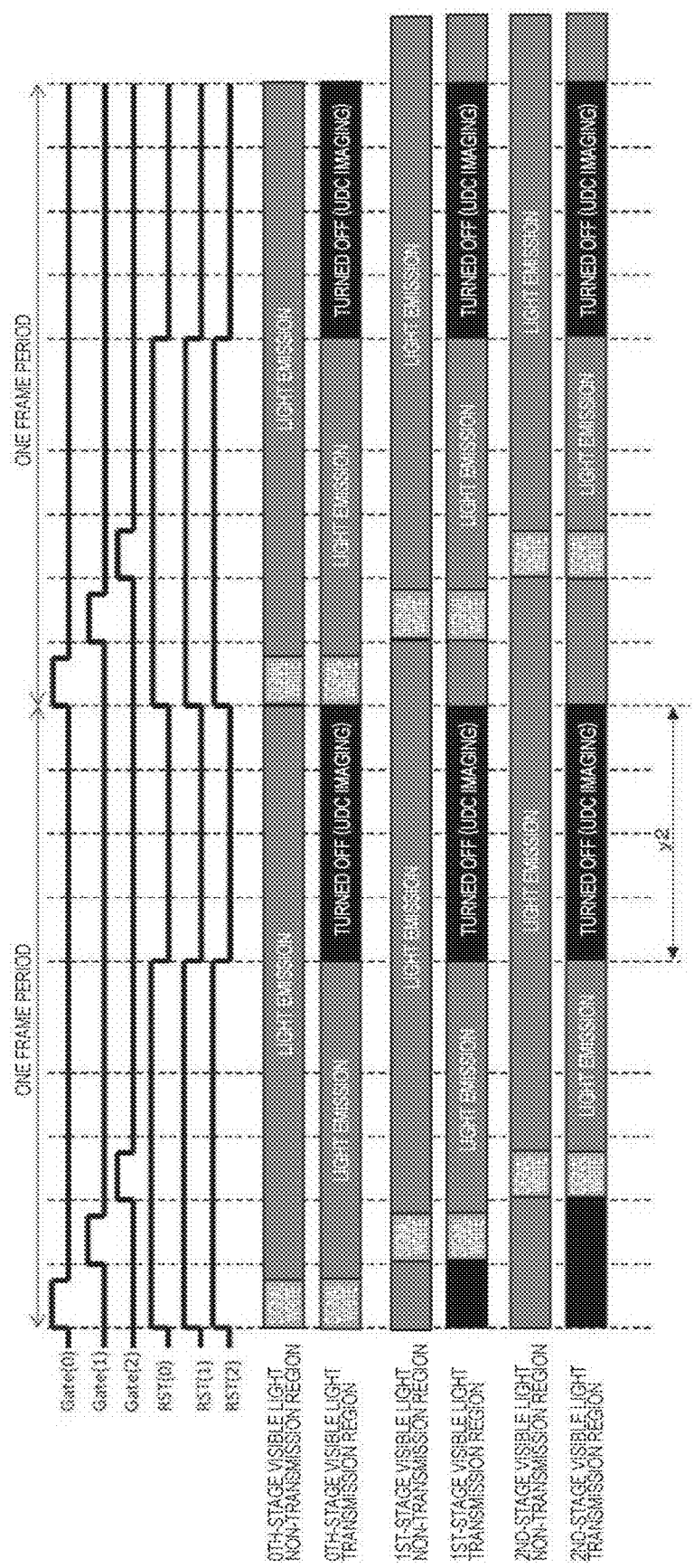
FIG. 29 is a drive timing diagram of a pixel region having a pixel circuit of FIG. 27.

FIG. 29 is a drive timing diagram of the pixel region 2B including the pixel circuit 8 of FIG. 27. In the pixel circuit 8 of FIG. 27, since the three reset signals RST corresponding to the pixel groups of three rows in the pixel region 2B change at the same timing, the timing at which the light emitting region 2B2 of each pixel in each row is turned off becomes the same. Therefore, the period in which the sensor can be operated is a period in which the light emitting region 2B2 of each pixel in each row is turned off, and the operation period of the sensor can be made longer than that in FIG. 28.

Figure 30:
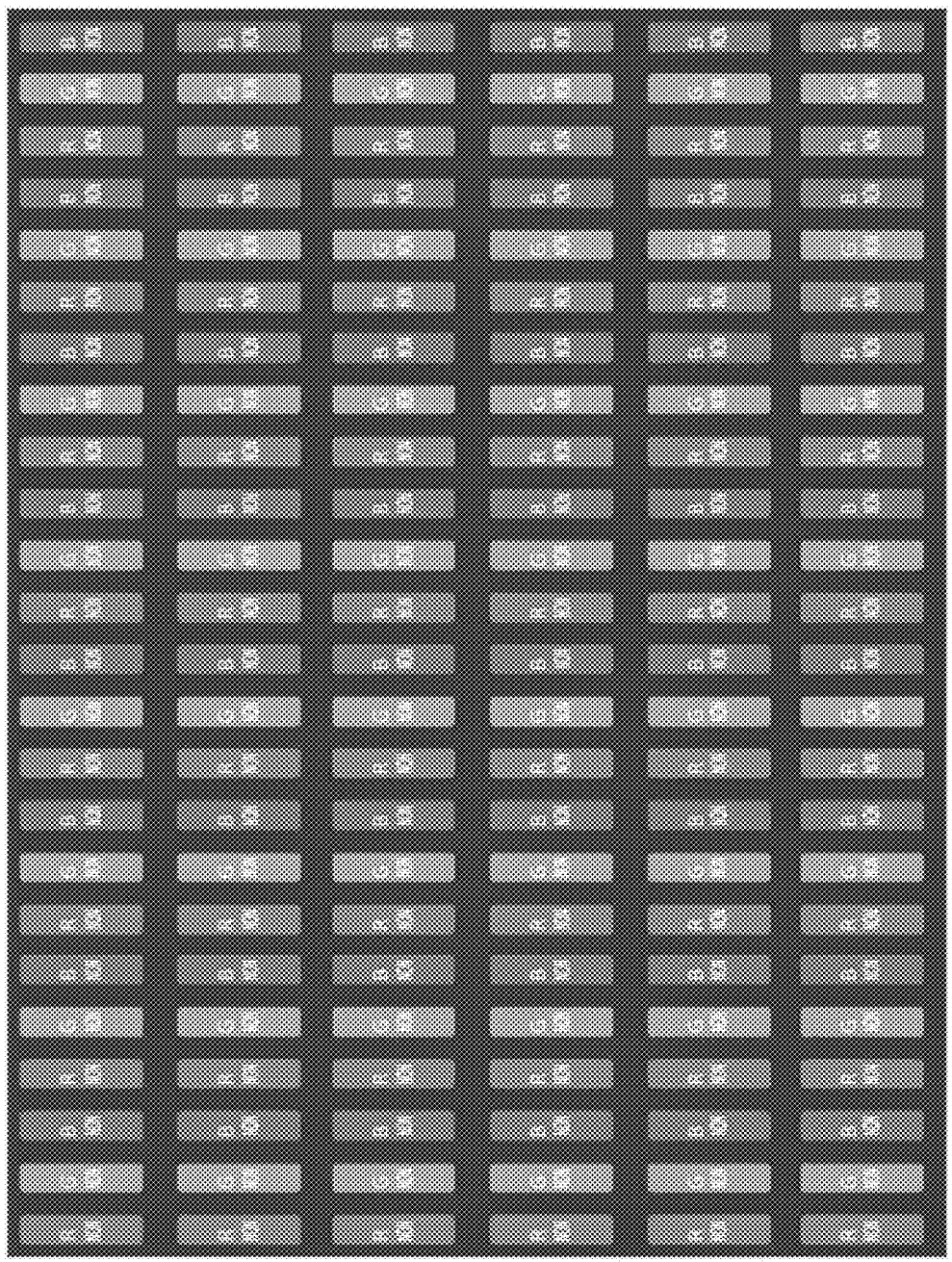
FIG. 30 is a view illustrating a basic pixel arrangement of a general image display device.

FIG. 30 is a view illustrating a basic pixel arrangement of a general image display device 1. As illustrated, each pixel has three color pixels of red, green, and blue, and these color pixels are sequentially arranged vertically and horizontally.

Figure 31:
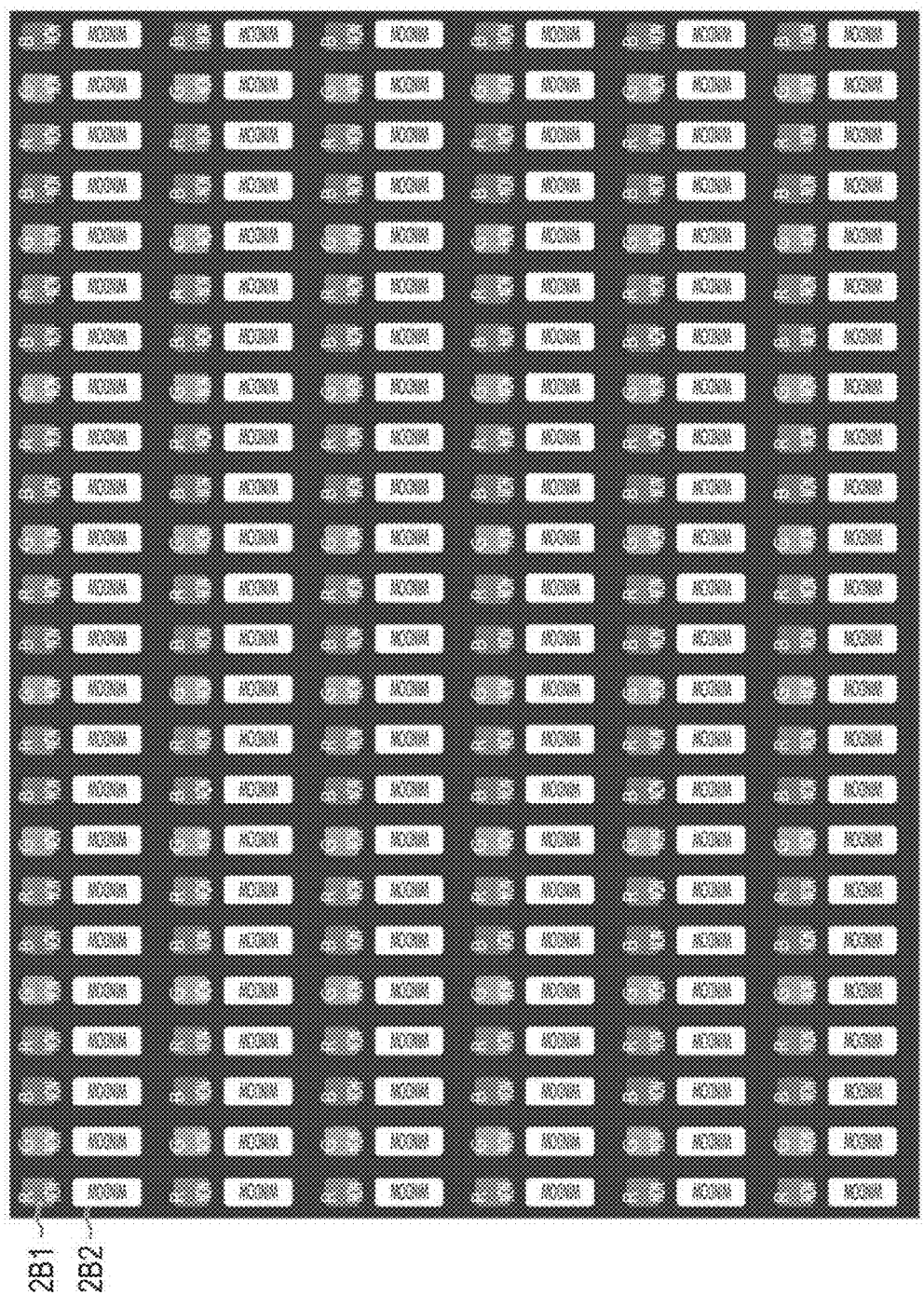
FIG. 31 is a view illustrating an example in which all pixels of the image display device partially have a visible light transmission region.

FIG. 31 is a diagram illustrating an example in which all the pixels of the image display device 1 partially include the non-light emitting region 2B2, and illustrates a pixel arrangement of a so-called transparent display. Each pixel includes three color pixels, and each color pixel has a light emitting region 2B1 and a non-light emitting region 2B2. The light emitting region 2B1 of each color pixel always emits light of a corresponding color during the display period of each frame. On the other hand, the non-light emitting region 2B2 of each color pixel can transmit incident light but does not emit light. In FIG. 31, the light emitting region 2B1 is denoted as "non", and the non-light emitting region 2B2 is denoted as "window".

In the image display device 1 of FIG. 31, since all the pixels on the display panel 2 have the light emitting region 2B1 and the non-light emitting region 2B2, even if the sensor is arranged immediately below any pixel region of the display panel 2, light can be incident or emitted through the non-light emitting region 2B2, and reliability of sensing by the sensor can be improved. However, since all the pixels have the non-light emitting region 2B2, the overall luminance of the display panel 2 decreases. In order to obtain the luminance equivalent to that of the normal display panel 2 having no non-light emitting region 2B2, it is necessary to increase the light-emitting luminance of the OLED 5 of each pixel, and the lifetime of the OLED 5 is shortened.

Figure 32:
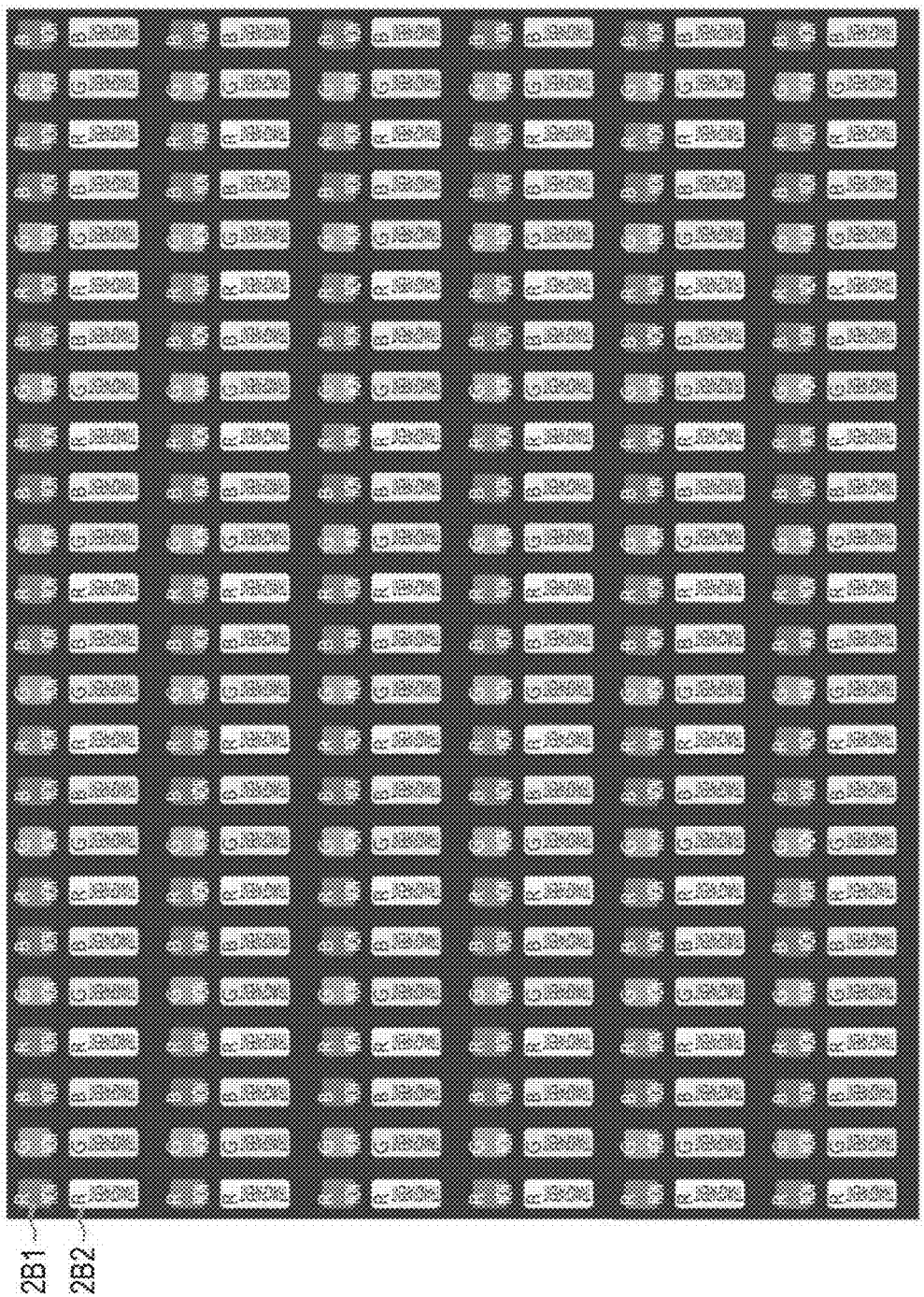
FIG. 32 is a view illustrating an example in which both the visible light transmission region and a visible light non-transmission region emit light.

FIG. 32 is a diagram illustrating an example in which all pixels of the image display device 1 have a light emitting region 2B2 and a light emitting region 2B1, and both the regions 2B1 and 2B2 emit light. In this case, as illustrated in FIG. 10B, it is necessary to arrange two OLEDs 5 and two OLEDs 5a in each of all pixels (all color pixels). In FIG. 32, the light emitting region 2B1 is denoted as "non", and the light emitting region 2B2 is denoted as "translucent".

Since the light-emitting luminance of light emitting region 2B1 in FIG. 32 decreases as described with reference to FIG. 9 and the like, the overall luminance of display panel 2 does not decrease as much as that in FIG. 31, but becomes lower than that of normal display panel 2. In order to set the luminance to the same level as that of the normal display panel 2, it is necessary to increase the light-emitting luminance of the OLED 5a, and the lifetime of the OLED 5a is shortened.

Figure 33:
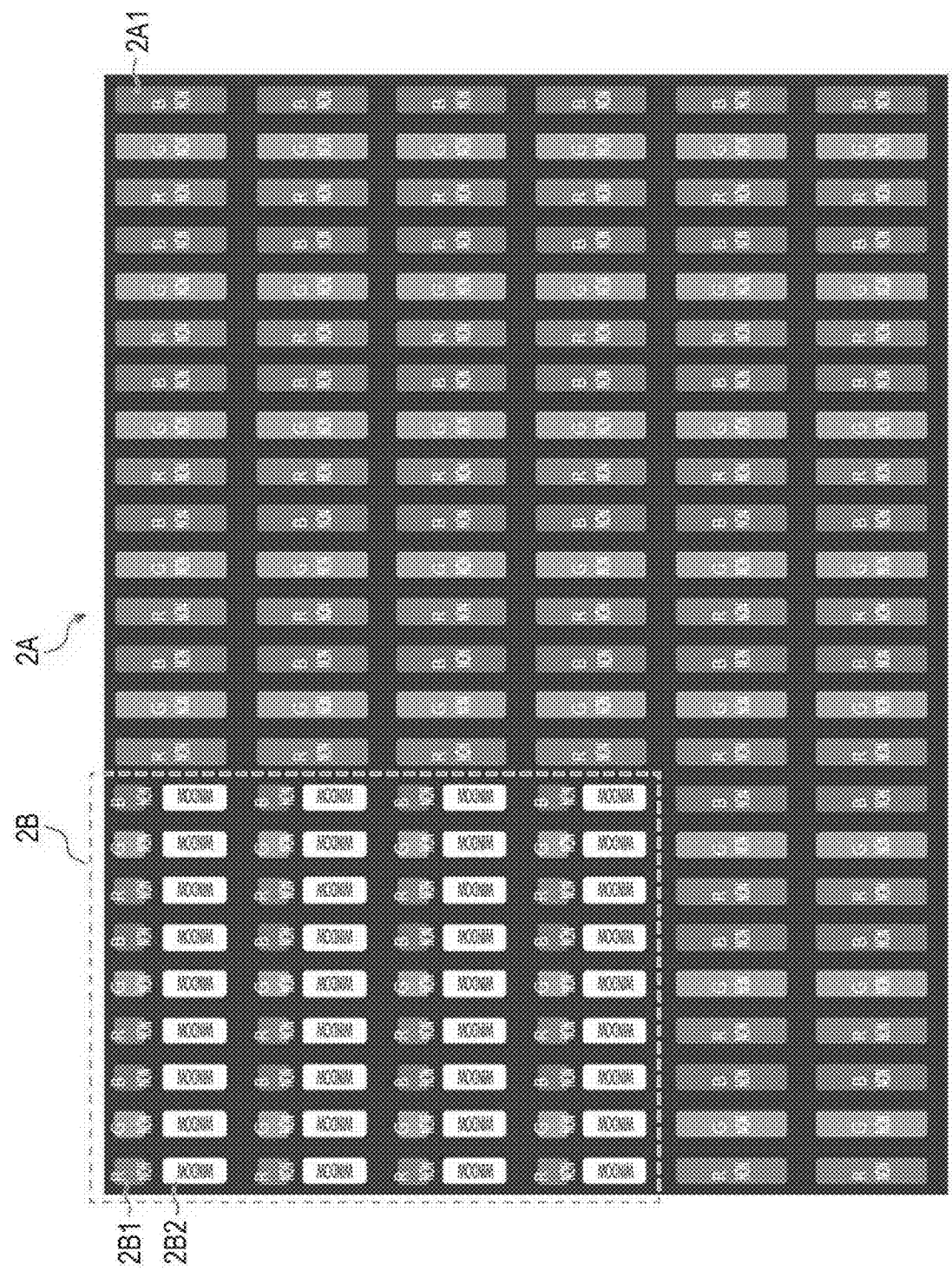
FIG. 33 is a diagram illustrating a first example of pixel arrangement of the image display device according to the present embodiment.

FIG. 33 is a diagram illustrating a first example of pixel arrangement of the image display device 1 according to the present embodiment. A broken line frame in FIG. 33 is the pixel region 2B in which the sensor is arranged immediately below, and the other region is the pixel region 2A in which the sensor is not arranged immediately below. In the pixel region 2B, as in FIG. 31, each pixel (color pixel) has a light emitting region 2B1 and a non-light emitting region 2B2, and the light emitting region 2B1 emits light but the non-light emitting region 2B2 does not emit light. Since the non-light emitting region 2B2 always transmits light, the sensor immediately below the pixel region 2B can perform sensing at an arbitrary timing by receiving light via the non-light emitting region 2B2. It is sufficient that the pixel circuit 8 of each pixel (color pixel) has a circuit configuration as illustrated in FIG. 10A, for example, and the number of OLEDs 5 is one.

Figure 34:
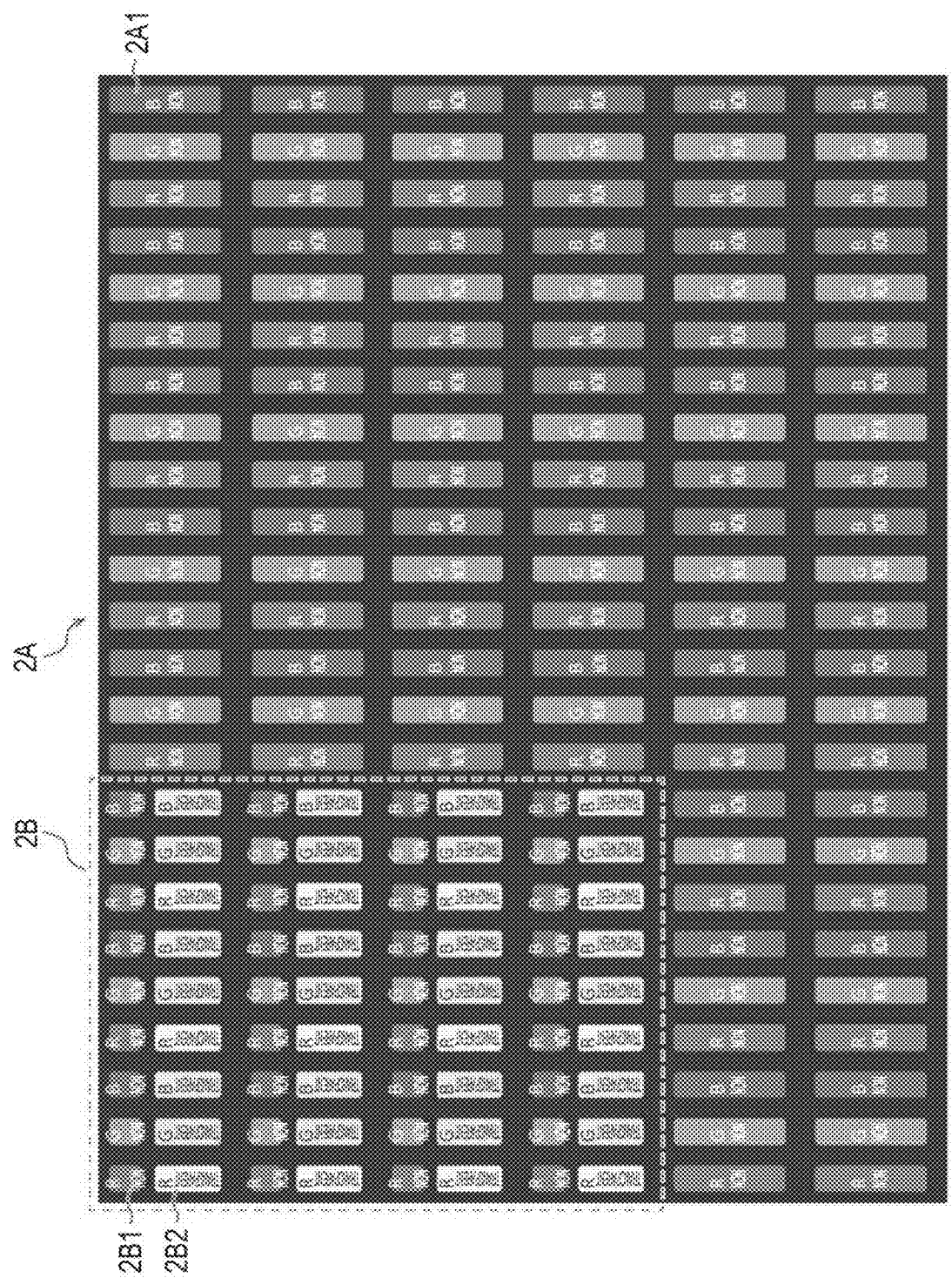
FIG. 34 is a diagram illustrating a second example of pixel arrangement of the image display device according to the present embodiment.

FIG. 34 is a diagram illustrating a second example of the pixel arrangement of the image display device 1 according to the present embodiment. A broken line frame in FIG. 34 is the pixel region 2B in which the sensor is arranged immediately below, and the other region is the pixel region 2A in which the sensor is not arranged immediately below. In the pixel region 2B, as in FIG. 32, each pixel (color pixel) has a light emitting region 2B1 and a light emitting region 2B2, and both the light emitting region 2B1 and the light emitting region 2B2 can emit light. The light emitting region 2B1 always emits light during a display period of the display panel 2, whereas the light emitting region 2B2 emits light only during a period in which the sensor is not operated, and is turned off during an operation period of the sensor. The pixel circuit 8 of each pixel (color pixel) has a circuit configuration as illustrated in FIG. 12A, for example.

Figure 35:
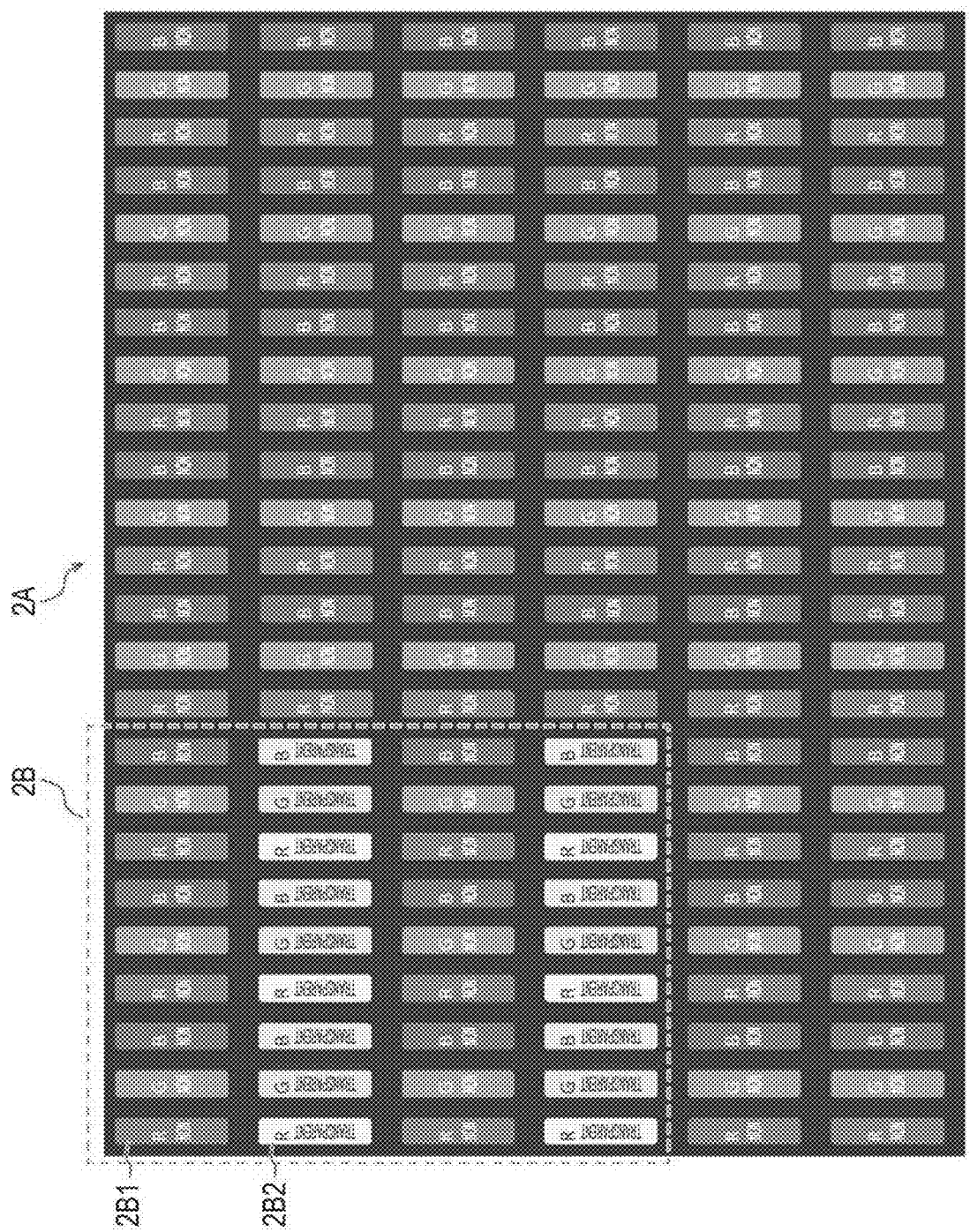
FIG. 35 is a diagram illustrating a third example of pixel arrangement of the image display device according to the present embodiment.

FIG. 35 is a diagram illustrating a third example of the pixel arrangement of the image display device 1 according to the present embodiment. A broken-line frame in FIG. 35 is the pixel region 2B in which the sensor is arranged immediately below, and the other region is the pixel region 2A in which the sensor is not arranged immediately below. In the pixel region 2B in FIGS. 33 and 34 described above, all the color pixels in the pixel region 2B have the light emitting region 2B1 and the non-light emitting region 2B2, whereas in the pixel region 2B in FIG. 35, among the pixels arranged in the vertical (vertical) direction, the pixels in the odd-numbered rows have only the light emitting region 2B1, and the pixels in the even-numbered rows have only the non-light emitting region 2B2. Both the light emitting region 2B1 of the odd-numbered row and the non-light emitting region 2B2 of the even-numbered row emit light from the OLED 5. The pixel circuit 8 of each color pixel in FIG. 35 only needs to have one OLED 5, and the circuit configuration can be simplified as compared with the pixel circuit 8 of the image display device 1 in FIG. 34. However, since the pixel circuit 8 of each pixel (color pixel) in the even-numbered row needs to stop light emission in the non-light emitting region 2B2 when the sensor is operated, the switch transistor Q3 or the like for stopping light emission is required.

Note that, in FIG. 35, the pixels in the odd-numbered rows have the light emitting region 2B1, and the pixels in the even-numbered rows have the non-light emitting region 2B2, but may be reversed. That is, the pixels in the odd-numbered rows may have the non-light emitting region 2B2, and the pixels in the even-numbered rows may have the light emitting region 2B1. In addition, whether each pixel has the light emitting region 2B1 or the non-light emitting region 2B2 may be switched in units of a plurality of pixel rows.

Figure 36:
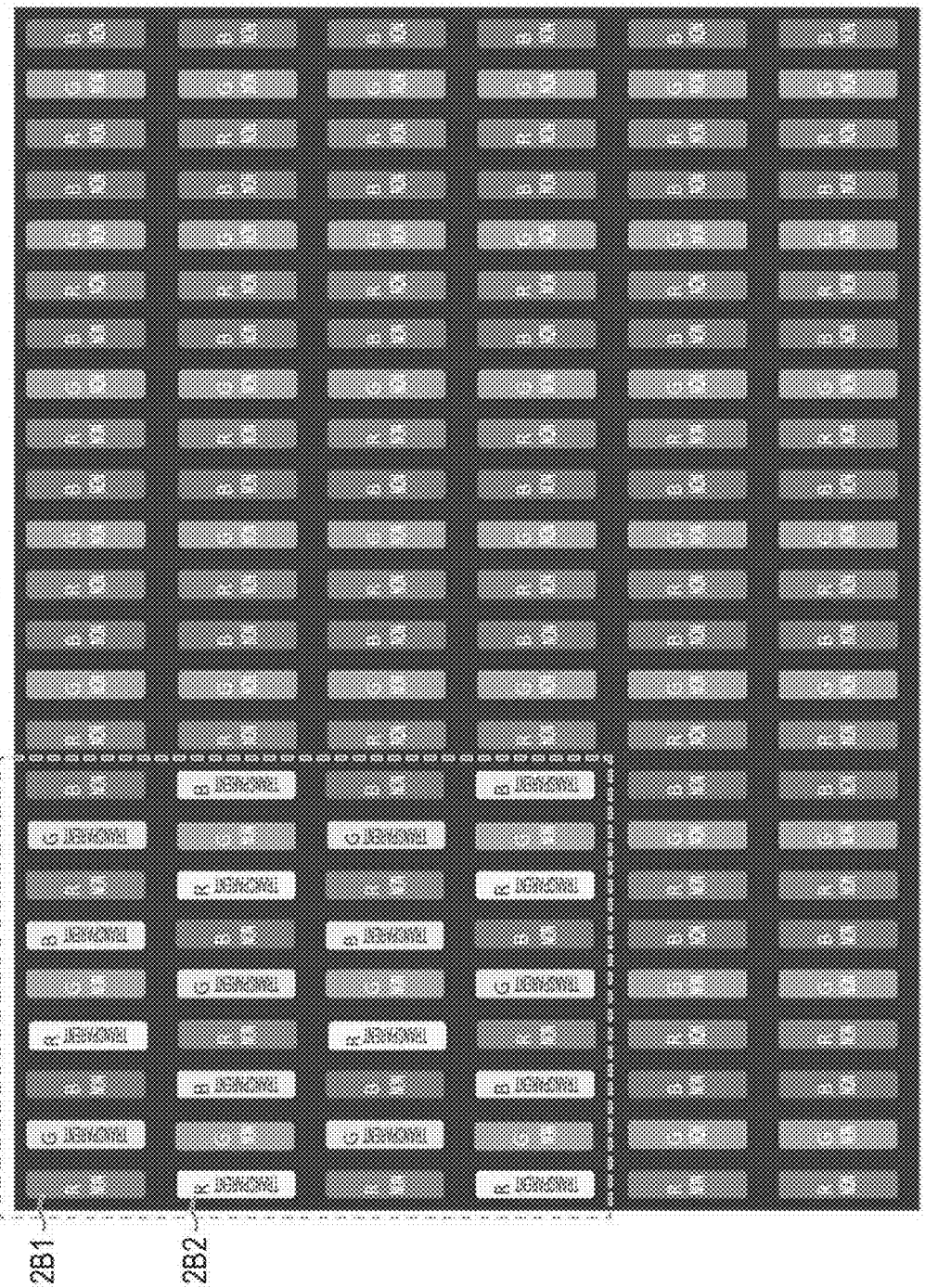
FIG. 36 is a diagram illustrating a fourth example of pixel arrangement of the image display device according to the present embodiment.

FIG. 36 is a diagram illustrating a fourth example of the pixel arrangement of the image display device 1 according to the present embodiment. A broken line frame in FIG. 36 is the pixel region 2B in which the sensor is arranged immediately below, and the other region is the pixel region 2A in which the sensor is not arranged immediately below. FIG. 36 is common to FIG. 35 in that each color pixel in the pixel region 2B includes only one of the light emitting region 2B1 and the possible light emitting region 2B2. However, in FIG. 36, among the plurality of color pixels included in the plurality of pixels in the pixel region 2B, the color pixels having the light emitting region 2B2 are arranged in a staggered manner, and similarly, the color pixels having the light emitting region 2B1 are also arranged in a staggered manner. As described above, the light-emitting luminance of the light emitting region 2B2 is lower than the light-emitting luminance of the light emitting region 2B1. However, by uniformly dispersing the color pixels having the light emitting region 2B2 in the pixel region 2B, a decrease in luminance and a variation in luminance are less conspicuous.

Figure 37:
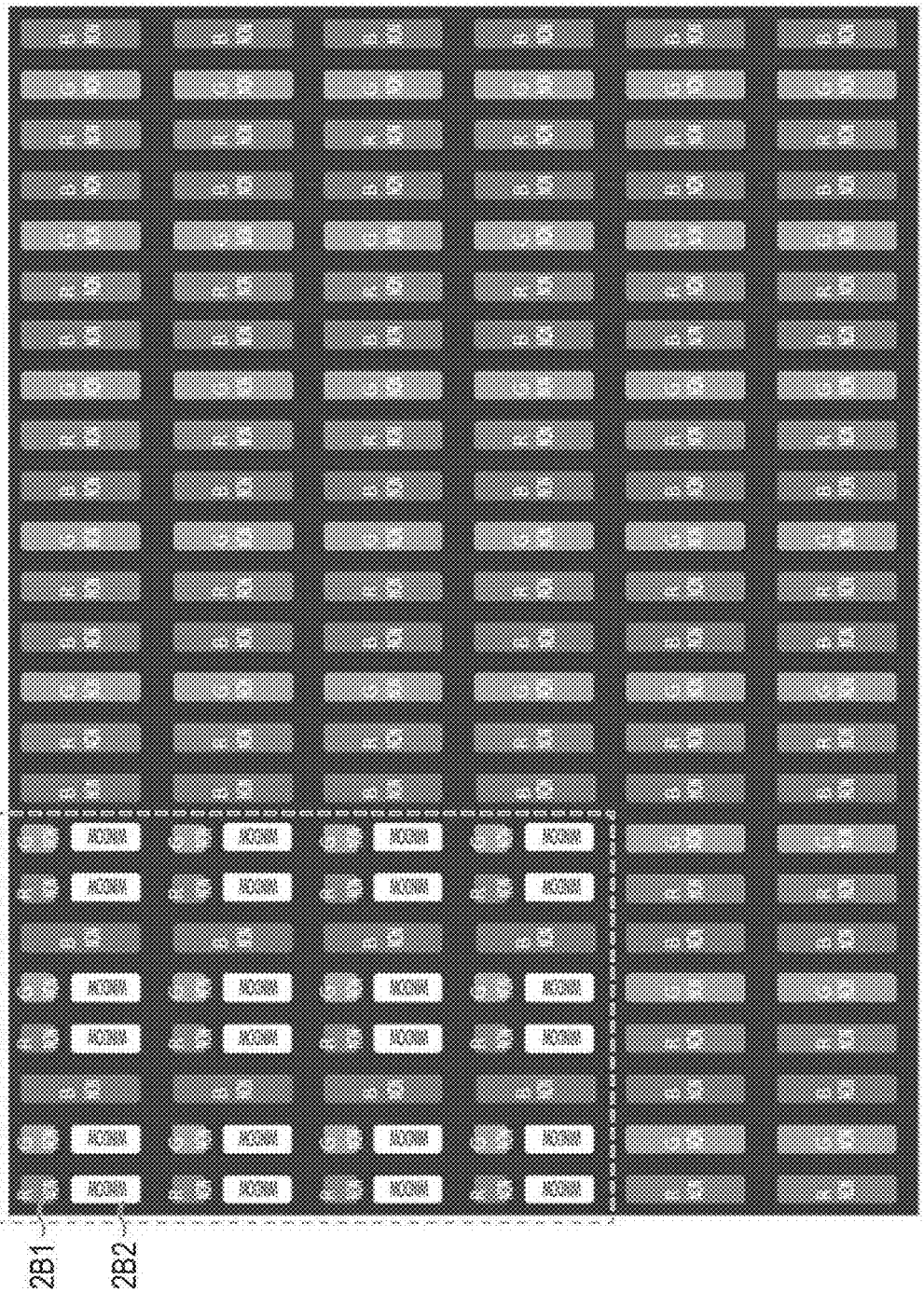
FIG. 37 is a diagram illustrating a fifth example of pixel arrangement of the image display device according to the present embodiment.

FIG. 37 is a diagram illustrating a fifth example of the pixel arrangement of the image display device 1 according to the present embodiment. A broken line frame in FIG. 37 is the pixel region 2B in which the sensor is arranged immediately below, and the other region is the pixel region 2A in which the sensor is not arranged immediately below. FIG. 37 is a modification of FIG. 33, and the non-light emitting region 2B2 is not provided for some color pixels (for example, a blue pixel having a particularly short light emission lifetime). Therefore, the blue pixel includes only the light emitting region 2B1, and always emits light during the display period of the display panel 2. In this manner, it is not necessary that all the color pixels in the pixel include the non-light emitting region 2B2, and only some of the color pixels may include the non-light emitting region 2B2.

Figure 38:
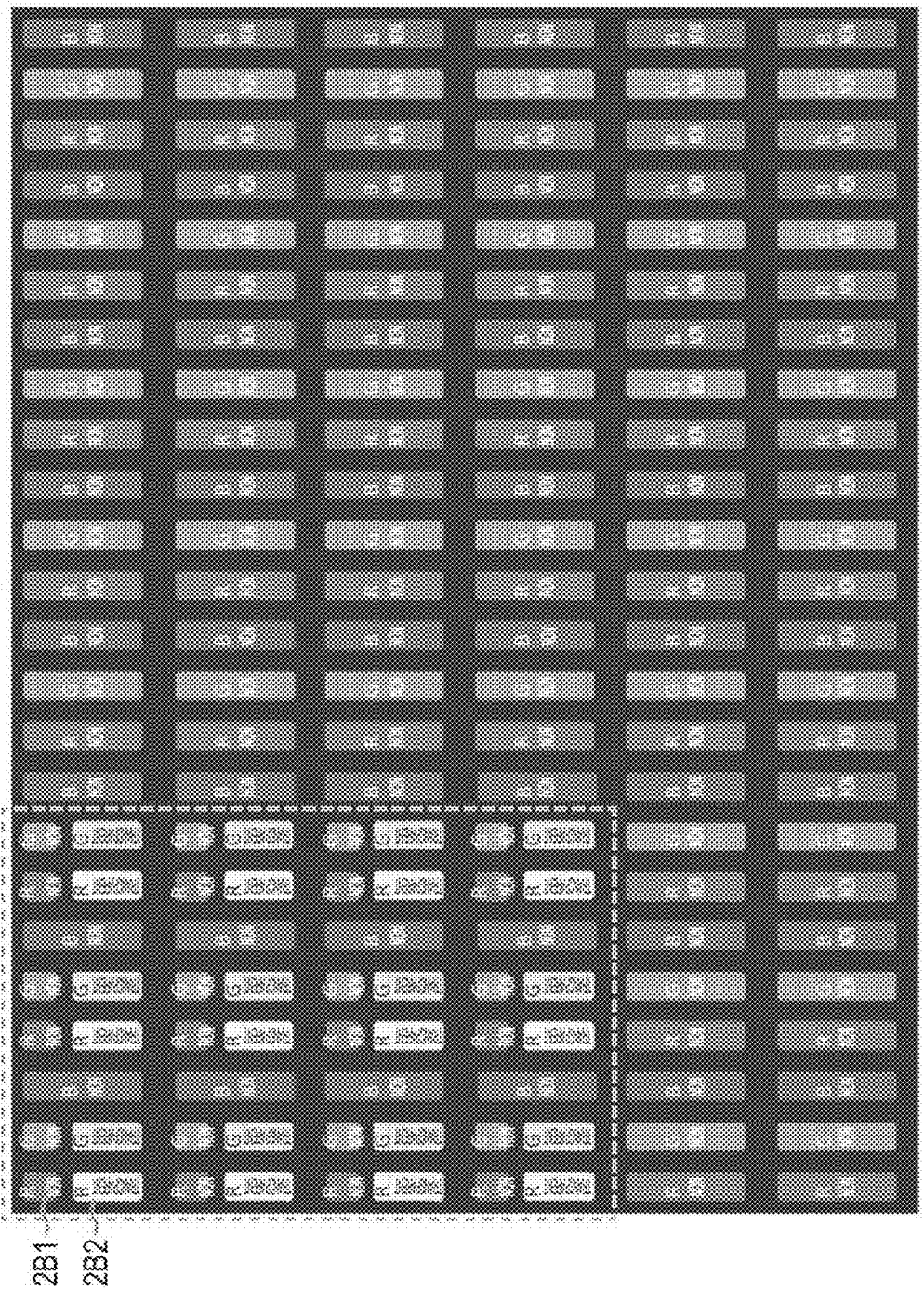
FIG. 38 is a diagram illustrating a sixth example of pixel arrangement of the image display device according to the present embodiment.

FIG. 38 is a diagram illustrating a sixth example of the pixel arrangement of the image display device 1 according to the present embodiment. A broken line frame in FIG. 38 is the pixel region 2B in which the sensor is arranged immediately below, and the other region is the pixel region 2A in which the sensor is not arranged immediately below. FIG. 38 is a modification of FIGS. 34 and 37, and the non-light emitting region 2B2 of FIG. 37 can emit light. More specifically, the light emitting region 2B2 is caused to emit light during a period in which the sensor is not operated, and the light emitting region 2B2 is caused not to emit light during an operation period of the sensor. By not providing the light emitting region 2B2 for some color pixels (for example, blue pixels), the life of the pixels can be extended.

Figure 39:
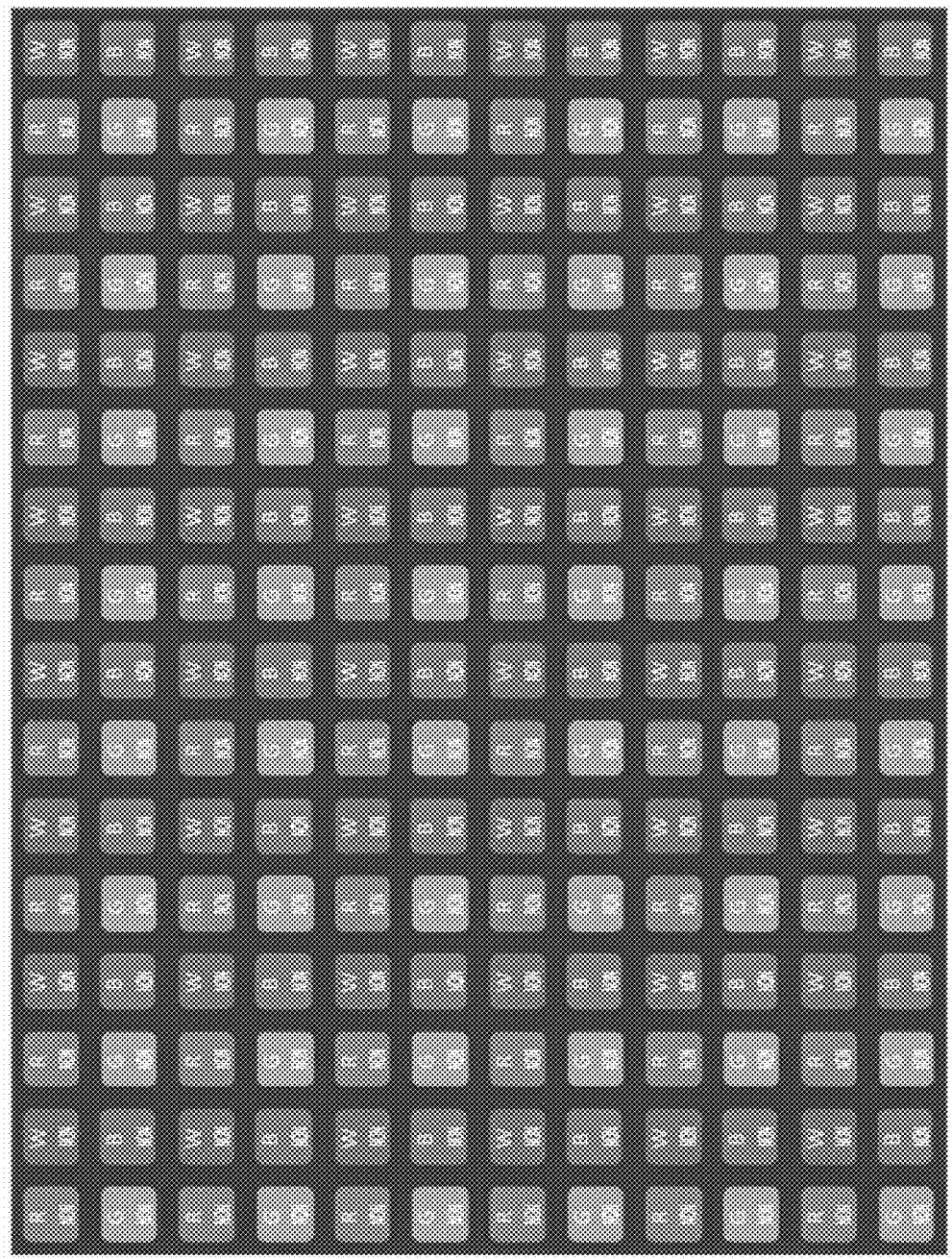
FIG. 39 is a view illustrating pixel arrangement of an image display device 1 in which each pixel has four color pixels of red, green, blue, and white.

FIG. 39 is a view illustrating pixel arrangement of an image display device 1 in which each pixel has four color pixels of red, green, blue, and white. The arrangement order and area of these four color pixels are arbitrary, and FIG. 39 is merely an example. Note that color pixels other than white may be provided.

Figure 40:
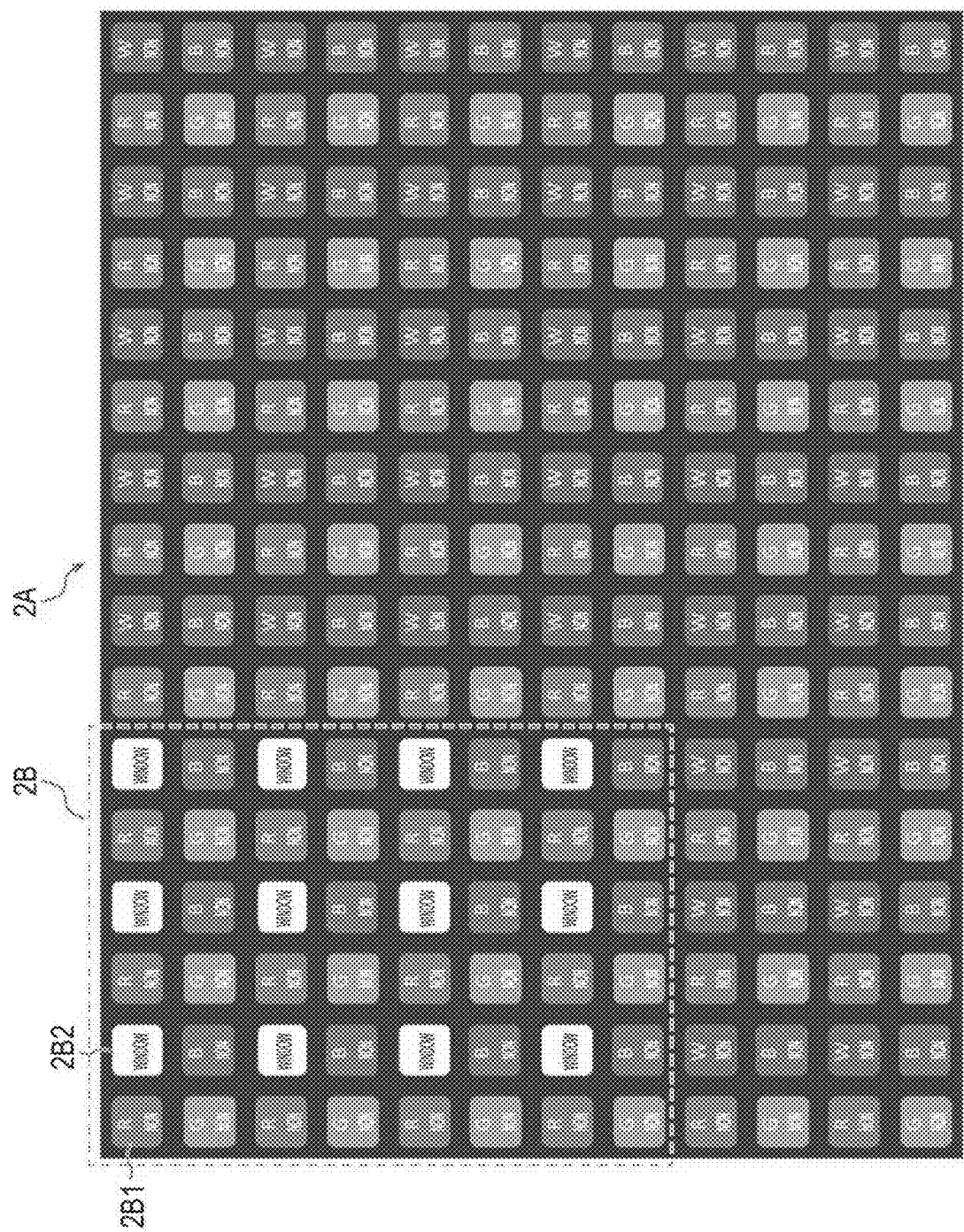
FIG. 40 is a diagram illustrating a seventh example of pixel arrangement of the image display device according to the present embodiment.

FIG. 40 is a diagram illustrating a seventh example of the pixel arrangement of the image display device 1 according to the present embodiment. A broken line frame in FIG. 40 is the pixel region 2B in which the sensor is arranged immediately below, and the other region is the pixel region 2A in which the sensor is not arranged immediately below. In the image display device 1 of FIG. 40, each pixel has four color pixels, similarly to FIG. 39. Among the four color pixels, the white pixel is the non-light emitting region 2B2. The non-light emitting region 2B2 does not emit light of the OLED 5, but can always transmit light. The image display device 1 in FIG. 40 can be easily manufactured by omitting a pixel circuit 8 in the white pixel region from the display panel 2 in which four color pixels constitute one pixel. The white pixel is originally provided to improve the luminance of the pixel, and when the white pixel is set to the non-light emitting region 2B2, the display panel 2 is slightly dark, but the color tone of the pixel is not greatly affected. Therefore, when the white pixel is set to the non-light emitting region 2B2, the degradation in image quality of the display panel 2 can be suppressed.

Figure 41:
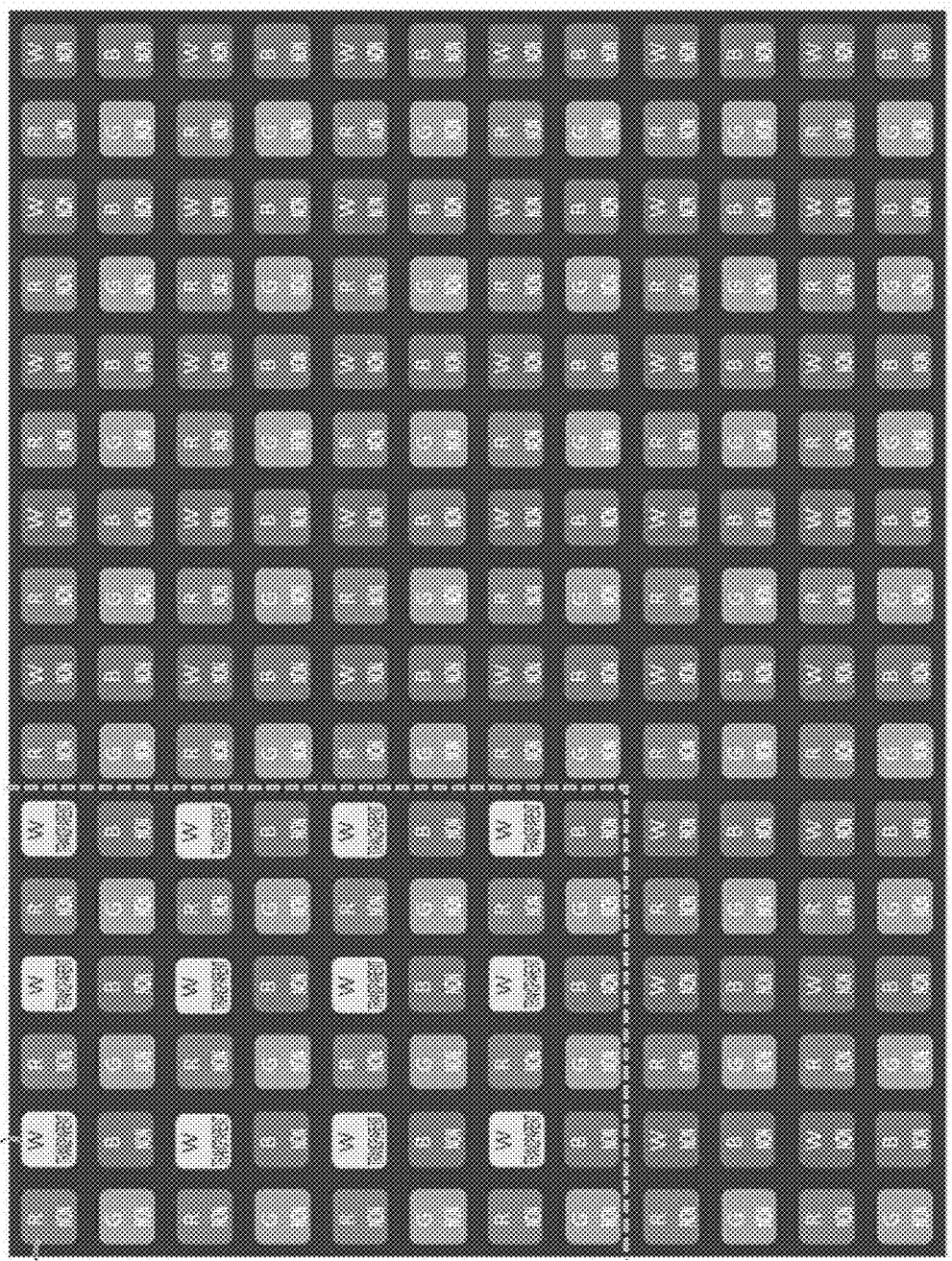
FIG. 41 is a diagram illustrating an eighth example of the image display device according to the present embodiment.

FIG. 41 is a diagram illustrating an eighth example of the image display device 1 according to the present embodiment. A broken line frame in FIG. 40 is the pixel region 2B in which the sensor is arranged immediately below, and the other region is the pixel region 2A in which the sensor is not arranged immediately below. The image display device 1 of FIG. 41 is common to that of FIG. 40 in that the white pixel of each pixel is set to the light emitting region 2B2, but is different from that of FIG. 40 in that the light emitting region 2B2 is caused to emit light of the OLED 5. The white pixel emits light when the sensor is not operated, and is turned off when the sensor is operated. With this arrangement, the luminance of the pixel region 2B of the display panel 2 can be improved as compared with FIG. 40.

Figure 42:
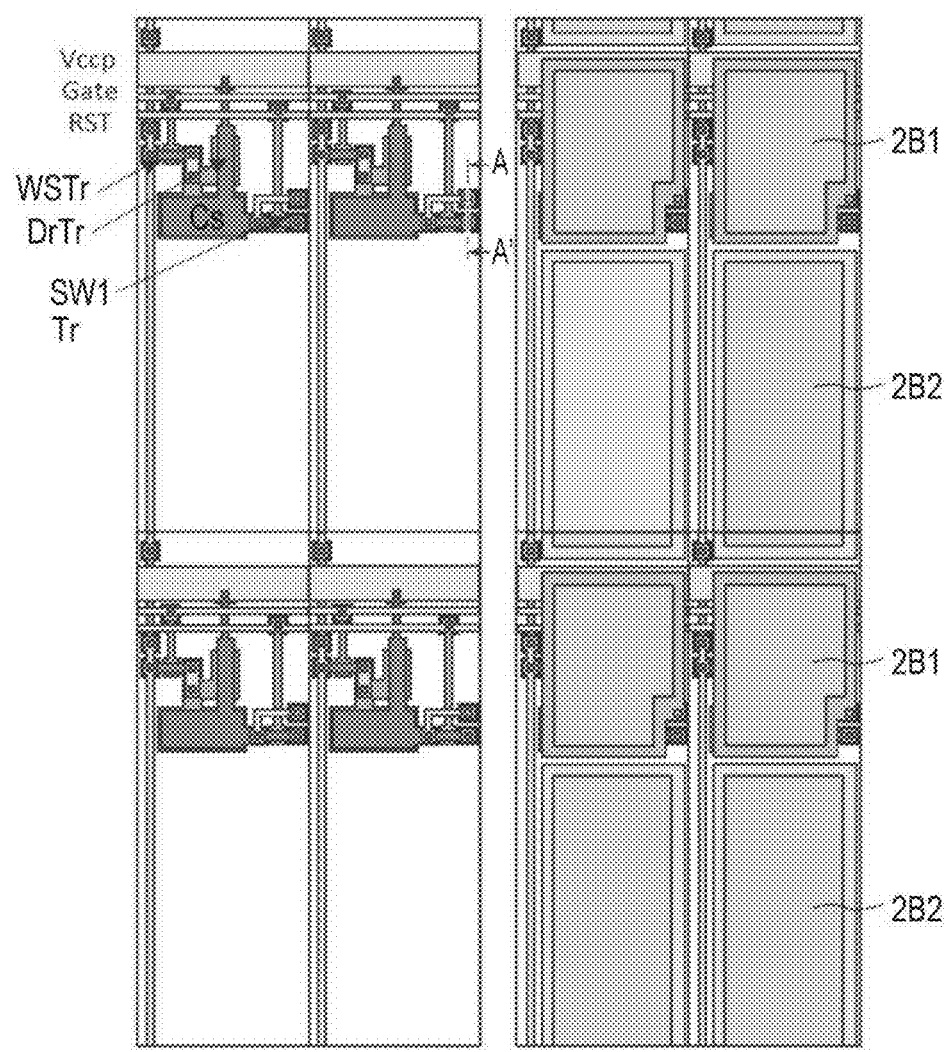
FIG. 42 is a plan view of a plurality of color pixels in a pixel region 2B illustrated in FIG. 33.

Next, the structure of the pixel array unit 12 of the image display device 1 according to the present embodiment will be described in more detail. FIG. 42 is a plan view of a plurality of color pixels in a pixel region 2B illustrated in FIG. 33. FIG. 42 illustrates a planar layout of a total of four color pixels including two color pixels horizontally and two color pixels vertically. Each color pixel has a light emitting region 2B1 and a non-light emitting region 2B2 arranged adjacent to each other in the vertical direction. The pixel circuit 8 of each color pixel has, for example, a circuit configuration illustrated in FIG. 10A. The light from the OLED 5 is emitted from the light emitting region 2B1. A planar layout diagram PV1 on the left side of FIG. 42 illustrates a layout arrangement of each circuit element of the pixel circuit 8, and a planar layout diagram PV2 on the right side of FIG. 42 illustrates a positional relationship between the light emitting region 2B1 and the non-light emitting region 282. The planar layout diagrams PV1 and PV2 on the left and right sides of FIG. 43 illustrate the same pixel region.

As illustrated on the left side of FIG. 42, each circuit element in the pixel circuit 8 illustrated in FIG. 10A is arranged inside the light emitting region 2B1. For example, the power supply line Vccp, the scanning line Gate, and the reset signal line RST pass through the upper end side of the light emitting region 2B1 and are arranged substantially in parallel in the lateral (horizontal) direction. The electrode of the pixel capacitance Cs having a relatively large circuit area is arranged on the lower end side of the light emitting region 2B1. The OLED 5 and the switch transistor Q3 are arranged at the lower right corner of the light emitting region 2B1. Note that the arrangement of each circuit element in FIG. 10A is an example, and various arrangement changes can be made.

Figure 43:
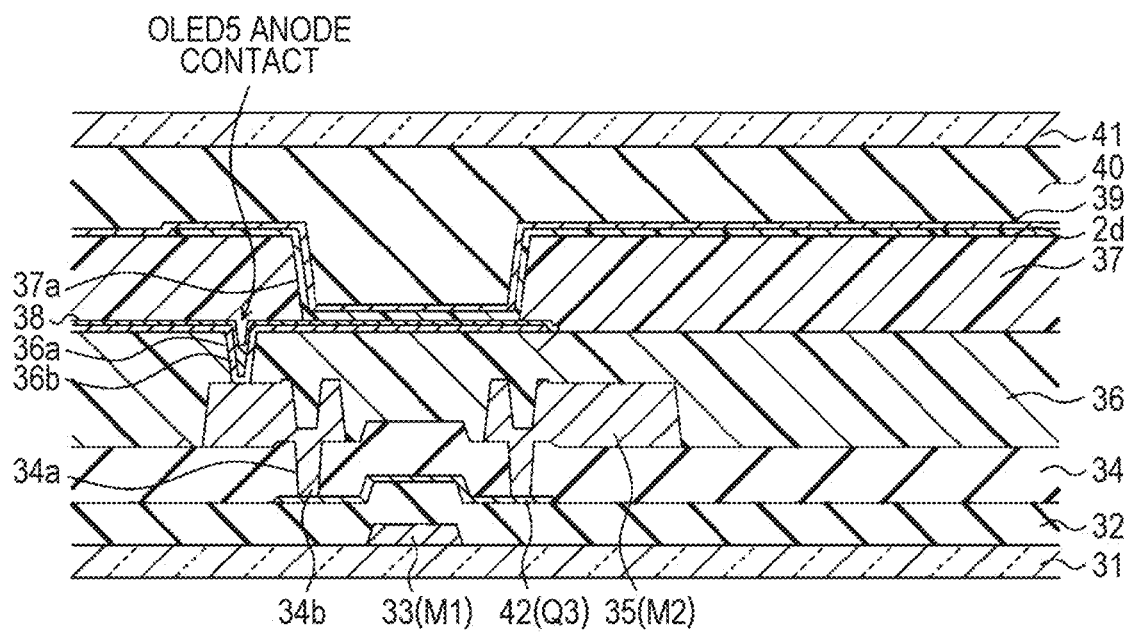
FIG. 43 is a cross-sectional view taken along line A-A' of FIG. 42.

FIG. 43 is a cross-sectional view taken along line A-A' of FIG. 42. The cross-sectional view of FIG. 43 illustrates a laminated structure in the pixel region 2B of the image display device 1. FIG. 43 illustrates a cross-sectional structure of a part of the periphery of the display layer 2d in the cross-sectional structure of FIG. 4 in detail. Specifically, FIG. 43 illustrates a cross-sectional structure around the OLED 5 and the switch transistor Q3 in FIG. 10A.

An upper surface of FIG. 43 is a side of the display surface 2z of the display panel 2, and a bottom surface of FIG. 43 is a side on which the sensor is arranged. A first transparent substrate 31, a first insulating layer 32, a first wiring layer 33, a second insulating layer 34, a second wiring layer 35, a third insulating layer 36, an anode electrode layer 38, a fourth insulating layer 37, a display layer 2d, a cathode electrode layer 39, a fifth insulating layer 40, and a second transparent substrate 41 are provided from the bottom surface side to the upper surface side in FIG. 43.

The first transparent substrate 31 and the second transparent substrate 41 include, for example, quartz glass or the like having excellent visible light transmittance. Alternatively, at least one of first transparent substrate 31 or the second transparent substrate 41 may include a transparent film. The first wiring layer (M1) 33 for connecting each circuit element in the pixel circuit 8 is arranged on the first transparent substrate 31.

On the first transparent substrate 31, the first insulating layer 32 is arranged so as to cover the first wiring layer 33. The first insulating layer 32 has, for example, a laminated structure of a silicon nitride layer and a silicon oxide layer excellent in visible light transmittance. On the first insulating layer 32, a TFT layer 42 in which each transistor in the pixel circuit 8 is arranged is arranged. FIG. 43 schematically illustrates a cross-sectional structure of the switch transistor Q3 formed in the TET layer 42, but other transistors are also arranged in the same layer and connected to the first wiring layer 33 by a contact (not illustrated).

The second insulating layer 34 is arranged on the first insulating layer 32 so as to cover the transistor and the like. The second insulating layer 34 has, for example, a laminated structure of a silicon oxide layer, a silicon nitride layer, and a silicon oxide layer excellent in visible light transmittance. A trench 34a is formed in a part of the second insulating layer 34, and the second wiring layer (M2) 35 connected to the source, the drain, and the like of each transistor is formed by filling a contact member 34b in the trench 34a. Although FIG. 43 illustrates the second wiring layer 35 for connecting the switch transistor Q3 and the anode electrode of the OLED 5, the second wiring layer 35 connected to other circuit elements is also arranged in the same layer.

On the second insulating layer 34, the third insulating layer 36 for covering the second wiring layer 35 and planarizing the surface is arranged. The third insulating layer 36 includes a resin material such as an acrylic resin. The film thickness of the third insulating layer 36 is larger than the film thicknesses of the first insulating layer 32 and the second insulating layer 34.

A trench 36a is formed on a part of the upper surface of the third insulating layer 36, and a contact member 36b is filled in the trench 36a to achieve conduction with the second wiring layer 35, and the contact member 36b is extended to the upper surface side of the third insulating layer 36 to form the anode electrode layer 38. The anode electrode layer 38 has a laminated structure and includes a metal material layer. The metal material layer generally has low visible light transmittance and functions as a reflection layer that reflects light. As a specific metal material, for example, AlNd or Ag can be applied.

Since the lowermost layer of the anode electrode layer 38 is a portion in contact with the trench 36a and is easily disconnected, there is a case where at least the corner of the trench 36a includes, for example, a metal material such as AlNd. The uppermost layer of the anode electrode layer 38 includes a transparent conductive layer such as indium tin oxide (ITO). Alternatively, the anode electrode layer 38 may have, for example, a laminated structure of ITO/Ag/ITO. Ag is originally opaque, but the visible light transmittance is improved by reducing the film thickness. When Ag is thinned, the strength is weakened, so that a laminated structure in which ITO is arranged on both surfaces is applied to the anode electrode layer 38. Thus, it is possible to cause the anode electrode layer 38 to function as a transparent conductive layer.

The fourth insulating layer 37 is arranged on the third insulating layer 36 so as to cover the anode electrode layer 38. Similarly to the third insulating layer 36, the fourth insulating layer 37 also includes a resin material such as an acrylic resin. The fourth insulating layer 37 is patterned in accordance with the arrangement place of the OLED 5 to form a recess 37a.

The display layer 2d is arranged so as to include the bottom surface and the side surface of the recess 37a of the fourth insulating layer 37. The display layer 2d has a laminated structure as illustrated in FIG. 5. The cathode electrode layer 39 is arranged on the display layer 2d. The cathode electrode layer 39 includes a transparent conductive layer similarly to the anode electrode layer 38. The transparent conductive layer includes, for example, ITO/Ag/ITO.

The fifth insulating layer 40 is arranged on the cathode electrode layer 39. The fifth insulating layer 40 includes an insulating material that flattens the upper surface and is excellent in moisture resistance. The second transparent substrate 41 is arranged on the fifth insulating layer 40.

As shown in FIG. 43, in the light emitting region 2B1, the anode electrode layer 38 functioning as a reflective film is arranged, and visible light cannot be transmitted. On the other hand, in the non-light emitting region 2B2, the anode electrode layer 38 is not arranged, and visible light can be transmitted. FIG. 43 shows an example in which the cathode electrode 39 is arranged in the non-light emitting region 2B2, but since the cathode electrode layer 39 is thinner than the anode electrode layer 38, visible light transmittance is maintained even if a metal film such as Ag is included in a part of the cathode electrode layer 39. Note that the cathode electrode layer 39 may be terminated near the boundary between the light emitting region 2B1 and the non-light emitting region 2B2 so that the cathode electrode layer 39 is not arranged in the non-light emitting region 2B2.

Figure 44:
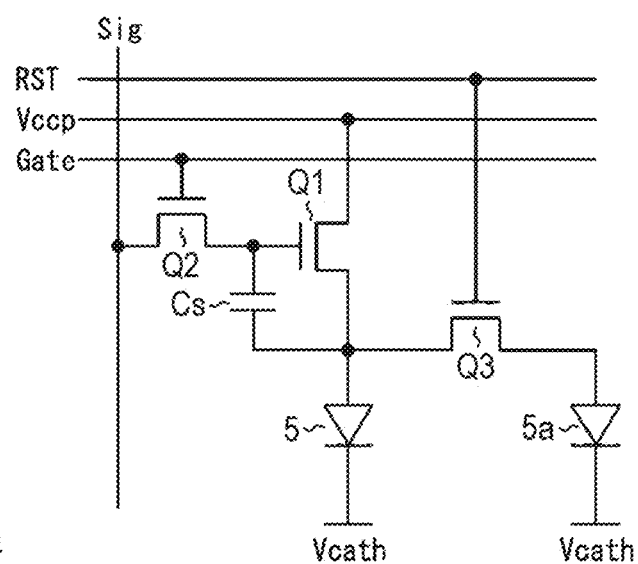
FIG. 44 is a circuit diagram of a pixel circuit of a pixel region in which a sensor in a pixel array unit is arranged immediately below.

FIG. 44 is a circuit diagram of the pixel circuit 8 in a case where each pixel in the pixel region 2B in which the sensor in the pixel array unit 12 is arranged immediately below has the light emitting region 2B1 and the light emitting region 2B2 as illustrated in FIG. 34. The circuit diagram of FIG. 44 is simplified, and there may be actually a case where the pixel circuit 8 is configured by the circuit of FIG. 16 and the like. The pixel circuit 8 of FIG. 44 includes a drive transistor Q1, a sampling transistor Q2, a pixel capacitance Cs, a switch transistor Q3, and two OLEDs 5 and 5 a. More specifically, as illustrated in FIG. 34, each of the three color pixels constituting each pixel includes a light emitting region 2B1 and a light emitting region 2B2, and for example, the pixel circuit 8 in FIG. 44 is arranged in the light emitting region 2B1.

Figure 45:
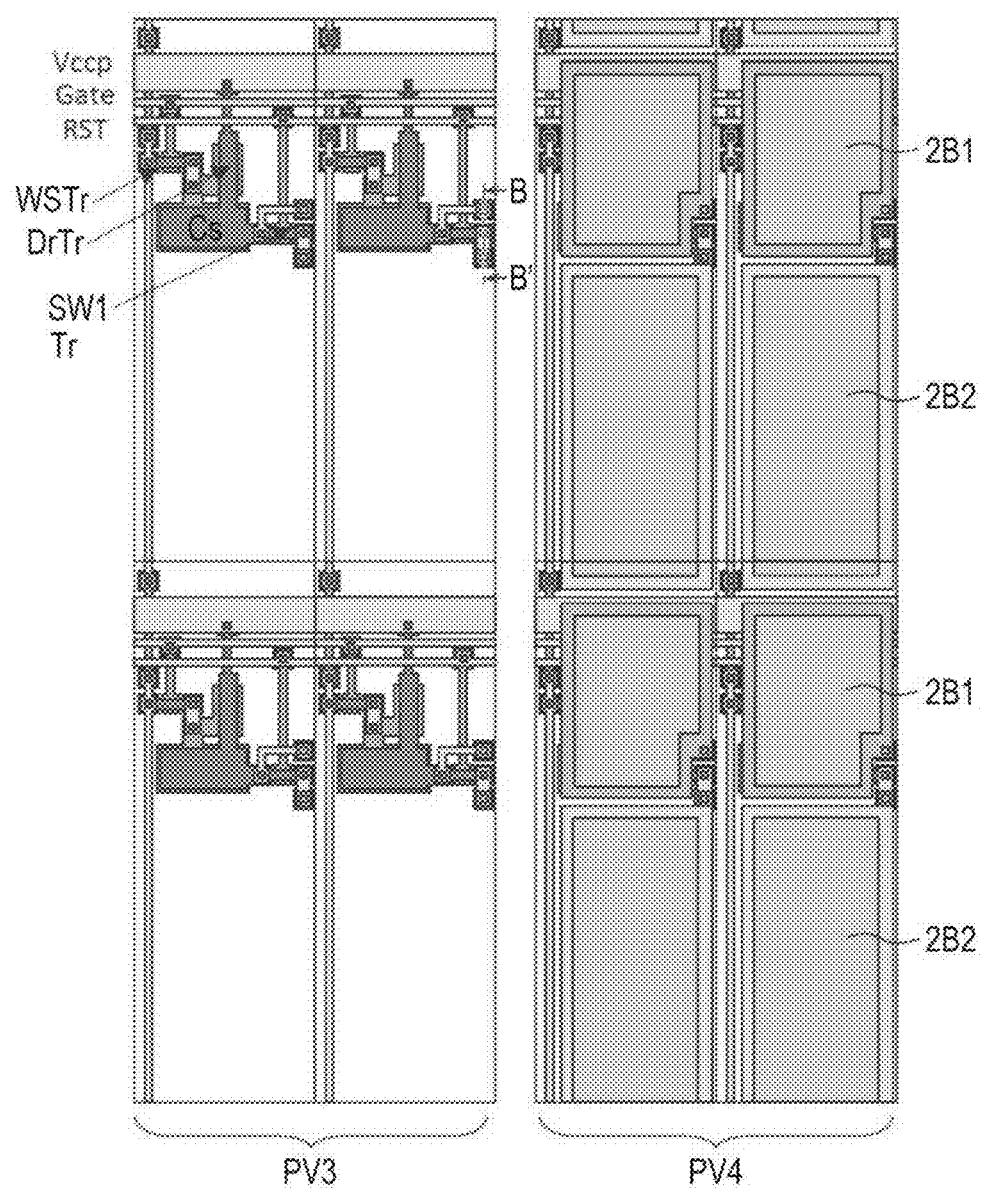
FIG. 45 is a plan view of a plurality of color pixels including the pixel circuit of FIG. 44.

FIG. 45 is a plan view of a plurality of color pixels including the pixel circuit 8 of FIG. 44. FIG. 45 illustrates a planar layout of a total of four color pixels including two color pixels horizontally and two color pixels vertically. Each color pixel has a light emitting region 2B1 and a light emitting region 2B2 arranged adjacent to each other in the vertical direction. A planar layout diagram PV3 on the left side of FIG. 45 illustrates a layout arrangement of each circuit element of the pixel circuit 8, and a planar layout diagram PV4 on the right side of FIG. 45 illustrates a positional relationship between the light emitting region 2B1 and the light emitting region 2B2. The planar layout diagrams PV3 and PV4 on the left and right sides of FIG. 45 illustrate the same pixel region.

As illustrated on the left side of FIG. 45, each circuit element in the pixel circuit 8 illustrated in FIG. 44 is arranged inside the light emitting region 2B1. Note that the arrangement of each circuit element in FIG. 45 is an example, and various arrangement changes can be made.

Figure 46:
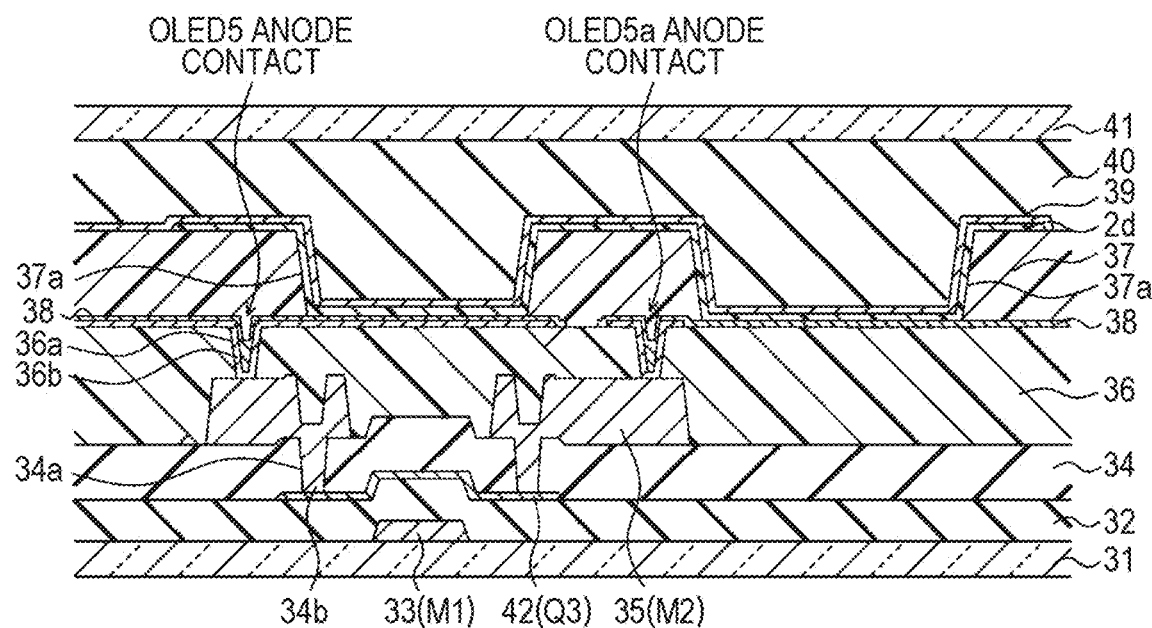
FIG. 46 is a cross-sectional view taken along line A-A' of FIG. 45.

FIG. 46 is a cross-sectional view taken along line B-B' of FIG. 45. The cross-sectional view of FIG. 46 illustrates a laminated structure in the pixel region 2B of the image display device 1. FIG. 46 illustrates a cross-sectional structure of a part of the periphery of the display layer 2d in the cross-sectional structure of FIG. 4 in detail. Specifically, FIG. 46 illustrates a cross-sectional structure around the two OLEDs 5 and 5a and the switch transistor Q3 in FIG. 44.

An upper surface of FIG. 46 is a side of the display surface 2z of the display panel 2, and a bottom surface of FIG. 46 is a side on which the sensor is arranged. The cross-sectional structure of FIG. 46 is basically similar to that of FIG. 43. The difference from FIG. 43 is that the OLED 5a is arranged, and in FIG. 46, a contact 36a for conducting the anode electrode layer 38 of the OLED 5a and the second wiring layer 35 is provided. Although two second wiring layers 35 for connecting the switch transistor Q3 and the anode electrodes of the two OLEDs 5 and 5a are illustrated in FIG. 44, the second wiring layer 35 connected to other circuit elements is also arranged in the same layer.

As shown in FIG. 46, since the anode electrode layer 38 extends in the non-light emitting region 2B1, the anode electrode layer functions as a reflective film that does not transmit visible light, whereas the anode electrode layer 38 in the light emitting region 2B2 is thinned so that incident visible light can be transmitted. Alternatively, the anode electrode layer 38 in the light emitting region 2B2 may be terminated in the vicinity of the OLED 5a to further improve the visible light transmittance.

Figure 47:
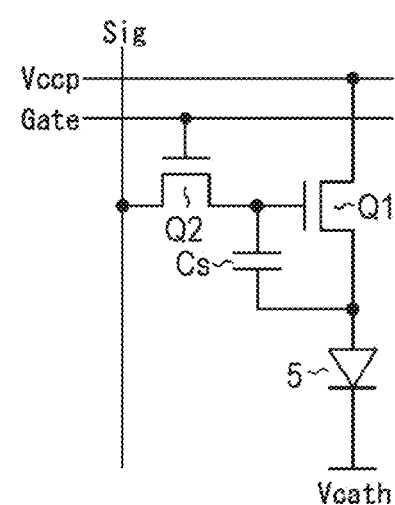
FIG. 47 is a circuit diagram of a pixel circuit of a pixel region in which a sensor is not arranged immediately below.

FIG. 47 is a circuit diagram of the pixel circuit 8 in the pixel region 2A where the sensor is not arranged immediately below. Each pixel (color pixel) of the pixel region 2A includes the light emitting region 2A1, but does not include the non-light emitting region 2B2. Therefore, the pixel circuit 8 in FIG. 47 includes the drive transistor Q1, the sampling transistor Q2, the pixel capacitance Cs, and one OLED 5, and causes the OLED 5 to emit light in the light emitting region 2A1.

Figure 48:
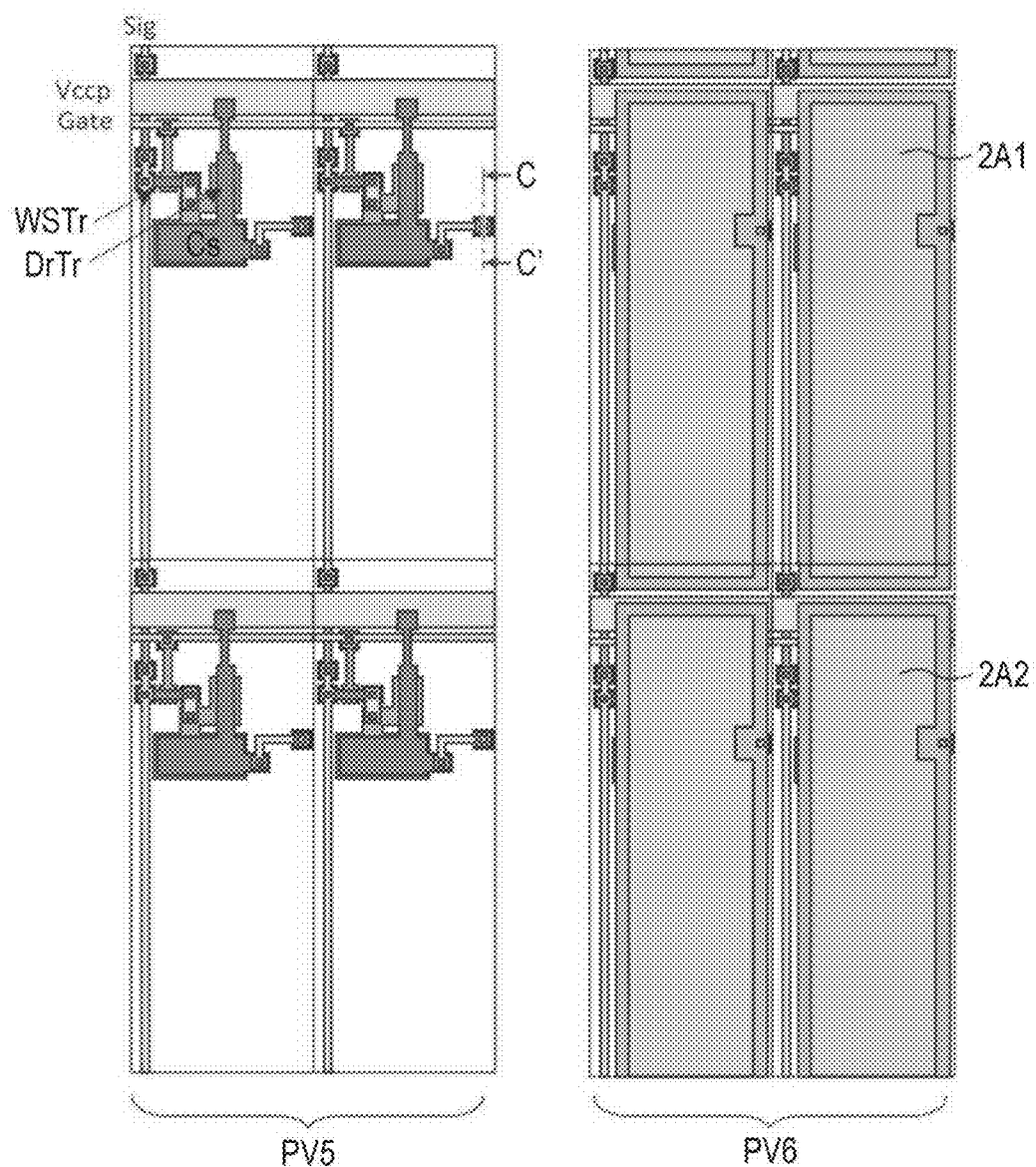
FIG. 48 is a plan view of a plurality of color pixels including the pixel circuit of FIG. 47.

FIG. 48 is a plan view of a plurality of color pixels including the pixel circuit 8 of FIG. 47. FIG. 48 illustrates a planar layout of a total of four color pixels including two color pixels horizontally and two color pixels vertically. Each color pixel has a vertically long light emitting region 2A1. A planar layout diagram PV5 on the left side of FIG. 48 illustrates a layout arrangement of each circuit element of the pixel circuit 8, and actually, planar layout diagrams PV5 and PV6 on the left and right sides of FIG. 48 illustrate the same pixel region. The substantially entire light emitting region 2A1 is covered with the anode electrode layer 38 that acts as a reflective film. Therefore, the light emitted by the OLED 5 is emitted from substantially the entire region of the pixel, and the luminance of the pixel can be improved.

Figure 49:
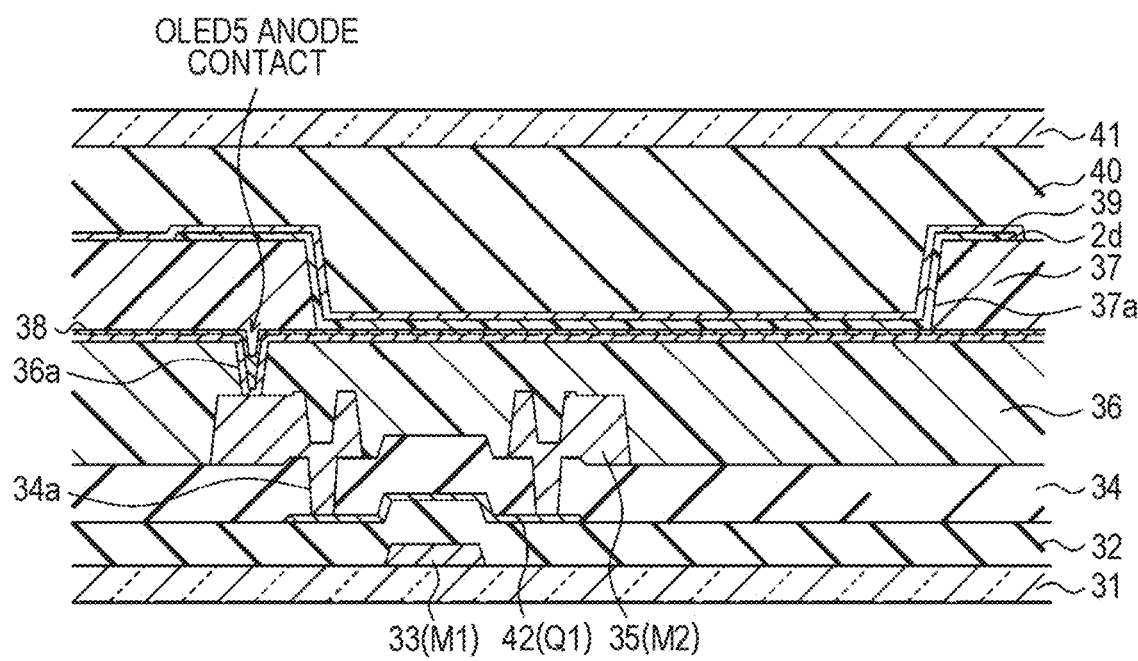
FIG. 49 is a cross-sectional view taken along line B-B' in FIG. 48.

FIG. 49 is a cross-sectional view taken along line C-C' in FIG. 48. The layer configuration of FIG. 49 is the same as that of FIG. 46, and the first to third insulating layers 36 are sequentially laminated on the first transparent substrate 31, the anode electrode layer 38 is arranged on the third insulating layer 36, the fourth insulating layer 37 is arranged thereon, the display layer 2d and the cathode electrode layer 39 are laminated thereon, and the second transparent substrate 41 is arranged thereon. FIG. 49 illustrates a cross-sectional structure around the drive transistor Q1. The source of the drive transistor Q1 is connected to the anode electrode layer 38 of the OLED 5 via the second wiring layer 35. The anode electrode layer 38 has a laminated structure, and an opaque metal layer (for example, an AlNd layer) of the anode electrode layer extends over most of the color pixels, so that the light emitting region 2A1 becomes opaque.

On the anode electrode layer 38, the cathode electrode layer 39 is arranged with the display layer 2d interposed therebetween, and an OLED 5 is formed. As described above, in the pixel region 2A shown in FIGS. 47 to 49, the anode electrode layer 38 and the cathode electrode layer 39 extending in each color pixel are provided, and the anode electrode layer 38 functions as a reflection layer that reflects light, so that the entire color pixel can be set to the light emitting region 2A1.

Figure 50:
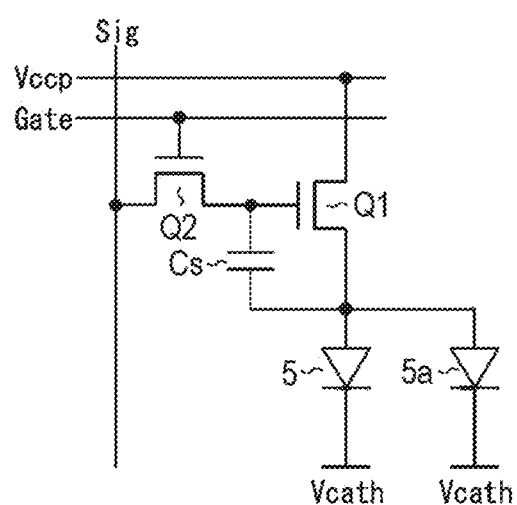
FIG. 50 is a circuit diagram of a pixel circuit of a pixel region.
Figure 51:
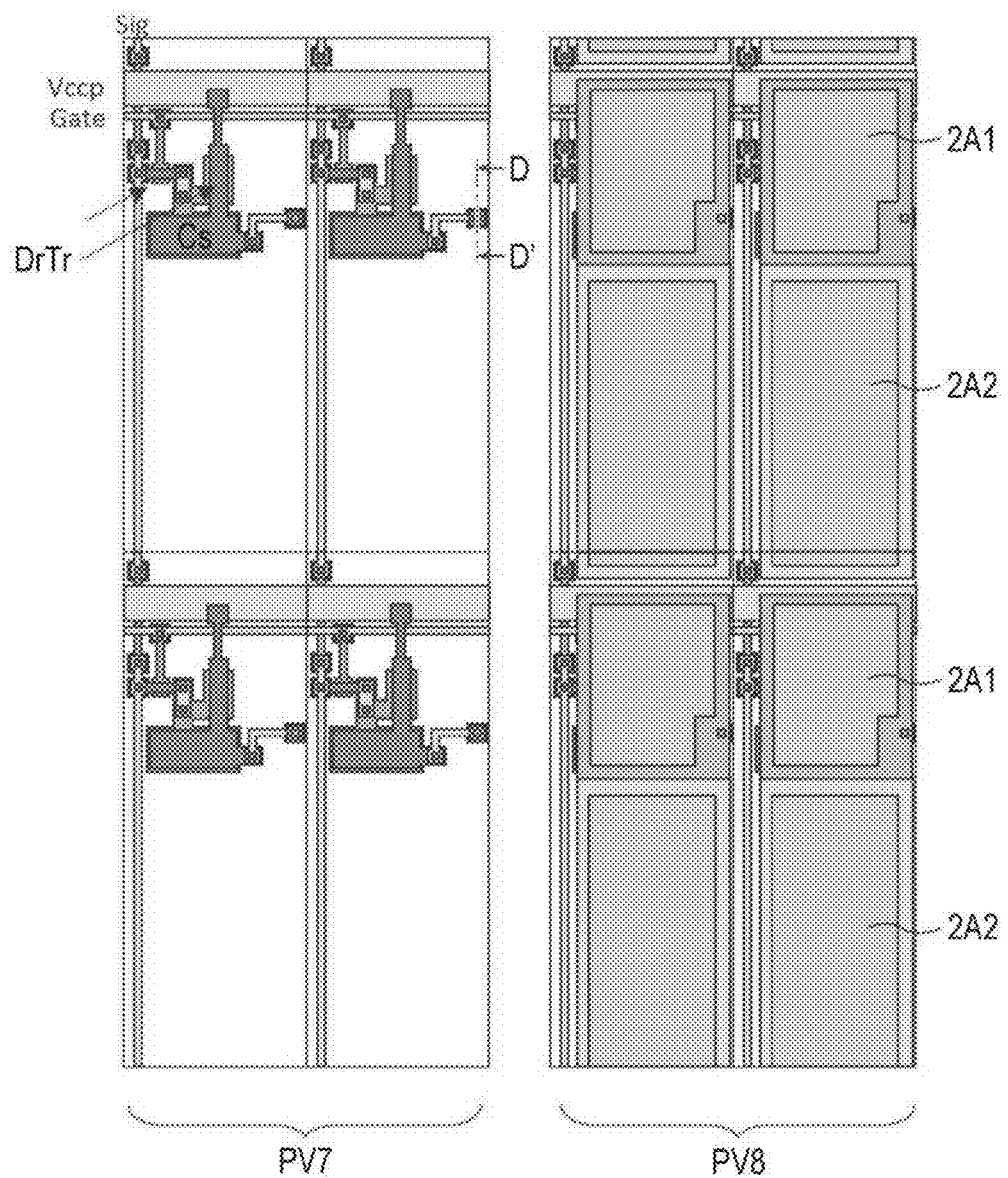
FIG. 51 is a plan view of a plurality of color pixels including the pixel circuit of FIG. 50.
Figure 52:
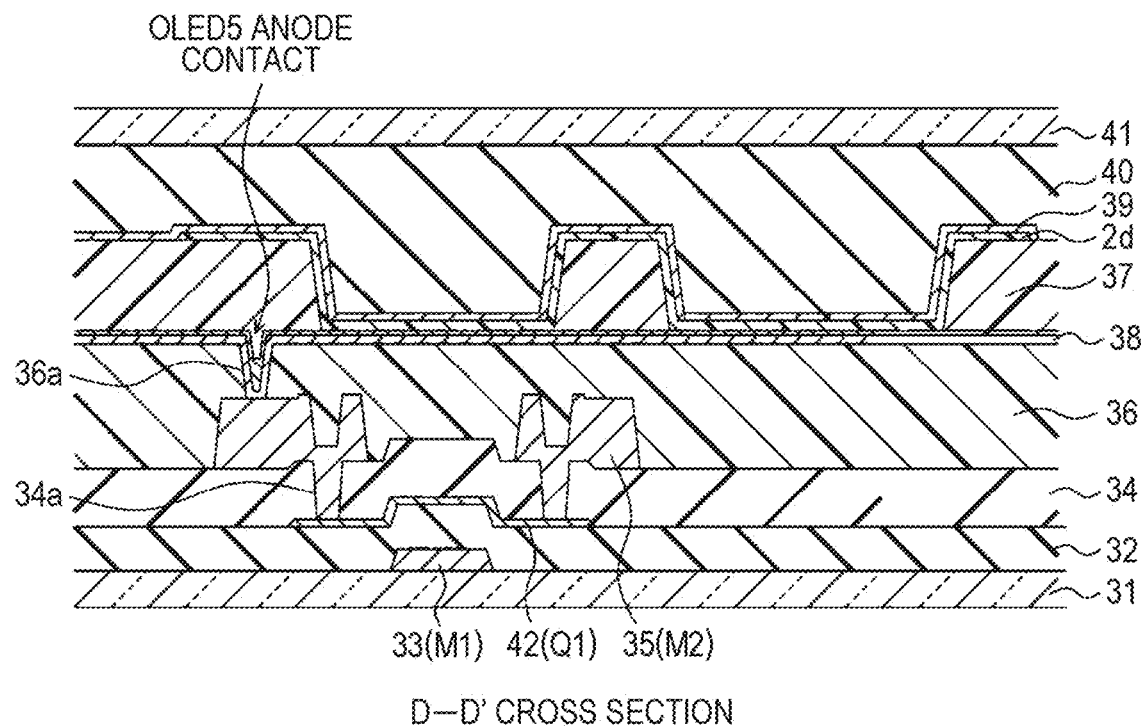
FIG. 52 is a cross-sectional view taken along line C-C' in FIG. 51.

In FIGS. 47 to 49, an example in which each color pixel in the pixel region 2A where the sensor is not arranged immediately below has only the light emitting region 2A1 is illustrated. However, as illustrated in FIGS. 50 to 52, the light emitting region 2A1 and the light emitting region 2A2 may be provided in the pixel region 2A, and both the light emitting region 2A1 and the light emitting region 2A2 may emit light. Most of the light emitting region 2A1 does not transmit incident visible light, whereas most of the light emitting region 2A2 can transmit incident visible light.

FIG. 50 is a circuit diagram of the pixel circuit 8 in the pixel region 2A. The pixel circuit 8 of FIG. 50 has a configuration in which the switch transistor Q3 is omitted from the pixel circuit 8 of FIG. 44.

FIG. 51 is a plan view of a plurality of color pixels including the pixel circuit 8 of FIG. 50. The plan view of FIG. 51 has a planar layout in which the switch transistor Q3 is omitted from the plan view of FIG. 45. The planar layout diagram PV7 on the left side of FIG. 51 illustrates the same pixel region as the planar layout diagram PV8 on the right side.

FIG. 52 is a cross-sectional view taken along line D-D' in FIG. 51. FIG. 52 illustrates a cross-sectional structure around the drive transistor Q1. The second wiring layer 35 is connected to the drive transistor Q1, and the second wiring layer 35 is connected to the anode electrode layer 38. The opaque metal layer in the anode electrode layer 38 extends to the vicinity of the boundary between the light emitting region 2A1 and the light emitting region 2A2. On the other hand, the transparent conductive layer in the anode electrode layer 38 extends from the light emitting region 2A1 to the light emitting region 2A2. As described above, in the light emitting region 2A2, the opaque metal layer in the anode electrode layer 38 is not arranged, so that the visible light transmittance in the light emitting region 2A2 can be improved.

In FIG. 46, in order to connect the switch transistor Q3 and the anode electrode of the OLED 5, a laminated film of ITO-Ag-ITO or the like is formed on the surface of the trench 36a formed in the third insulating layer 36 to prevent disconnection of the anode electrode layer 38 at the corner of the trench 36a. In order to prevent disconnection of the anode electrode layer 38, there is a method of using a laminated film or increasing the film thickness of the transparent conductive layer, but there is a possibility that the visible light transmittance decreases. In this respect, it is desirable to make the film thickness of the anode electrode layer 38 as thin as possible. As a method for preventing disconnection even when the film thickness of the anode electrode layer 38 is reduced, there is a method of adjusting the taper angle of the trench 36a.

Figure 53:
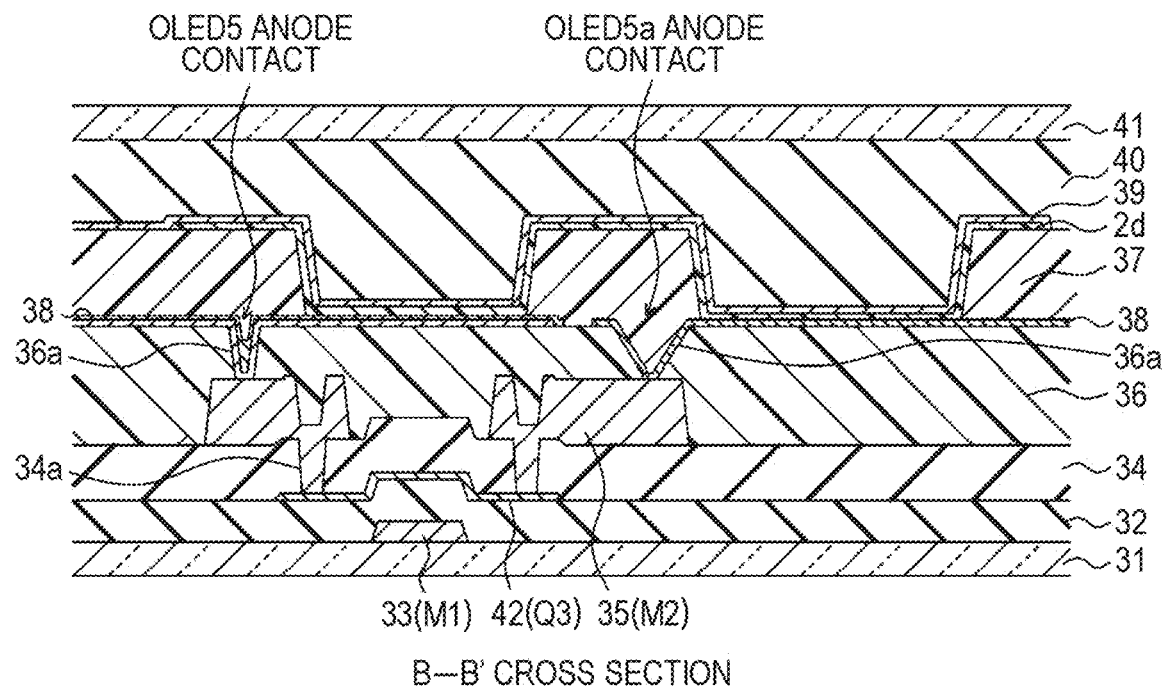
FIG. 53 is a cross-sectional view illustrating a first modification of a cross-sectional structure of FIG. 46.

FIG. 53 is a cross-sectional view illustrating a first modification of the cross-sectional structure of FIG. 46. In FIG. 53, the taper angle of the trench 36a formed in the third insulating layer 36 with respect to the substrate depth (lamination) direction is made larger than that in FIG. 46. As a result, even when a transparent conductive layer (for example, ITO) having a film thickness of about 40 nm is formed on the surface of the trench 36a, the possibility of disconnection at the corner of the trench 36a is reduced. According to FIG. 53, the anode electrode layer 38 can be formed only of thin ITO. Therefore, it is not necessary to form only the anode contact of the OLED 5a into a laminated film structure, and the opening dimension of the fourth insulating layer 37 can be extended to the vicinity of the anode contact of the OLED 5a.

Since disconnection of the anode electrode layer 38 is likely to occur at a corner of the trench 36a, a method of adjusting the taper angle of the trench 36a only in the vicinity of the corner of the trench 36a is also conceivable.

Figure 54:
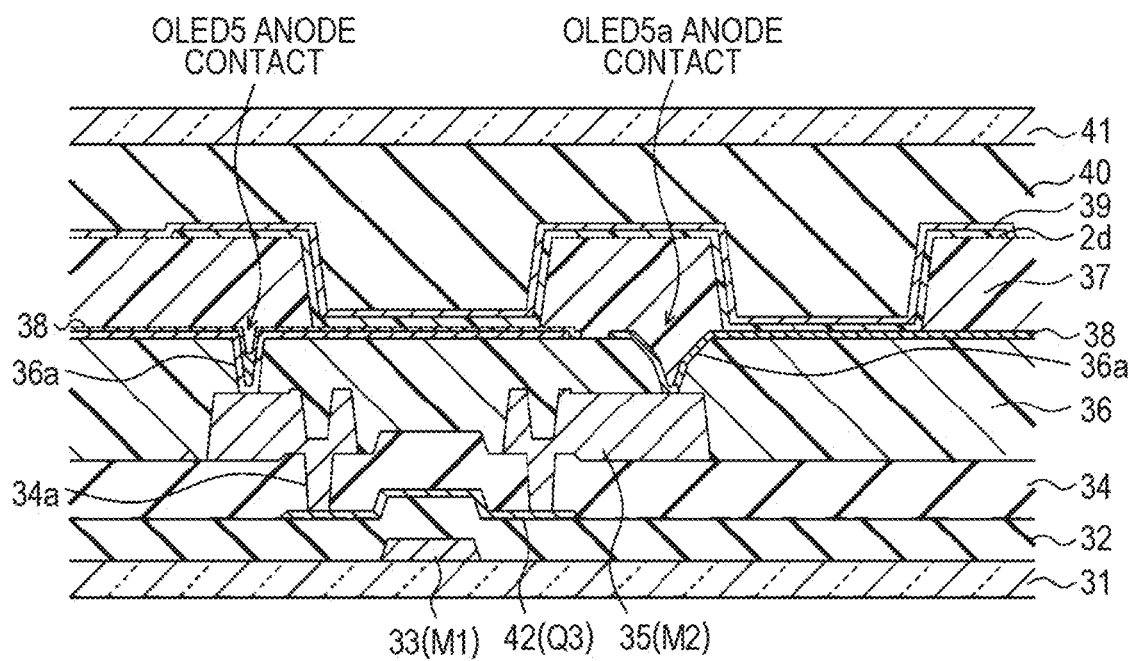
FIG. 54 is a cross-sectional view illustrating a second modification of the cross-sectional structure of FIG. 46.

FIG. 54 is a cross-sectional view illustrating a second modification of the cross-sectional structure of FIG. 46. In FIG. 54, a trench 36a having a diameter more uniform than that in FIG. 53 is formed in the third insulating layer 36, and the diameter is increased only in the vicinity of the upper end of the trench 36a. Then, a transparent conductive layer (for example, ITO) of about 40 nm is formed on the surface of the trench 36a. In the case of FIG. 54, the body portion of the trench 36a is formed at a steep angle along the normal direction of the display surface 2z, but the corner has a gentle curved surface shape. Therefore, even if thin ITO is formed, disconnection at the corner of the trench 36a is less likely to occur. The trench 36a having the shape as illustrated in FIG. 54 can be relatively easily formed by using, for example, a halftone mask. The body portion of the steep trench 36a can be formed in the third insulating layer 36 by the first exposure, and a gentle curved surface can be formed at the upper end portion of the trench 36a by the second exposure.

In the trench 36a of FIG. 54, since the diameter of the body portion is smaller than that of the trench 36a of FIG. 53, the length in the lateral (horizontal) direction can be suppressed, and the area of the OLED 5 can be increased accordingly.

As described above, in the image display device 1 according to the present embodiment, even in a case where the sensor is arranged immediately below the display panel 2, since the non-light emitting region 2B2 is provided in the pixel region 2B immediately above the sensor, light can be received by the sensor without being affected by display of the display panel 2, and reliability of sensing by the sensor can be improved. Therefore, for example, since it is not necessary to arrange the sensor in the bezel of the display unit of the electronic apparatus, the degree of freedom in design of the electronic apparatus can be further increased.

As described above, according to the present embodiment, since the display unit of the electronic apparatus such as a smartphone can be maximized up to the housing size, the size of the display unit can be further increased, and the housing can be further downsized.

In addition, in the present embodiment, in a case where the pixel region 2B in which the sensor is arranged immediately below and the other pixel region 2A are provided in the display panel 2, the luminance difference between the pixel regions 2A and 2B can be reduced as much as possible by gradually reducing the luminance of the pixel on the side close to the pixel region 2B in the pixel region 2A, and the deterioration of the display quality of the display panel 2 can be suppressed.

Furthermore, in the present embodiment, the light emitting region 2B1 and the light emitting region 2B2 are provided in the pixel region 2B in which the sensor is arranged immediately below, and the OLED 5a that causes the light emitting region 2B2 to emit light is provided separately from the OLED 5 that causes the light emitting region 2B1 to emit light, whereby the luminance of the light emitting region 2B2 can be improved, and the luminance difference between the pixel regions 2A and 2B can be reduced.

Furthermore, in the present embodiment, with respect to the pixel region 2B, by performing control to cause the light emitting region 282 to emit light during a period in which the sensor is not operated and to stop light emission in the light emitting region 2B2 during an operation period of the sensor, reliability of sensing by the sensor can be improved while suppressing luminance variation of the display panel 2.

Furthermore, in the present embodiment, the anode electrode layer 38 normally functioning as a reflective film includes a laminated film of ITO-Ag-ITO or the like, and the film thickness of the metal material layer of Ag or the like is reduced, so that the visible light transmittance of the anode electrode layer 38 in the visible light transmission region 2B2 can be increased. In addition, when conduction between the anode electrode layer 38 and the second wiring layer 35 is achieved, by forming the trench 36a in the third insulating layer 36 and adjusting the taper angle of the side wall portion of the trench 36a, disconnection of the anode electrode layer 38 at the corner of the trench 36a is less likely to occur, so that the film thickness of the anode electrode layer 38 can be reduced, and as a result, the visible light transmittance of the anode electrode layer 38 can be further improved. Alternatively, by making the taper angle of the trench 36a steep at the body portion of the trench 36a and forming a gentle curved surface at the corner of the trench 36a, it is possible to prevent disconnection of the anode electrode layer 38 at the corner of the trench 36a while reducing the diameter of the trench 36a.

Figure 55A:
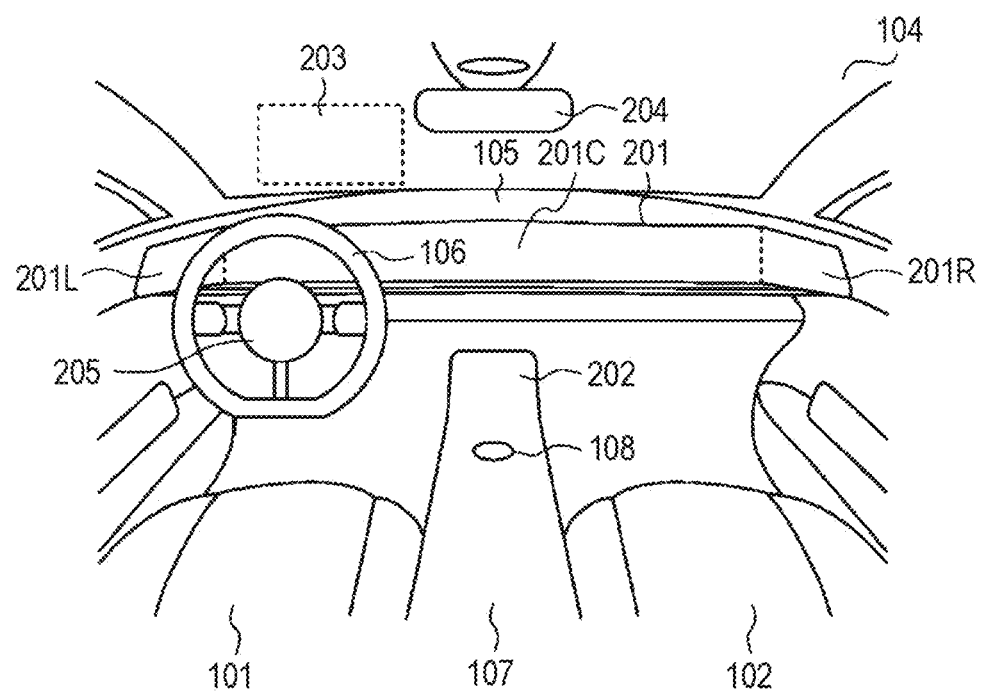
FIG. 55A is a view illustrating an internal state of a vehicle from a rear side to a front side of the vehicle.
Figure 55B:
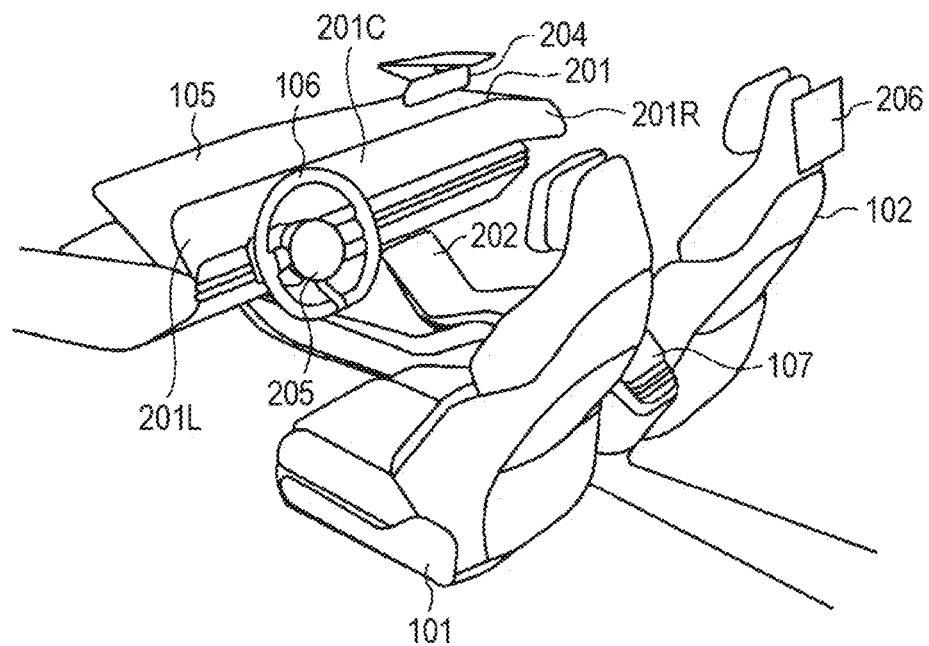
FIG. 55B is a view illustrating an internal state of the vehicle from an oblique rear to an oblique front of the vehicle.

Application Example of Image Display Device 1 and Electronic Apparatus 50 According to Present Disclosure First Application Example The image display device 1 and the electronic apparatus 50 according to the present disclosure can be used for various purposes. FIGS. 55A and 55B are diagrams illustrating an internal configuration of a vehicle 100 which is a first application example of the electronic apparatus 50 including the image display device 1 according to the present disclosure. FIG. 55A is a view illustrating an internal state of the vehicle 100 from a rear side to a front side of vehicle 100, and FIG. 55B is a view illustrating an internal state of the vehicle 100 from an oblique rear side to an oblique front side of the vehicle 100.

The vehicle 100 of FIGS. 55A and 55B has a center display 101, a console display 102, a head-up display 103, a digital rear mirror 104, a steering wheel display 105, and a rear entertainment display 106.

The center display 101 is arranged on a dashboard 107 at a position facing a driver's seat 108 and a passenger seat 109. FIG. 55 illustrates an example of the center display 101 having a horizontally long shape extending from the driver's seat 108 side to the passenger seat 109 side, but the screen size and arrangement place of the center display 101 are arbitrary. The center display 101 can display information detected by various sensors 5. As a specific example, the center display 101 can display a captured image imaged by an image sensor, a distance image to an obstacle in front of or on a side of the vehicle measured by a ToF sensor 5, a passenger's body temperature detected by the infrared sensor 5, and the like. The center display 101 can be used to display, for example, at least one of safety-related information, operation-related information, a life log, health-related information, authentication/identification-related information, or entertainment-related information.

The safety-related information is information such as doze detection, looking-away detection, mischief detection of a child riding together, presence or absence of wearing of a seat belt, and detection of leaving of an occupant, and is, for example, information detected by the sensor 5 arranged to overlap the back surface side of the center display 101. The operation-related information detects a gesture related to the operation of the occupant using the sensor 5. The detected gesture may include operation of various equipment in the vehicle 100. For example, operations of air conditioning equipment, a navigation device, an AV device, a lighting device, and the like are detected. The life log includes a life log of all the occupants. For example, the life log includes an action record of each occupant in the vehicle. By acquiring and storing the life log, it is possible to confirm the state of the occupant at the time of the accident. The health-related information detects a body temperature of the occupant using a temperature sensor 5, and estimates the health state of the occupant on the basis of the detected body temperature. Alternatively, the face of the occupant may be imaged using an image sensor, and the health state of the occupant may be estimated from the imaged facial expression. Furthermore, a conversation may be made with the occupant in an automatic voice, and the health state of the occupant may be estimated on the basis of the answer content of the occupant. The authentication/identification-related information includes a keyless entry function of performing face authentication using the sensor 5, a function of automatically adjusting a seat height and a position in face identification, and the like. The entertainment-related information includes a function of detecting operation information of the AV device by the occupant using the sensor 5, a function of recognizing the face of the occupant by the sensor 5 and providing content suitable for the occupant by the AV device, and the like.

The console display 102 can be used to display the life log information, for example. The console display 102 is arranged near a shift lever 111 of a center console 110 between the driver's seat 108 and the passenger seat 109. The console display 102 can also display information detected by the various sensors 5. In addition, the console display 102 may display an image of the periphery of the vehicle imaged by the image sensor, or may display a distance image to an obstacle in the periphery of the vehicle.

The head-up display 103 is virtually displayed behind a windshield 112 in front of the driver's seat 108. The head-up display 103 can be used to display, for example, at least one of safety-related information, operation-related information, a life log, health-related information, authentication/identification-related information, or entertainment-related information. Since the head-up display 103 is virtually arranged in front of the driver's seat 108 in many cases, it is suitable for displaying information directly related to the operation of the vehicle 100 such as the speed of the vehicle 100 and the remaining amount of fuel (battery).

The digital rear mirror 104 can not only display the rear of the vehicle 100 but also display the state of the occupant in the rear seat, and thus can be used to display the life log information, for example, by arranging the sensor 5 to be superimposed on the back surface side of the digital rear mirror 104.

The steering wheel display 105 is arranged near the center of a steering wheel 113 of the vehicle 100. The steering wheel display 105 can be used to display, for example, at least one of safety-related information, operation-related information, a life log, health-related information, authentication/identification-related information, or entertainment-related information. In particular, since the steering wheel display 105 is close to the driver's hand, it is suitable for displaying life log information such as the body temperature of the driver, or for displaying information related to the operation of an AV device, air conditioning equipment, or the like.

The rear entertainment display 106 is attached to the back side of the driver's seat 108 and the passenger seat 109, and is for viewing by an occupant in the rear seat. The rear entertainment display 106 can be used to display, for example, at least one of safety-related information, operation-related information, a life log, health-related information, authentication/identification-related information, or entertainment-related information. In particular, since the rear entertainment display 106 is in front of the occupant in the rear seat, information related to the occupant in the rear seat is displayed. For example, information regarding the operation of the AV device or air conditioning equipment may be displayed, or a result of measuring the body temperature or the like of the occupant in the rear seat by the temperature sensor 5 may be displayed.

As described above, by arranging the sensor 5 on the back surface side of the image display device 1 in an overlapping manner, it is possible to measure the distance to an object existing in the surroundings. Optical distance measurement methods are roughly classified into a passive type and an active type. In the passive type, distance measurement is performed by receiving light from an object without projecting light from the sensor 5 to the object. The passive type includes a lens focus method, a stereo method, a monocular vision method, and the like. In the active type, light is projected onto an object, and reflected light from the object is received by the sensor 5 to measure a distance. The active type includes an optical radar method, an active stereo method, an illuminance difference stereo method, a moiré topography method, an interference method, and the like The image display device 1 according to the present disclosure can be applied to any of these types of distance measurement. By using the sensor 5 disposed to overlap the back surface side of the image display device 1 according to the present disclosure, the above-described passive or active type distance measurement can be performed.

Second Application Example

The image display device 1 according to the present disclosure is applicable not only to various displays used in vehicles but also to displays mounted on various electronic apparatuses 50.

Figure 56A:
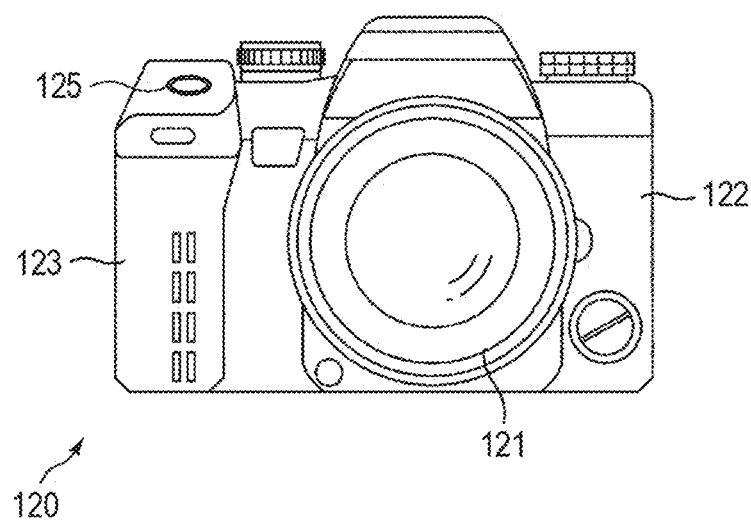
FIG. 56A is a front view of a digital camera as a second application example of the electronic apparatus.
Figure 56B:
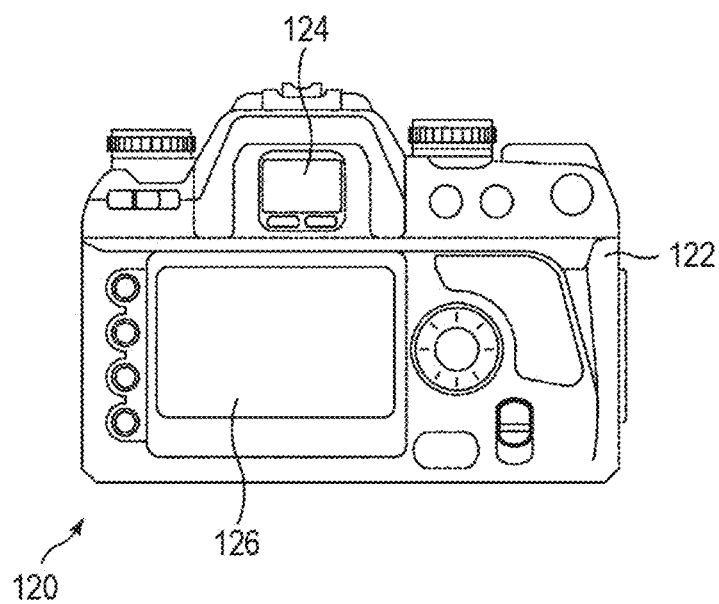
FIG. 56B is a rear view of the digital camera.

FIG. 56A is a front view of a digital camera 120 as a second application example of the electronic apparatus 50, and FIG. 56B is a rear view of the digital camera 120. The digital cameras 120 in FIGS. 56A and 56B illustrate an example of a single-lens reflex camera in which a lens 121 is replaceable, but are also applicable to a camera in which the lens 121 is not replaceable.

In the cameras of FIGS. 56A and 56B, when the photographer looks into an electronic viewfinder 124 to determine the composition while holding a grip 123 of a camera body 122, and presses a shutter 125 while adjusting the focus, the imaging data is stored in the memory in the camera. As illustrated in FIG. 56B, a monitor screen 126 that displays imaging data and the like, a live image, and the like, and the electronic viewfinder 124 are provided on the back side of the camera. In addition, there is also a case where a sub screen for displaying setting information such as a shutter speed and an exposure value is provided on the upper surface of the camera.

By arranging the sensor 5 so as to overlap the back surface side of the monitor screen 126, the electronic viewfinder 124, the sub screen, and the like used for the camera, the camera can be used as the image display device 1 according to the present disclosure.

Third Application Example

The image display device 1 according to the present disclosure is also applicable to a head mounted display (hereinafter, referred to as an HMD). The HMD can be used for virtual reality (VR), augmented reality (AR), mixed reality (MR), substitutional reality (SR), or the like.

Figure 57A:
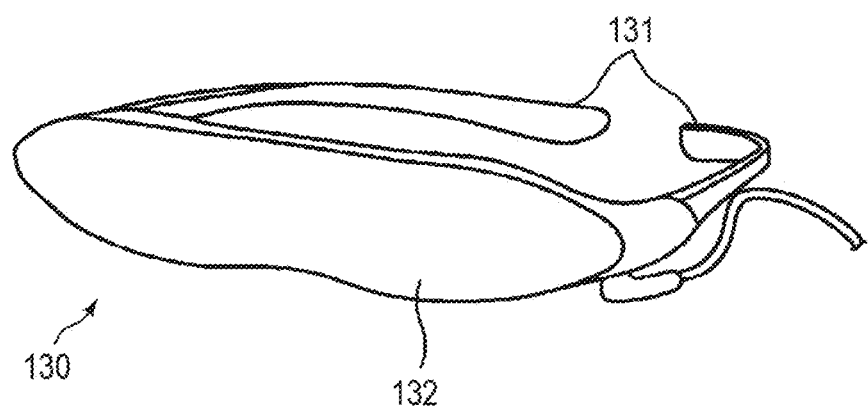
FIG. 57A is an external view of an HMD as a third application example of the electronic apparatus.

FIG. 57A is an external view of an HMD 130 which is a third application example of the electronic apparatus 50. The HMD 130 of FIG. 57A has an attachment member 131 for attachment so as to cover human eyes. The attachment member 131 is hooked and fixed to a human ear, for example. A display device 132 is provided inside the HMD 130, and a wearer of the HMD 130 can visually recognize a stereoscopic image and the like with the display device 132. The HMD 130 includes, for example, a wireless communication function, an acceleration sensor, and the like, and can switch a stereoscopic image and the like displayed on the display device 132 in accordance with the posture, gesture, and the like of the wearer.

Furthermore, a camera may be provided in the HMD 130 to capture an image around the wearer, and an image obtained by combining the captured image of the camera and the image generated by the computer may be displayed on the display device 132. For example, a camera is arranged to be superimposed on the back surface side of the display device 132 visually recognized by the wearer of the HMD 130, the periphery of the eye of the wearer is imaged by the camera, and the captured image is displayed on another display provided on the outer surface of the HMD 130, so that a person around the wearer can grasp the facial expression and the eye motion of the wearer in real time.

Figure 57B:
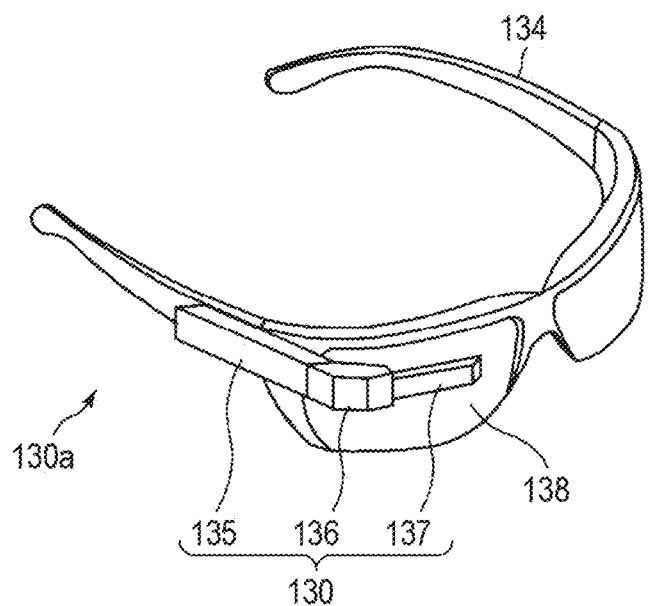
FIG. 57B is an external view of a smart glass.

Note that various types of the HMD 130 are conceivable. For example, as illustrated in FIG. 57B, the image display device 1 according to the present disclosure can also be applied to a smart glass 130a that displays various types of information on the glasses 134. The smart glass 130a in FIG. 57B includes a main body 135, an arm 136, and a lens barrel portion 137. The main body 135 is connected to the arm 136. The main body 135 is detachable from the eyeglasses 134. The main body 135 incorporates a control board and a display unit for controlling the operation of the smart glass 130a. The main body 135 and the lens barrel are connected to each other via the arm 136. The lens barrel portion 137 emits image light emitted from the main body 135 through the arm 136 toward a lens 138 of the eyeglasses 134. This image light enters human eyes through the lens 138. The wearer of the smart glass 130a in FIG. 57B can visually recognize not only the surrounding situation but also various pieces of information emitted from the lens barrel portion 137, similarly to normal glasses.

Fourth Application Example

The image display device 1 according to the present disclosure is also applicable to a television device (hereinafter, TV). Recent TVs tend to make the frame as small as possible from the viewpoint of downsizing and design property. Therefore, in a case where a camera for imaging a viewer/listener is provided on a TV, it is desirable to arrange the camera so as to overlap the back surface side of a display panel 2 of the TV.

Figure 58:
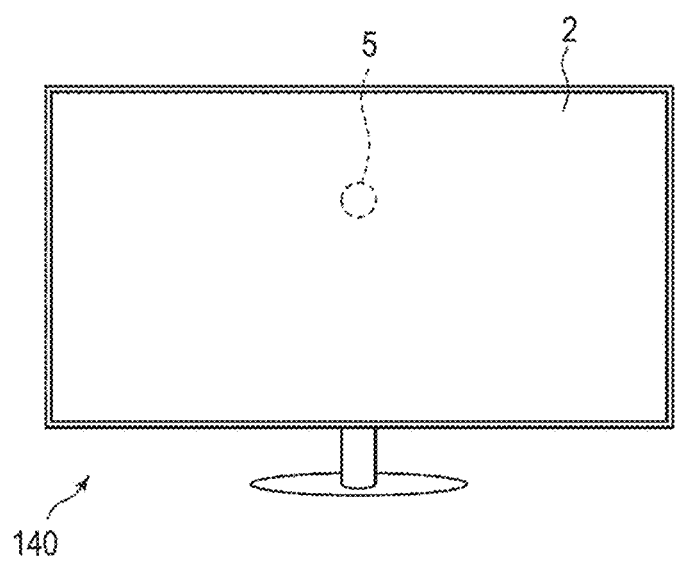
FIG. 58 is an external view of a TV as a fourth application example of the electronic apparatus.

FIG. 58 is an external view of a TV 140 which is a fourth application example of the electronic apparatus 50. In the TV 140 of FIG. 58, the frame is minimized, and almost the entire area on the front side is a display area. The TV 140 incorporates a sensor 5 such as a camera for imaging a viewer/listener. The sensor 5 in FIG. 58 is arranged on a back side of a part (for example, a broken line part) in the display panel 2. The sensor 5 may be an image sensor module, or various sensors such as a sensor for face authentication, a sensor for distance measurement, and a temperature sensor can be applied, and a plurality of types of sensors may be arranged on the back surface side of the display panel 2 of the TV 140.

As described above, according to the image display device 1 of the present disclosure, since an image sensor module 9 can be arranged to overlap the back surface side of the display panel 2, it is not necessary to arrange a camera or the like in the frame, the TV 140 can be downsized, and there is no possibility that the design is impaired by the frame.

Fifth Application Example

Figure 59:
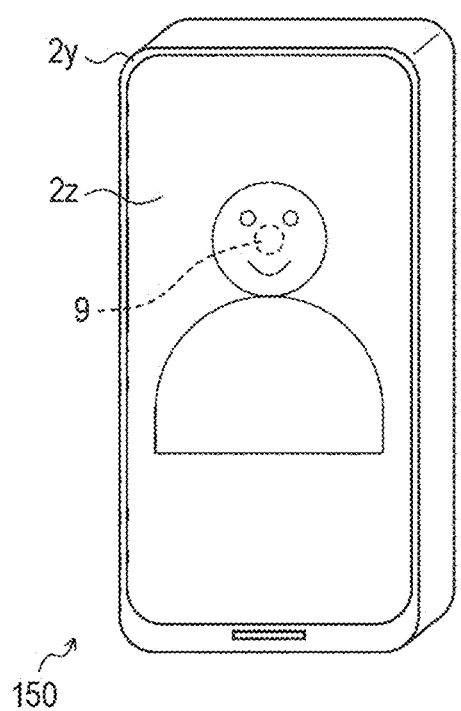
FIG. 59 is an external view of a smartphone as a fifth application example of the electronic apparatus.

The image display device 1 according to the present disclosure is also applicable to a smartphone and a mobile phone. FIG. 59 is an external view of a smartphone 150 which is a fifth application example of the electronic apparatus 50. In the example of FIG. 59, the display surface 2z extends close to the outer size of the electronic apparatus 50, and the width of a bezel 2y around the display surface 2z is set to several mm or less. Normally, a front camera is often mounted on the bezel 2y, but in FIG. 59, as indicated by a broken line, the image sensor module 9 functioning as a front camera is arranged on the back side of the substantially central portion of the display surface 2z, for example. By providing the front camera on the back side of the display surface 2z in this manner, it is not necessary to arrange the front camera in the bezel 2y, and the width of the bezel 2y can be narrowed.

Note that, the present technology can also adopt the following configurations.

(1) An image display device including a plurality of pixels arranged two-dimensionally,
in which a pixel in a first pixel region including some pixels among the plurality of pixels includes:
a first light emitting region;
a non-light emitting region having a higher visible light transmittance than the first light emitting region; and
a first self-light emitting element that emits light from the first light emitting region, and
a pixel in a second pixel region other than the first pixel region among the plurality of pixels includes:
a second light emitting region having a lower visible light transmittance than the non-light emitting region; and
a second self-light emitting element that emits light from the second light emitting region.

(2) The image display device according to (1),
in which the non-light emitting region includes a region that transmits incident visible light, and
the first light emitting region and the second light emitting region include a region that reflects incident visible light without transmitting the visible light.

(3) The image display device according to (1) or (2), in which a pixel closer to the first pixel region among the pixels in the second pixel region decreases a light-emitting luminance of the second light emitting region.

(4) The image display device according to (3), in which a pixel luminance in the first pixel region and a pixel luminance in the second pixel region at a boundary portion between the first pixel region and the second pixel region are substantially equal.

(5) The image display device according to any one of (1) to (4), in which at least a part of the first pixel region is arranged so as to overlap a light receiving device that receives light incident through the image display device in plan view from a display surface side of the image display device.

(6) The image display device according to any one of (1) to (5), in which a pixel circuit connected to the first self-light emitting element in the first pixel region is arranged in the first light emitting region.

(7) The image display device according to any one of (1) to (6),
in which each of the first self-light emitting element and the second self-light emitting element includes:
a lower electrode layer;
a display layer arranged on the lower electrode layer;
an upper electrode layer arranged on the display layer; and
a wiring layer arranged under the lower electrode layer and electrically connected to the lower electrode layer via a contact extending from the lower electrode layer in a lamination direction, and
the contact is arranged in the first light emitting region and the second light emitting region.

(8) The image display device according to (7), in which at least a corner near an upper end of the contact has a laminated structure in which a transparent conductive layer is arranged on a metal layer.

(9) The image display device according to (7) or (8), in which an inclination angle of a side surface of the contact with respect to the lamination direction changes stepwise or continuously, and an inclination angle of a vicinity of an upper end of the contact with respect to the lamination direction is larger than an inclination angle of a vicinity of a lower end of the contact with respect to the lamination direction.

(10) The image display device according to any one of (7) to (9), in which the lower electrode layer has a laminated structure in which a first transparent conductive layer, a metal layer, and a second transparent conductive layer are sequentially laminated.

(11) The image display device according to any one of (1) to (10),
in which each pixel in the first pixel region and the second pixel region includes a plurality of color pixels,
each of the plurality of color pixels in the first pixel region has the first light emitting region and the non-light emitting region, and
each of the plurality of color pixels in the second pixel region has the second light emitting region.

(12) The image display device according to any one of (1) to (10),
in which each pixel in the first pixel region and the second pixel region includes a plurality of color pixels, and
some color pixels among the plurality of color pixels in the first pixel region have the first light emitting region and the non-light emitting region, and color pixels other than the some color pixels have the first light emitting region without having the non-light emitting region.

(13) The image display device according to any one of (1) to (10), in which some pixels in the first pixel region have the non-light emitting region without having the first light emitting region, and pixels other than the some pixels have the first light emitting region without having the non-light emitting region.

(14) The image display device according to any one of (1) to (13), in which the first pixel region is provided at at least one of four corners of a display unit including the plurality of pixels.

(15) An electronic apparatus including:
an image display device including a plurality of pixels arranged two-dimensionally; and
a light receiving device that receives light incident through the image display device,
in which a pixel in a first pixel region among the plurality of pixels includes:
a first light emitting region;
a non-light emitting region having a higher visible light transmittance than the first light emitting region; and
a first self-light emitting element that emits light from the first light emitting region,
a pixel in a second pixel region other than the first pixel region among the plurality of pixels includes:
a second light emitting region having a lower visible light transmittance than the non-light emitting region; and
a second self-light emitting element that emits light from the second light emitting region, and
at least a part of the first pixel region is arranged so as to overlap the light receiving device in plan view from a display surface side of the image display device.

(16) The electronic apparatus according to (15), in which the light receiving device receives light through the non-light emitting region.

(17) The electronic apparatus according to (15) or (16), in which the first pixel region is a pixel region through which light incident on the light receiving device passes.

(18) The electronic apparatus according to any one of (15) to (17), in which the second pixel region decreases a light-emitting luminance of the second light emitting region as approaching the first pixel region.

(19) The electronic apparatus according to (18), in which a pixel luminance in the first pixel region and a pixel luminance in the second pixel region at a boundary portion between the first pixel region and the second pixel region are substantially equal.

(20) The electronic apparatus according to any one of (15) to (19), in which the light receiving device includes at least one of an imaging sensor that photoelectrically converts light incident through the non-light emitting region, a distance measuring sensor that receives the light incident through the non-light emitting region and measures a distance, or a temperature sensor that measures a temperature on a basis of the light incident through the non-light emitting region.

Aspects of the present disclosure are not limited to the above-described individual embodiments, but include various conceivable modifications, and the effects of the present disclosure are not limited to the above-described contents. That is, various additions, modifications, and partial deletions can be made within a range not departing from the conceptual idea and gist of the present disclosure derived from the contents defined in the claims and equivalents thereof.

REFERENCE SIGNS LIST

1 Image display device
2 Display panel
2b Transparent film
2c Glass substrate
2d Display layer
2e Barrier layer
2f Touch sensor layer
2g Adhesive layer
2h Circularly polarizing plate
2i Optical adhesive sheet
2j Cover glass
3 FPC
4 Chip (COF)
5, 5a OLED
6a First imaging unit
6b Imaging sensor
6c Second imaging unit
6d Imaging sensor
6e, 6f Single focus lens
11 Driver IC
12 Pixel array unit
13 Shift register (gate driver)
14 Selector switch
15 I/F circuit
16 Data latch circuit
17 DAC
18 Timing generator
19 Frame memory
20 Power supply circuit
21 Host processor
31 First transparent substrate
32 First insulating layer
33 First wiring layer
34 Second insulating layer
35 Second wiring layer
36 Third insulating layer
37 Fourth insulating layer
38 Anode electrode layer
39 Cathode electrode layer
40 Fifth insulating layer
41 Second transparent substrate

The invention claimed is:

1. An image display device comprising a plurality of pixels arranged two-dimensionally,
wherein a first pixel in a first pixel region including some pixels among the plurality of pixels includes:
a first light emitting region;
a non-light emitting region having a higher visible light transmittance than the first light emitting region; and
a first self-light emitting element that emits light from the first light emitting region, and
a second pixel in a second pixel region other than the first pixel region among the plurality of pixels includes:
a second light emitting region having a lower visible light transmittance than the non-light emitting region; and
a second self-light emitting element that emits light from the second light emitting region.

2. The image display device according to claim 1,
wherein the non-light emitting region includes a region that transmits incident visible light, and
the first light emitting region and the second light emitting region include a region that reflects incident visible light without transmitting the visible light.

3. The image display device according to claim 1, wherein a pixel closer to the first pixel region among the pixels in the second pixel region decreases a light-emitting luminance of the second light emitting region.

4. The image display device according to claim 3, wherein a pixel luminance in the first pixel region and a pixel luminance in the second pixel region at a boundary portion between the first pixel region and the second pixel region are substantially equal.

5. The image display device according to claim 1, wherein at least a part of the first pixel region is arranged so as to overlap a light receiving device that receives light incident through the image display device in plan view from a display surface side of the image display device.

6. The image display device according to claim 1, wherein a pixel circuit connected to the first self-light emitting element in the first pixel region is arranged in the first light emitting region.

7. The image display device according to claim 1,
wherein each of the first self-light emitting element and the second self-light emitting element includes:
a lower electrode layer;
a display layer arranged on the lower electrode layer;
an upper electrode layer arranged on the display layer; and
a wiring layer arranged under the lower electrode layer and electrically connected to the lower electrode layer via a contact extending from the lower electrode layer in a lamination direction, and
the contact is arranged in the first light emitting region and the second light emitting region.

8. The image display device according to claim 7, wherein at least a corner near an upper end of the contact has a laminated structure in which a transparent conductive layer is arranged on a metal layer.

9. The image display device according to claim 7, wherein an inclination angle of a side surface of the contact with respect to the lamination direction changes stepwise or continuously, and an inclination angle of a vicinity of an upper end of the contact with respect to the lamination direction is larger than an inclination angle of a vicinity of a lower end of the contact with respect to the lamination direction.

10. The image display device according to claim 7, wherein the lower electrode layer has a laminated structure in which a first transparent conductive layer, a metal layer, and a second transparent conductive layer are sequentially laminated.

11. The image display device according to claim 1,
wherein each pixel in the first pixel region and the second pixel region includes a plurality of color pixels,
each of the plurality of color pixels in the first pixel region has the first light emitting region and the non-light emitting region, and
each of the plurality of color pixels in the second pixel region has the second light emitting region.

12. The image display device according to claim 1,
wherein each pixel in the first pixel region and the second pixel region includes a plurality of color pixels, and
some color pixels among the plurality of color pixels in the first pixel region have the first light emitting region and the non-light emitting region, and color pixels other than the some color pixels have the first light emitting region without having the non-light emitting region.

13. The image display device according to claim 1, wherein some pixels in the first pixel region have the non-light emitting region without having the first light emitting region, and pixels other than the some pixels have the first light emitting region without having the non-light emitting region.

14. The image display device according to claim 1, wherein the first pixel region is provided at at least one of four corners of a display unit including the plurality of pixels.

15. An electronic apparatus comprising:
an image display device including a plurality of pixels arranged two-dimensionally; and
a light receiving device that receives light incident through the image display device,
wherein a first pixel in a first pixel region among the plurality of pixels includes:
a first light emitting region;
a non-light emitting region having a higher visible light transmittance than the first light emitting region; and
a first self-light emitting element that emits light from the first light emitting region;
a second pixel in a second pixel region other than the first pixel region among the plurality of pixels includes:
a second light emitting region having a lower visible light transmittance than the non-light emitting region; and
a second self-light emitting element that emits light from the second light emitting region, and
at least a part of the first pixel region is arranged so as to overlap the light receiving device in plan view from a display surface side of the image display device.

16. The electronic apparatus according to claim 15, wherein the light receiving device receives light through the non-light emitting region.

17. The electronic apparatus according to claim 15, wherein the first pixel region is a pixel region through which light incident on the light receiving device passes.

18. The electronic apparatus according to claim 15, wherein the second pixel region decreases a light-emitting luminance of the second light emitting region as approaching the first pixel region.

19. The electronic apparatus according to claim 18, wherein a pixel luminance in the first pixel region and a pixel luminance in the second pixel region at a boundary portion between the first pixel region and the second pixel region are substantially equal.

20. The electronic apparatus according to claim 15, wherein the light receiving device includes at least one of an imaging sensor that photoelectrically converts light incident through the non-light emitting region, a distance measuring sensor that receives the light incident through the non-light emitting region and measures a distance, or a temperature sensor that measures a temperature on a basis of the light incident through the non-light emitting region.

\* \* \* \* \*